United States Patent
Yamazaki et al.

(10) Patent No.: US 10,424,671 B2
(45) Date of Patent: Sep. 24, 2019

(54) SEMICONDUCTOR DEVICE, CIRCUIT BOARD, AND ELECTRONIC DEVICE

(71) Applicant: Semiconductor Energy Laboratory Co., Ltd., Kanagawa-ken (JP)

(72) Inventors: Shunpei Yamazaki, Tokyo (JP); Kiyoshi Kato, Kanagawa (JP); Hidekazu Miyairi, Kanagawa (JP); Akihisa Shimomura, Kanagawa (JP); Atsushi Hirose, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 269 days.

(21) Appl. No.: 15/220,706

(22) Filed: Jul. 27, 2016

(65) Prior Publication Data

US 2017/0033111 A1   Feb. 2, 2017

(30) Foreign Application Priority Data

Jul. 29, 2015 (JP) .................. 2015-149966

(51) Int. Cl.
   *H01L 27/108*   (2006.01)
   *H01L 29/786*   (2006.01)
   *G11C 11/24*    (2006.01)

(52) U.S. Cl.
   CPC ......... *H01L 29/7869* (2013.01); *G11C 11/24* (2013.01); *H01L 27/1082* (2013.01); *H01L 27/10858* (2013.01); *H01L 27/10873* (2013.01)

(58) Field of Classification Search
   CPC ........... H01L 27/1255; H01L 29/78648; H01L 27/3265; H01L 27/7869; H01L 27/78693; H01L 27/78648
   See application file for complete search history.

(56) References Cited

U.S. PATENT DOCUMENTS 5,353,255 A   10/1994   Komuro
5,528,032 A    6/1996   Uchiyama
(Continued)

FOREIGN PATENT DOCUMENTS

EP   1 737 044 A1   12/2006
EP   2 226 847 A2    9/2010
(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 25, pp. 181-184.

(Continued)

*Primary Examiner* — Raj R Gupta
*Assistant Examiner* — Scott Stowe
(74) *Attorney, Agent, or Firm* — Husch Blackwell LLP

(57) ABSTRACT

A novel semiconductor device or memory device is provided. Alternatively, a semiconductor device or memory device in which storage capacity per unit area is large is provided. The semiconductor device includes a sense amplifier provided to a semiconductor substrate and a memory cell provided over the sense amplifier. The sense amplifier includes a first transistor. The memory cell includes a capacitor over the semiconductor substrate, a second transistor provided over the capacitor, a conductor, and a groove portion. The capacitor includes a first electrode and a second electrode. The first electrode is formed along the groove portion. The second electrode has a region facing the first electrode in the groove portion. The second transistor includes an oxide semiconductor. One of a source and a drain of the second transistor is electrically connected to the second electrode through the conductor.

17 Claims, 37 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,706,208 B2 | 4/2010 | Takemura et al. |
| 7,732,819 B2 | 6/2010 | Akimoto et al. |
| 8,455,868 B2 | 6/2013 | Yamazaki et al. |
| 8,809,927 B2 | 8/2014 | Takemura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0156027 A1 | 6/2011 | Yamazaki et al. |
| 2012/0063208 A1 | 3/2012 | Koyama et al. |
| 2012/0127781 A1 | 5/2012 | Saito |
| 2012/0230138 A1 | 9/2012 | Endo |
| 2013/0070506 A1 | 3/2013 | Kajigaya |
| 2013/0100748 A1 | 4/2013 | Takemura |
| 2013/0155790 A1 | 6/2013 | Atsumi |
| 2013/0256657 A1 | 10/2013 | Yamazaki et al. |
| 2014/0355339 A1 | 12/2014 | Inoue et al. |
| 2015/0187823 A1* | 7/2015 | Miyairi ............. H01L 27/1225 257/43 |
| 2015/0262642 A1 | 9/2015 | Koyama |
| 2016/0104521 A1 | 4/2016 | Onuki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-144253 A | 6/1993 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-151383 A | 8/2011 |
| JP | 2013-171895 A | 9/2013 |
| WO | WO 2004/114391 A1 | 12/2004 |

OTHER PUBLICATIONS

Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.

Chern, H.N. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D-H. et al., "21.2: Al and Sn-Doped Zinc Indium Oxide Thin Film Transistors for AMOLED Back-Plane," SID Digest '09: SID

(56) References Cited

OTHER PUBLICATIONS

International Symposium Digest of Technical Papers, May 31, 2009, pp. 280-283.

Clark, S.J. et al., "First Principles. Methods Using CASTEP," Zeitschrift fur Kristallographie, 2005, vol. 220, pp. 567-570.

Coates, D. et al., "Optical Studies of the Amorphous Liquid-Cholesteric Liquid Crystal Transition: The 'Blue Phase'," Physics Letters, Sep. 10, 1973, vol. 45A, No. 2, pp. 115-116.

Costello, M.J. et al., "Electron Microscopy of a Cholesteric Liquid Crystal and Its Blue Phase," Physical Review. A, May 1, 1984, vol. 29, No. 5, pp. 2957-2959.

Dembo, H. et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E.M.C. et al., "Wide-Bandgap High-Mobility ZnO Thin-Film Transistors Produced at Room Temerature," Applied Physics Letters, Sep. 27, 2004, vol. 85, No. 13, pp. 2541-2543.

Fung, T.C. et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H. et al., "P-9: Numerical Analysis on Temperature Dependence of Characteristics of Amorphous In—Ga—Zn-Oxode TFT," SID Digest '09: SID International Symposium Digest to Technical Papers, May 31, 2009, pp. 1110-1112.

Godo, H. et al., "Temperature Dependence of Characteristics and Electronic Structure for Amorphos In—Ga—Zn-Oxide TFT," AM-FPD '09 Digest of Technical Papers, Jul. 1, 2009, pp. 41-44.

Hayashi, R. et al., "42.1: Invited Paper: Improved Amorphous In—Ga—Zn—O TFTs," SID Digest '08: SID International Symposium Digest of Technical Papers, May 20, 2008, vol. 39, pp. 621-624.

Hirao, T. et al., "Novel Top-Gate Zinc Oxide Thin-Film Transistors (ZnO TFTs) for AMLCDs," Journal of the Society for Information Display, 2007, vol. 15, No. 1, pp. 17-22.

Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.

Hosono, H., "68.3: Invited Paper:Transparent Amorphous Oxide Semiconductors for High Performance TFT," SID Digest '07: SID International Symposium Digest of Technical Papers, 2006, vol. 38, pp. 1830-1833.

Hsieh, H-H. et al., "P-29: Modeling of Amorphous Oxide Semiconductor Thin Film Transistors and Subgap Density of States," SID Digest '09: SID International Symposium Digest of Technical Papers, May 20, 2008, vol. 39, pp. 1277-1280.

Ikeda, T. et al., "Full-Functional System Liquid Crystal Display Using CG-Silicon Technology," SID Digest '04: SID International Symposium Digest of Technical Papers, 2004, vol. 35, pp. 860-863.

Janotti, A. et al., "Native Point Defects in ZnO," Physical Review. B, Oct. 4, 2007, vol. 76, No. 16, pp. 165202-1-165202-22.

Janotti, A. et al., "Oxygen Vacancies in ZnO," Applied Physics Letters, 2005, vol. 87, pp. 122102-1-122102-3.

Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Jin, D-U. et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.

Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.

Kikuchi, H. et al., "62.2: Invited Paper:Fast Electro-Optical Switching in Polymer-Stabilize Liquid Crystalline Blue Phases for Display Application," SID Digest '07: SID International Symposium Digest of Technical Papers, 2007, vol. 38, pp. 1737-1740.

Kikuchi, H. et al., "Polymer-Stabilized Liquid Crystal Blue Phases," Nature Materials, Sep. 2, 2002, vol. 1, pp. 64-68.

Kim, S. et al., "High-Performance Oxide Thin Film Transistors Passivated by Various Gas Plasmas," 214th ECS Meeting, 2008, No. 2317, ECS.

Kimizuka, N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni Cu,or ZN] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO system," Journal of Solid State Chemistry, Apr. 1, 1995, vol. 115, No. 1, pp. 170-178.

Kitzerow, H-S. et al., "Observation of Blue Phases in Chiral Networks," Liquid Crystals, 1993, vol. 14, No. 3, pp. 911-916.

Kurokawa, Y. et al., "UHF RFCPUs on Flexible and Glass Substrates for Secure RFID Systems," Journal of Solid-State Circuits, 2008, vol. 43, No. 1, pp. 929-299.

Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.

Lee, H.N. et al., "Current Status of, Challenges to, and Perspective View of AM-OLED," IDW '06: Proceedings of the 13th International Display Workshops, Dec. 7, 2005, pp. 663-666.

Lee, J-H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.

Meiboom, S. et al., "Theory of the Blue Phase of Cholesteric Liquid Crystals," Physical Review Letters, May 4, 1981, vol. 46, No. 18, pp. 1216-1219.

Miyasaka, M., "SUFTLA Flexible Microelectronics on Their Way to Business," SID Digest '07: SID International Symposium Digest of Technical Papers, 2007, vol. 38, pp. 1673-1676.

Mo, Y-G. et al., "Amorphous Oxide TFT Backplanes for Large Size AMOLED Displays," IDW '08: Proceedings of the 6th International Display Workshops, Dec. 3, 2008, pp. 581-584.

Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.

Nakamura, M., "Synthesis of Homologous Compound with New Long-Period Structure," NIRIM Newsletter, Mar. 1, 1995, vol. 150, pp. 1-4.

Nomura, K. et al., "Amorphous Oxide Semiconductors for High-Performance Flexible Thin-Film Transistors," Japanese Journal of Applied Physics, 2005, vol. 45, No. 5B, pp. 4303-4308.

Nomura, K. et al., "Carrier Transport in Transparent Oxide Semiconductor with Intrinsic Structural Probed using Single-Crystalline InGaO3(ZnO)5 Films," Applied Physics Letters, Sep. 13, 2004, vol. 85, No. 11, pp. 1993-1995.

Nomura, K. et al., "Room-Temperature Fabrication of Transparent Flexible Thin-Film Transistors Using Amorphous Oxide Semiconductors," Nature, Nov. 25, 2004, vol. 432, pp. 488-492.

Nomura, K. et al., "Thin-Film Transistor Fabricated in Single-Crystalline Transparent Oxide Semiconductor," Science, May 23, 2003, vol. 300, No. 5623, pp. 1269-1272.

(56) References Cited

OTHER PUBLICATIONS

Nowatari, H. et al., "60.2: Intermediate Connector With Suppressed Voltage Loss for White Tandem OLEDs," SID Digest '09: SID International Symposium Digest of Technical Papers, May 31, 2009, vol. 40, pp. 899-902.

Oba, F. et al., "Defect Energetics in ZnO: A Hybrid Hartree-Fock Density Functional Study," Physical Review. B, 2008, vol. 77, pp. 245202-1-245202-6.

Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.

Ohara, H. et al., "21.3: 4.0 In. QVGA AMOLED Display Using In—Ga—Zn-Oxide TFTs With a Novel Passivation Layer," SID Digest '09: SID International Symosium Digest of Technical Papers, May 31, 2008, pp. 284-287.

Ohara, H. et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M. et al., "Amorphous Transparent Conductive Oxide InGaO3(ZnO)m (m<4):a Zn4s conductor," Philosophical Magazine, 2001, vol. 81, No. 5, pp. 501-515.

Orita, M. et al., "Mechanism of Electrical Conductivity of Transparent InGaZnO4," Physical Review. B, Jan. 15, 2000, vol. 61, No. 3, pp. 1811-1816.

Osada, T. et al., "15.2: Development of Driver-Integrated Panel using Amorphous In—Ga—Zn-Oxide TFT," SID Digest '09: SID International Symposium Digest of Technical Papers, May 31, 2008, vol. 40, pp. 184-187.

Osada, T. et al., "Development of Driver-Integrated Panel Using Amorphous In—Ga—Zn-Oxide TFT," AM-FPD '09 Digest of Technical Papers, Jul. 1, 2009, pp. 33-36.

Park, J-S. et al., "Amorphous Indium-Gallium-Zinc Oxide TFTs and Their Application for Large Size AMOLED," AM-FPD '08 Digest of Technical Papers, Jul. 2, 2008, pp. 275-278.

Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

Park, J-S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.

Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.

Park, J-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 25, pp. 262106-1-262106-3.

Park, S. et al., "Challenge to Future Displays: Transparent AM-OLED Driven by PEALD Grown ZnO TFT," IMID '07 Digest, 2007, pp. 1249-1252.

Park, Sang-Hee et al., "42.3: Transparent ZnO Thin Film Transistor for the Application of High Aperture Ration Bottom Emission AM-OLED Display," SID Digest '08: SID International Symposium Digest of Technical Papers, May 20, 2008, vol. 39, pp. 629-632.

Prins, M.W.J. et al., "A Ferroelectric Transparent Thin-Film Transistor," Applied Physics Letters, Jun. 17, 1996, vol. 68, No. 25, pp. 3650-3652.

Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.

Son, K-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K. et al., "Ultra Low Power Consumption Technologies for Mobile TFT-LCDs," IDW '02: Proceedings of the 9th International Display Workshops, Dec. 4, 2002, pp. 295-298.

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.

Van de Walle, C.G., "Hydrogen as a Cause of Doping in Zinc Oxide," Physical Review Letters, Jul. 31, 2000, vol. 85, No. 5, pp. 1012-1015.

* cited by examiner

FIG. 10A
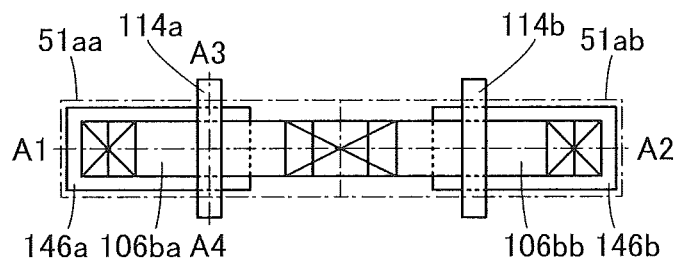
FIG. 10B
FIG. 10C
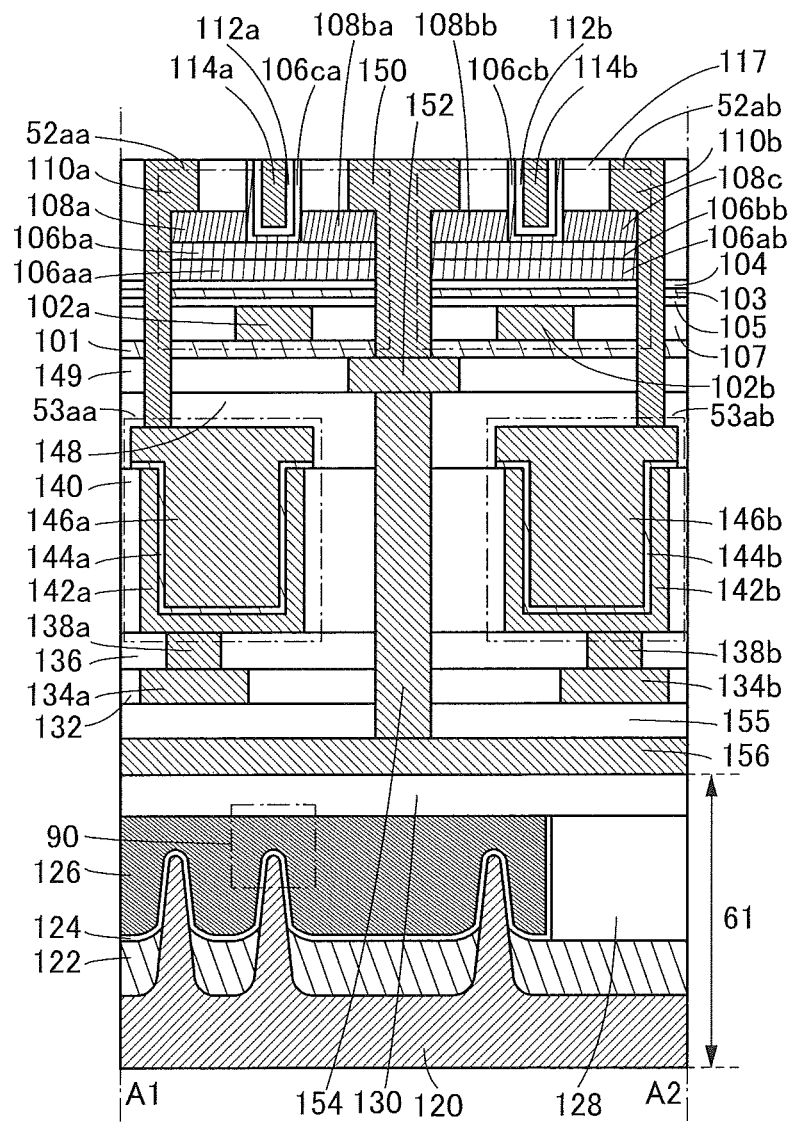
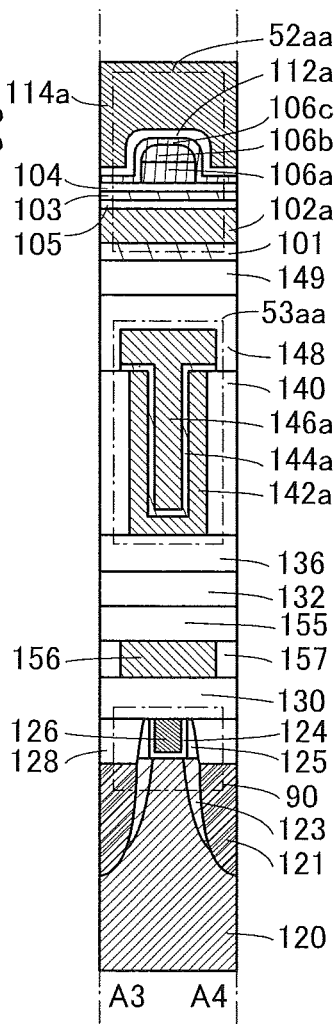

out-of-plane method
CAAC-OS in-plane method φ scan
CAAC-OS in-plane method φ scan
single crystal OS FIG. 27A
FIG. 27B
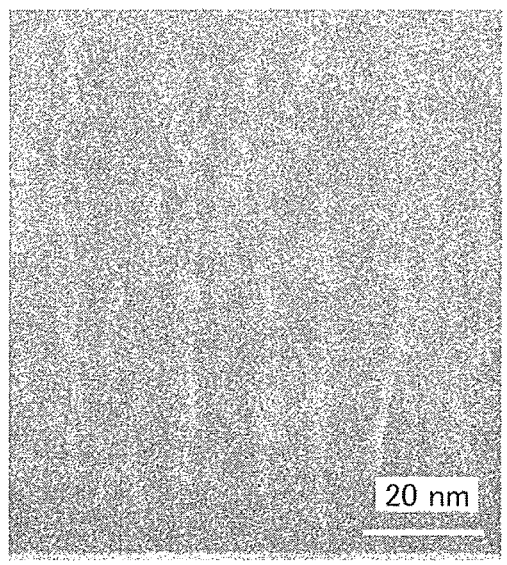
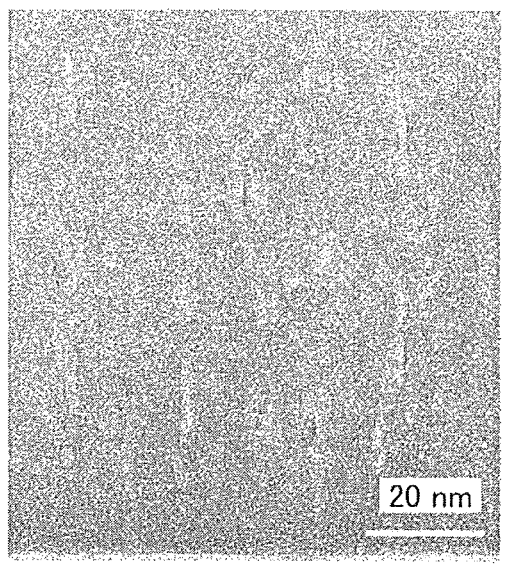

SEMICONDUCTOR DEVICE, CIRCUIT BOARD, AND ELECTRONIC DEVICE

BACKGROUND OF THE INVENTION

1. Field of the Invention

One embodiment of the present invention relates to a semiconductor device or a memory device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. One embodiment of the present invention relates to a semiconductor device, a display device, a light-emitting device, a power storage device, a memory device, a circuit board, an electronic device, a driving method thereof, or a manufacturing method thereof.

2. Description of the Related Art

A dynamic random access memory (DRAM) stores data by supply of electric charge to a capacitor. Thus, the smaller the off-state current of the transistor for controlling the supply of electric charge to the capacitor is, the longer the data holding period can be; thus, the frequency of refresh operations can be reduced. Patent Document 1 discloses a semiconductor device that can hold stored content for a long time by using a transistor including an oxide semiconductor film and having extremely small off-state current.

REFERENCE

Patent Document

[Patent Document 1] Japanese Published Patent Application No. 2011-151383

SUMMARY OF THE INVENTION

An object of one embodiment of the present invention is to provide a novel semiconductor device or memory device. Another object of one embodiment of the present invention is to provide a semiconductor device or memory device with low power consumption. Another object of one embodiment of the present invention is to provide a semiconductor device or memory device in which storage capacity per unit area is large. Another object of one embodiment of the present invention is to provide a semiconductor device or memory device in which errors in data reading are reduced.

One embodiment of the present invention does not necessarily achieve all the objects listed above and only needs to achieve at least one of the objects. The description of the above objects does not disturb the existence of other objects. Other objects will be apparent from and can be derived from the description of the specification, the drawings, the claims, and the like.

A semiconductor device of one embodiment of the present invention includes a sense amplifier provided to a semiconductor substrate, a memory cell provided over the sense amplifier, a first wiring, a second wiring, and a third wiring provided over the memory cell. The sense amplifier includes a first transistor. The first transistor includes a gate, a source, and a drain. One of the source and the drain of the first transistor is electrically connected to the third wiring. The memory cell includes a capacitor over the semiconductor substrate, a second transistor provided over the capacitor, a conductor, and a groove portion. The capacitor includes a first electrode and a second electrode. The first electrode is formed along the groove portion. The second electrode has a region facing the first electrode in the groove portion. The first electrode is electrically connected to the first wiring. The second transistor includes an oxide semiconductor, a gate, a source, and a drain. The gate of the second transistor is electrically connected to the second wiring. One of the source and the drain of the second transistor is connected to the second electrode through the conductor. The other of the source and the drain of the second transistor is electrically connected to the third wiring.

Another semiconductor device of one embodiment of the present invention includes a sense amplifier provided to a semiconductor substrate, a memory cell provided over the sense amplifier, a first wiring, a second wiring, and a third wiring provided under the memory cell. The sense amplifier includes a first transistor. The first transistor includes a gate, a source, and a drain. One of the source and the drain of the first transistor is electrically connected to the third wiring. The memory cell includes a capacitor over the semiconductor substrate, a second transistor provided over the capacitor, a conductor, and a groove portion. The capacitor includes a first electrode and a second electrode. The first electrode is formed along the groove portion. The second electrode has a region facing the first electrode in the groove portion. The first electrode is electrically connected to the first wiring. The second transistor includes an oxide semiconductor, a gate, a source, and a drain. The gate of the second transistor is electrically connected to the second wiring. One of the source and the drain of the second transistor is connected to the second electrode through the conductor. The other of the source and the drain of the second transistor is electrically connected to the third wiring.

In the above semiconductor device, it is preferable that the second transistor further include a first insulator, a second insulator, a first oxide insulator, and a second oxide insulator, the first oxide insulator be formed over the capacitor, the oxide semiconductor be formed over the first oxide insulator, the source and the drain be provided over the oxide semiconductor to face each other, the first insulator be formed over the source and the drain of the second transistor, the first insulator and the source and the drain of the second transistor have an opening reaching the oxide semiconductor, the second oxide insulator be provided in contact with part of a top surface of the oxide semiconductor in the opening, the second insulator be provided in contact with part of a top surface of the second oxide insulator in the opening, and the gate be provided in contact with part of a top surface of the second insulator in the opening.

In the above semiconductor device, the conductor is preferably in contact with an end portion of a side surface of one of the source and the drain of the second transistor. In the above semiconductor device, the semiconductor substrate preferably contains silicon. In the above semiconductor device, the oxide semiconductor preferably contains indium, an element M (Ti, Ga, Y, Zr, La, Ce, Nd, Sn, or Hf), zinc, and oxygen. In the above semiconductor device, the first oxide insulator and the second oxide insulator each preferably contain at least one of indium, an element M (Ti, Ga, Y, Zr, La, Ce, Nd, Sn, or Hf), and zinc.

A circuit board of one embodiment of the present invention includes an electronic component including the above semiconductor device and a printed circuit board.

An electronic device of one embodiment of the present invention includes the above semiconductor device or the above circuit board; and at least one of a display portion, a microphone, a speaker, and an operation key.

According to one embodiment of the present invention, a novel semiconductor device or memory device can be provided. According to one embodiment of the present invention, a semiconductor device or memory device with low power consumption can be provided. According to one embodiment of the present invention, a semiconductor device or memory device in which storage capacity per unit area is large can be provided. According to one embodiment of the present invention, a semiconductor device or memory device in which errors in data reading are reduced can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 10A to 10C are a top view and cross-sectional views illustrating a semiconductor device of one embodiment of the present invention;

FIGS. 27A and 27B show cross-sectional TEM images of an a-like OS;

DETAILED DESCRIPTION OF THE INVENTION

Figure 1A:
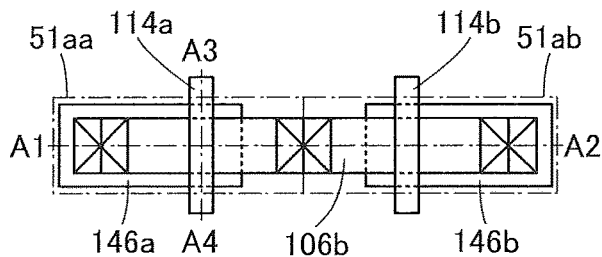
FIGS. 1A to 1D are a top view, cross-sectional views, and a circuit diagram illustrating a semiconductor device of one embodiment of the present invention.

Embodiments of the present invention will be described below in detail with reference to the drawings. Note that the present invention is not limited to the following description and it is easily understood by those skilled in the art that the mode and details can be variously changed without departing from the scope and spirit of the present invention. Therefore, the present invention should not be construed as being limited to the description in the following embodiments.

One embodiment of the present invention includes, in its category, a radio frequency (RF) tag, a semiconductor display device, and all devices including an integrated circuit. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, common reference numerals are used for the same portions in different drawings in some cases. Note that the same hatched pattern is applied to similar parts, and the similar parts are not especially denoted by reference numerals in some cases.

A structure in one of the following embodiments can be appropriately applied to, combined with, or replaced with another structure in another embodiment, for example, and the resulting structure is also one embodiment of the present invention.

Note that the size, the thickness of films (layers), or regions in drawings is sometimes exaggerated for simplicity.

In this specification, the terms "film" and "layer" can be interchanged with each other.

Note that the ordinal numbers such as "first" and "second" are used for the sake of convenience and do not denote the order of steps or the stacking order of layers. Therefore, for example, description can be given even when "first" is replaced with "second" or "third", as appropriate. In addition, the ordinal numbers in this specification and the like are not necessarily the same as those which specify one embodiment of the present invention.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, and a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, and a gamma correction circuit; a potential level converter circuit such as a power supply circuit (e.g., a step-up circuit and a step-down circuit) or a level shifter circuit for changing the potential level of a signal; a voltage source; a current source; a switching circuit; an amplifier circuit such as a circuit capable of increasing signal amplitude, the amount of current, or the like, an operational amplifier, a differential amplifier circuit, a source follower circuit, and a buffer circuit; a signal generation circuit; a memory circuit; and/or a control circuit) can be connected between X and Y. For example, in the case where a signal output from X is transmitted to Y even when another circuit is placed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in a diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a "semiconductor" may have the characteristics of an "insulator" when the conductivity is sufficiently low, for example. In addition, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" may have the characteristics of a "conductor" when the conductivity is sufficiently high, for example. In addition, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) might be formed in a semiconductor, the carrier mobility might be decreased, or the crystallinity might be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specifically, there are hydrogen (contained in water), lithium, sodium, silicon, boron, phosphorus, carbon, and nitrogen, for example. In the case where the semiconductor is an oxide semiconductor, oxygen vacancies might be formed by entry of an impurity. When the semiconductor is a silicon layer, examples of an impurity which changes the characteristics of the semiconductor include oxygen, Group 1 elements except hydrogen, Group 2 elements, Group 13 elements, and Group 15 elements.

The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or in a region where a channel is formed in a top view of the transistor. In one transistor, channel lengths in all regions are not necessarily the same. In other words, the channel length of one transistor is not fixed to one value in some cases. Therefore, in this specification and the like, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions do not necessarily have the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is sometimes different from a channel width shown in a top view of a transistor (hereinafter referred to as an apparent channel width). For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel formation region formed in a side surface of a semiconductor is increased in some cases. In that case, an effective channel width obtained when a channel is actually formed is greater than an apparent channel width shown in the top view.

In a transistor having a three-dimensional structure, measuring an effective channel width is difficult in some cases. For example, to estimate an effective channel width from a design value, it is necessary to assume that the shape of a semiconductor is known. Therefore, in the case where the shape of a semiconductor is not known accurately, measuring an effective channel width accurately is difficult.

Thus, in this specification, in a top view of a transistor, an apparent channel width that is the length of a portion where a source and a drain face each other in a region where a semiconductor region and a gate electrode overlap with each other is referred to as a surrounded channel width (SCW) in some cases. Furthermore, in this specification, the term "channel width" may denote a surrounded channel width, an apparent channel width, or an effective channel width. Note that the values of a channel length, a channel width, an effective channel width, an apparent channel width, a surrounded channel width, and the like can be determined by obtaining and analyzing a cross-sectional TEM image and the like.

A surrounded channel width may be used to calculate the field-effect mobility, the current value per channel width, and the like of a transistor. In this case, the obtained value is sometimes different from the value obtained by using an effective channel width for the calculation.

In this specification, the term "parallel" indicates that the angle formed between two straight lines is greater than or equal to −10° and less than or equal to 10°, and accordingly also includes the case where the angle is greater than or equal to −5° and less than or equal to 5'. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, structures of semiconductor devices of embodiments of the present invention will be described with reference to FIGS. 1A to 1D, FIG. 2, FIG. 3, FIG. 4, FIGS. 5A to 5D, FIG. 6, FIG. 7, FIG. 8, FIG. 9, FIGS. 10A to 10C, FIGS. 11A to 11E, FIGS. 12A and 12B, FIGS. 13A to 13D, and FIGS. 14A to 14D.

<Basic Structure of Semiconductor Device>

The structure of a memory device is described below as an example of the semiconductor device of one embodiment of the present invention.

Figure 1D:
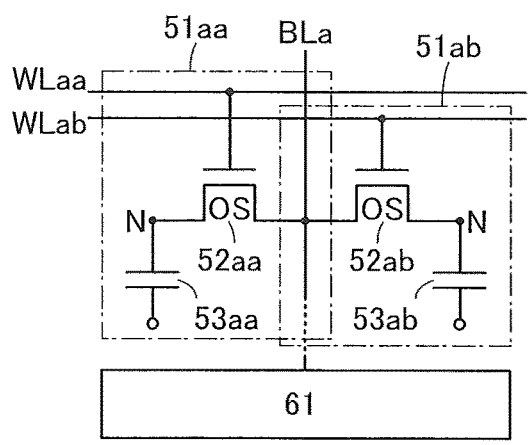
Figure 1B:
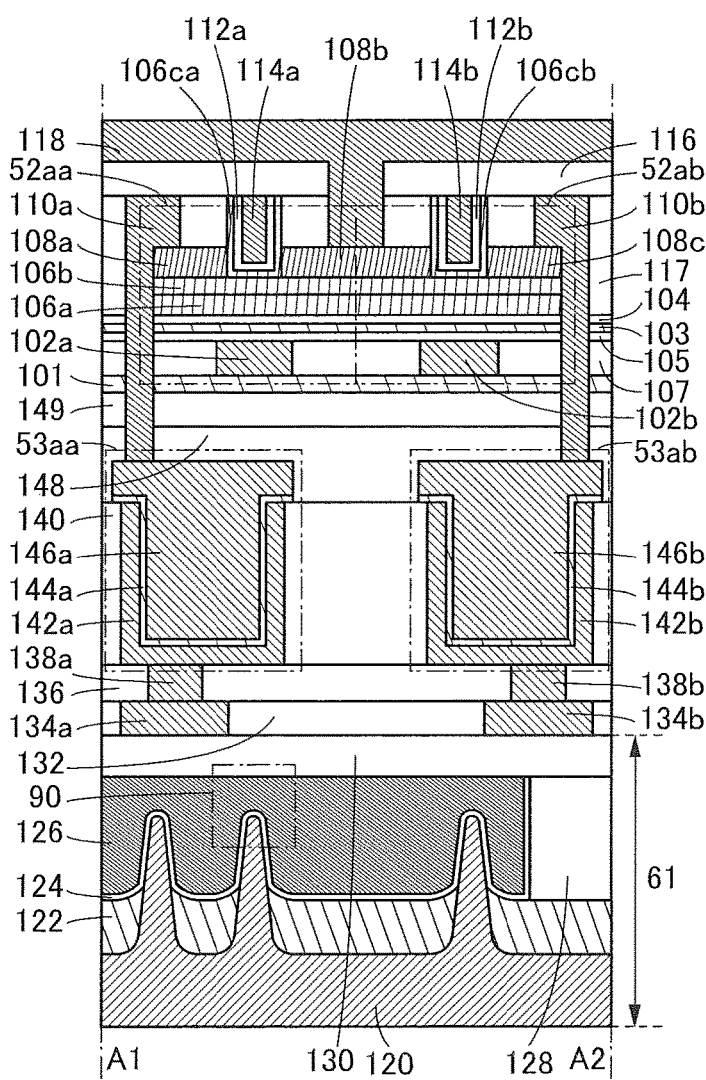
Figure 1C:
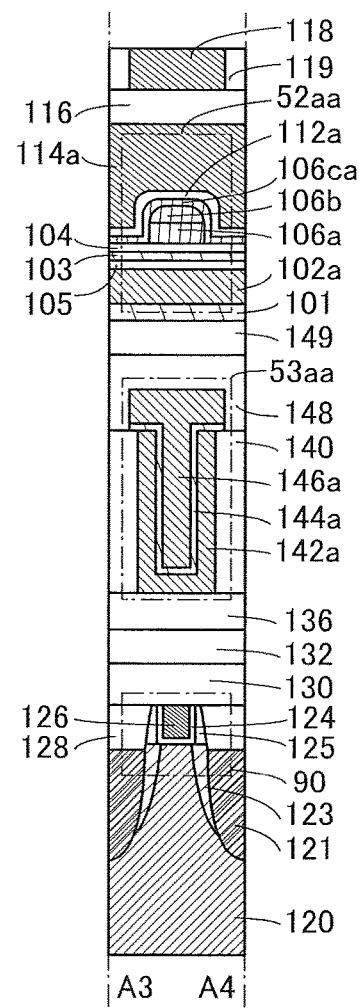

An example of a structure of a semiconductor device in this embodiment is described with reference to FIGS. 1A to 1D. FIG. 1A is a top view of some components (a conductor 146a, a conductor 146b, a semiconductor 106b, a conductor 114a, and a conductor 114b) of the semiconductor device and contact holes. FIG. 1B is a cross-sectional view taken along dashed-dotted line A1-A2 in FIG. 1A, and FIG. 1C is a cross-sectional view taken along dashed-dotted line A3-A4 in FIG. 1A. Note that a region along the dashed-dotted line A1-A2 shows structures of a transistor 52aa and a transistor 52ab in the channel length direction, and a region along the dashed-dotted line A3-A4 shows a structure of the transistor 52aa in the channel width direction. The channel length direction of a transistor refers to a direction in which a carrier moves between a source (a source region or a source electrode) and a drain (a drain region or a drain electrode), and the channel width direction refers to a direction perpendicular to the channel length direction in a plane parallel to a substrate. FIG. 1D shows a circuit configuration of the semiconductor device illustrated in FIGS. 1A to 1C.

In the cross-sectional views such as FIGS. 1B and 1C, end portions of some of patterned conductors, semiconductors, and insulators have right-angled corners; however, the semiconductor device in this embodiment is not limited thereto and can have rounded end portions.

The semiconductor device in this embodiment includes a sense amplifier 61 provided to a semiconductor substrate 120, a memory cell 51aa and a memory cell 51ab provided over the sense amplifier 61, a wiring WLaa and a wiring WLab, and a wiring BLa provided over the memory cell 51aa and the memory cell 51ab.

The memory cell 51aa includes a transistor 52aa and a capacitor 53aa. A gate of the transistor 52aa is electrically connected to the wiring WLaa, one of a source and a drain thereof is electrically connected to one electrode of the capacitor 53*aa*, and the other of the source and the drain thereof is electrically connected to the wiring BLa. The other electrode of the capacitor 53*aa* is electrically connected to a wiring or a terminal to which a predetermined potential (such as a ground potential) is supplied. Here, a node at which the one of the source and the drain of the transistor 52*aa* and the one electrode of the capacitor 53*aa* are connected to each other is referred to as a node N.

Like the memory cell 51*aa*, the memory cell 51*ab* includes the transistor 52*ab* and a capacitor 53*ab*. Since the memory cell 51*ab* basically has a structure similar to that of the memory cell 51*aa*, the descriptions of the transistor 52*aa*, the capacitor 53*aa*, and the wiring WLaa can be referred to for the transistor 52*ab*, the capacitor 53*ab*, and the wiring WLab, respectively. Therefore, the transistor 52*ab*, the capacitor 53*ab*, the wiring WLab, and the components thereof are not described below in some cases.

Here, the transistor 52*aa* has a function of holding charge accumulated in the node N by being turned off. For that reason, the off-state current of the transistor 52*aa* is preferably small. When the off-state current of the transistor 52*aa* is small, leakage of charge held in the node N through the transistor 52*aa* can be reduced. Consequently, data stored in the memory cell 51*aa* can be held for a long time.

A transistor in which a channel formation region includes a semiconductor with a wider band gap and lower intrinsic carrier density than silicon or the like can have extremely small off-state current and thus is preferably used as the transistor 52*aa*. Examples of such a semiconductor material include an oxide semiconductor having a band gap greater than or equal to twice the band gap of silicon. A transistor in which a channel formation region includes an oxide semiconductor (hereinafter also referred to as an OS transistor) has much smaller off-state current than a transistor including a material other than an oxide semiconductor, such as silicon. Therefore, with the use of an OS transistor as the transistor 52*aa*, data written in the memory cell 51*aa* can be held for an extremely long time and the interval between refresh operations can be long. Specifically, the interval between refresh operations can be an hour or longer. The transistor marked with a symbol "OS" in the drawing is an OS transistor. The details of an OS transistor will be described later.

With the use of an OS transistor for the memory cell 51*aa*, the semiconductor device in this embodiment can be used as a memory circuit in which data can be held for a long time. Thus, in the case where a cell array including a plurality of memory cells is divided into blocks which separately function, power supply to the blocks in which data is not written or read can be stopped for a long time. As a result, the power consumption of the semiconductor device in this embodiment can be reduced.

The sense amplifier 61 includes a transistor 90. The transistor 90 includes a gate, a source, and a drain, and one of the source and the drain is electrically connected to the wiring BLa. The sense amplifier 61 has a function of amplifying a difference between a reference potential and a reading potential that is supplied to the wiring BL and holding the amplified potential difference. Then, the amplified potential is output to a wiring GBL, which is described later.

A plurality of projections are formed on the semiconductor substrate 120, and an element separation region 122 is formed in groove portions (also referred to as trenches) between the plurality of projections. An insulator 128 in which an opening is formed is provided over the semiconductor substrate 120 and the element separation region 122.

In the opening in the insulator 128, an insulator 124 is formed over the semiconductor substrate 120 and the element separation region 122, and a conductor 126 is formed over the insulator 124.

As illustrated in FIG. 1C, the opening in the insulator 128 is formed over at least part of the projection of the semiconductor substrate 120, and an insulator 125 is provided in the opening in the insulator 128. The insulator 124 is provided on the inner surface of the insulator 125, and a conductor 126 is provided on the inner surface of the insulator 124. Moreover, as illustrated in FIG. 1C, in the projection of the semiconductor substrate 120, a low-resistance region 123 is formed to overlap with at least part of the insulator 125, and a low-resistance region 121 is formed on the outer side of the low-resistance region 123. Note that the low-resistance region 121 has lower resistance than the low-resistance region 123.

Here, the conductor 126 serves as the gate of the transistor 90, the insulator 124 serves as a gate insulating film of the transistor 90, and the low-resistance region 121 serves as a source or a drain of the transistor 90. The insulator 125 serves as a side wall insulating film of the transistor 90. The low-resistance region 123 serves as a lightly doped drain (LDD) region of the transistor 90. Furthermore, in the projection of the semiconductor substrate 120, a region which overlaps with the conductor 126 and is positioned between the low-resistance regions 123 serves as a channel formation region of the transistor 90.

In the transistor 90, a side portion and an upper portion of the projection of the semiconductor substrate 120, which serve as a channel formation region, overlap with the conductor 126 with the insulator 124 positioned therebetween, so that carriers flow in a wide area including the side portion and the upper portion of the channel formation region. Therefore, an area over the substrate occupied by the transistor 90 can be reduced, and the number of transferred carriers in the transistor 90 can be increased. As a result, the on-state current of the transistor 90 is increased and the field-effect mobility of the transistor 90 is increased. Suppose the length of the projection of the channel formation region in the channel width direction (i.e., channel width) is W and the height of the projection of the channel formation region is T. When the aspect ratio that corresponds to the ratio of the height T of the projection to the channel width W (T/W) is high, a region where carrier flows becomes wider. Thus, the on-state current of the transistor 90 is further increased and the field-effect mobility of the transistor 90 is further increased. For example, when the transistor 90 is formed using a bulk semiconductor substrate 120, the aspect ratio is desirably 0.5 or more, further desirably 1 or more.

The transistor 90 illustrated in FIGS. 1B and 1C is subjected to element isolation by a shallow trench isolation (STI) method; however, the semiconductor device in this embodiment is not limited thereto.

In FIG. 1B, two transistors are provided under the memory cells 51*aa* and 51*ab* in addition to the transistor 90, and these transistors have a common gate; however, the semiconductor device in this embodiment is not limited thereto. The structure and the number of transistors provided on the semiconductor substrate 120 may be set as appropriate in accordance with the structure of the sense amplifier 61.

An insulator 130 is provided over the insulator 128 and the conductor 126. The insulator 130 serves as an interlayer insulating film provided between the sense amplifier 61 and each of the memory cells 51*aa* and 51*ab*. The insulator 130 may have a stacked-layer structure of a plurality of insulators or a wiring or the like may be provided in the insulator 130. For example, a wiring through which the wiring BLa and one of the source and the drain of the transistor 90 are electrically connected to each other may be provided.

The capacitor 53aa includes a conductor 142a, an insulator 144a, and the conductor 146a. Here, the conductor 142a is electrically connected to a conductor 134a to which a predetermined potential (such as a ground potential) is supplied through a conductor 138a.

An insulator 132 having an opening is provided over the insulator 130, and the conductor 134a is provided in the opening. An insulator 136 having an opening is provided over the insulator 132, and the conductor 138a is provided in contact with the top surface of the conductor 134a in the opening.

An insulator 140 having an opening is provided over the insulator 136, and the conductor 142a is provided in the opening. Here, the opening in the insulator 140 and the top surface of the insulator 136 can be regarded as forming a groove portion, and the conductor 142a is preferably provided along the groove portion. Furthermore, as in FIGS. 1B and 1C, the insulator 140 and the conductor 142a may be formed so that their top surfaces are substantially aligned with each other.

The insulator 144a is provided over the conductor 142a, and the conductor 146a is provided over the insulator 144a. Here, in the groove portion, the conductor 146a has a region which faces the conductor 142a with the insulator 144a provided therebetween. In addition, the insulator 144a is preferably provided to cover the top surface of the conductor 142a. When the insulator 144a is provided as described above, leakage current can be prevented from flowing between the conductor 142a and the conductor 146a. In addition, an end portion of a side surface of the insulator 144a may be substantially aligned with an end portion of a side surface of the conductor 146a. An insulator 148 is provided to cover the insulator 140 and the conductor 146a. In this manner, the capacitor 53aa preferably has a concave shape, a cylinder shape, or the like. Note that in the top view in FIG. 1A, the conductor 146a and the conductor 146b each have a quadrangular shape; however, the semiconductor device in this embodiment is not limited thereto. For example, in the capacitor 53aa, the top surface shapes of the conductor 142a, the insulator 144a, and the conductor 146a may each be a polygonal shape other than the quadrangular shape or a circular shape including an elliptical shape. The same applies to the capacitor 53ab.

Here, the thickness of the insulator 144a is preferably greater than or equal to 5 nm and less than or equal to 15 nm, for example. When the insulator 144a has such a thickness, leakage current is prevented from flowing between the conductor 142a and the conductor 146a, and the capacitor 53aa can have sufficient electrostatic capacitance. Accordingly, the height of the capacitor 53aa (also referred to as the height of the conductor 142a or the depth of the opening in the insulator 140) can be greater than or equal to 500 nm and less than or equal to 3 μm, for example.

Furthermore, the capacitor 53ab includes, like the capacitor 53aa, a conductor 142b, an insulator 144b, and the conductor 146b. The conductor 142b is electrically connected to a conductor 134b to which a predetermined potential (such as a ground potential) is supplied through a conductor 138b. Here, the descriptions of the conductor 142a, the insulator 144a, the conductor 146a, the conductor 138a, and the conductor 134a can be referred to for the conductor 142b, the insulator 144b, the conductor 146b, the conductor 138b, and the conductor 134b, respectively.

Note that the cylinder capacitors 53aa and 53ab illustrated in FIGS. 1B and 1C are examples of a component of the semiconductor device described in this embodiment, and the capacitor provided in the semiconductor device described in this embodiment is not limited thereto and can be set as appropriate.

The transistor 52aa includes a conductor 102a, an insulator 105, an insulator 103, an insulator 104, an insulator 106a, the semiconductor 106b, a conductor 108a, a conductor 108b, an insulator 106ca, an insulator 112a, and the conductor 114a. Here, the conductor 102a serves as a back gate of the transistor 52aa, and the insulators 105, 103, and 104 serve as gate insulating films for the back gate of the transistor 52aa. The conductor 108a and the conductor 108b serve as a source and a drain of the transistor 52aa. The insulator 112a serves as a gate insulating film of the transistor 52aa, and the conductor 114a serves as a gate of the transistor 52aa. In addition, the conductor 114a extends in the A3-A4 direction in FIG. 1A and also serves as the wiring WLaa.

The conductor 108a of the transistor 52aa is electrically connected to the conductor 146a of the capacitor 53aa through a conductor 110a. In addition, the conductor 108b of the transistor 52aa is electrically connected to a conductor 118 serving as the wiring BLa.

Furthermore, the transistor 52ab includes, like the transistor 52aa, a conductor 102b, the insulator 105, the insulator 103, the insulator 104, the insulator 106a, the semiconductor 106b, the conductor 108b, a conductor 108c, an insulator 106cb, an insulator 112b, and the conductor 114b. The conductor 108c of the transistor 52ab is electrically connected to the conductor 146b of the capacitor 53ab through a conductor 110b. Here, the descriptions of the conductor 102a, the conductor 108a, the insulator 106ca, the insulator 112a, and the conductor 114a can be referred to for the conductor 102b, the conductor 108c, the insulator 106cb, the insulator 112b, and the conductor 114b, respectively. Furthermore, the insulator 105, the insulator 103, the insulator 104, the insulator 106a, the semiconductor 106b, and the conductor 108b are shared between the transistor 52aa and the transistor 52ab.

Note that as the details are described later, the insulator 106a and the insulator 106ca are sometimes formed using a substance that can function as a conductor, a semiconductor, or an insulator when they are used alone. However, when the transistor is formed using a stack including the insulator 106a, the semiconductor 106b, and the insulator 106ca, electrons flow in the semiconductor 106b, at or near the interface between the semiconductor 106b and the insulator 106a, and at or near the interface between the semiconductor 106b and the insulator 106ca; thus, the insulator 106a and the insulator 106ca have a region not functioning as a channel of the transistor. For that reason, in this specification and the like, the insulators 106a and 106ca are not referred to as conductors or semiconductors but refened to as insulators or oxide insulators.

In this embodiment and the like, the term "insulator" can be replaced with the term "insulating film" or "insulating layer". In addition, the term "conductor" can be replaced with the term "conductive film" or "conductive layer". Moreover, the term "semiconductor" can be replaced with the term "semiconductor film" or "semiconductor layer".

An insulator 149 is provided over the insulator 148, which is provided over the capacitors 53aa and 53ab. The insulator 149 serves as an interlayer insulating film between the capacitors 53*aa* and 53*ab* and the transistors 52*aa* and 52*ab*. The insulator 149 may have a stacked-layer structure of a plurality of insulators or a wiring or the like may be provided in the insulator 149.

An insulator 101 is provided over the insulator 149. An insulator 107 having an opening is provided over the insulator 101, and the conductor 102*a* is provided in the opening. At least part of the conductor 102*a* overlaps with the insulator 106*a*, the semiconductor 106*b*, and the insulator 106*ca*. The insulator 105 is provided to cover the top surface of the conductor 102*a*. The insulator 103 is provided over the insulator 105, and the insulator 104 is provided over the insulator 103.

Here, it is preferable that one end of the conductor 102*a* in the channel length direction overlap with part of the conductor 108*a* and the other end of the conductor 102*a* in the channel length direction overlap with part of the conductor 108*b*. The conductor 102*a* provided as described above can sufficiently overlap with a region in the semiconductor 106*b* which is between the conductor 108*a* and the conductor 108*b*, that is, a channel formation region of the semiconductor 106*b*. Accordingly, with the use of the conductor 102*a*, the threshold voltage of the transistor 52*aa* can be controlled more effectively.

The insulator 106*a* is provided over the insulator 104, and the semiconductor 106*b* is provided in contact with at least part of the top surface of the insulator 106*a*. Although end portions of the insulator 106*a* and the semiconductor 106*b* are substantially aligned with each other in FIGS. 1B and 1C, the structure of the semiconductor device in this embodiment is not limited thereto.

The conductor 108*a* and the conductor 108*b* are in contact with at least part of the top surface of the semiconductor 106*b*. The conductor 108*a* and the conductor 108*b* are spaced from each other, and are preferably opposed to each other with the conductor 114*a* positioned therebetween as illustrated in FIGS. 1A and 1B.

An insulator 117 is provided over the insulator 104, the conductor 108*a*, and the conductor 108*b*. Here, the insulator 117 and the conductors 108*a* and 108*b* have an opening which reaches the semiconductor 106*b*.

The insulator 106*ca* is provided in contact with at least part of the top surface of the semiconductor 106*b*. The insulator 106*ca* is preferably in contact with part of the top surface of the semiconductor 106*b* in the opening formed in the insulator 117 and the conductors 108*a* and 108*b*.

The insulator 112*a* is provided over the insulator 106*ca*. The insulator 112*a* is preferably in contact with part of the top surface of the insulator 106*ca* in the opening formed in the insulator 117 and the conductors 108*a* and 108*b*.

The conductor 114*a* is provided over the insulator 112*a*. The conductor 114*a* is preferably in contact with part of the top surface of the insulator 112*a* in the opening formed in the insulator 117 and the conductors 108*a* and 108*b*. Note that in FIG. 1B, the side surfaces of the insulator 106*ca*, the insulator 112*a*, and the conductor 114*a* are substantially perpendicular to the top surface of the semiconductor 106*b*; however, the semiconductor device in this embodiment is not limited thereto. For example, the insulator 106*ca*, the insulator 112*a*, and the conductor 114*a* may each have a tapered shape in which the side surface is inclined at an angle larger than or equal to 30° and smaller than 90° to the top surface of the semiconductor 106*b*.

Note that the conductor 114*a* may be connected to the conductor 102*a* through an opening formed in the insulator 112*a*, the insulator 106*ca*, the insulator 104, the insulator 103, the insulator 105, and the like.

As illustrated in FIG. 1B, the conductor 110*a* is provided in an opening formed in the insulator 148, the insulator 149, the insulator 101, the insulator 107, the insulator 105, the insulator 103, the insulator 104, and the insulator 117. The conductor 110*a* is in contact with at least part of the conductor 146*a*, and is in contact with an end portion of a side surface of the conductor 108*a*. In addition, the conductor 110*a* may be in contact with part of the top surface of the conductor 108*a*. In addition, the conductor 110*a* may be in contact with an end portion of a side surface of the semiconductor 106*b*.

In particular, as illustrated in FIG. 1B, the conductor 110*a* is preferably in contact with the end portion of the side surface of the conductor 108*a* in the channel length direction. In such a structure, the conductor 108*a* and the conductor 146*a* can be connected to each other without a bridging wiring. Thus, the length of the memory cell 51*aa* in the channel length direction can be reduced.

In FIG. 1B, the side surface of the conductor 110*a* is substantially perpendicular to the top surface of the conductor 146*a*; however, the semiconductor device in this embodiment is not limited thereto. For example, the side surface of the conductor 110*a* may be inclined to the top surface of the conductor 146*a*. Furthermore, the conductor 110*a* may be formed by stacking a plurality of conductors.

Note that in FIG. 1B, the top surfaces of the insulator 117, the conductor 110*a*, the insulator 106*ca*, the insulator 112*a*, and the conductor 114*a* are substantially aligned with each other; however, the semiconductor device in this embodiment is not limited thereto.

An insulator 116 is provided over the insulator 117, and an insulator 119 having an opening is provided over the insulator 116. The conductor 118 is provided in the opening in the insulator 119. The conductor 118 is in contact with the conductor 108*b* through an opening provided in the insulator 117 and the insulator 116. The conductor 118 extends in the A1-A2 direction in FIG. 1A and serves as the wiring BLa.

The thickness of the insulator 116 is set as appropriate, whereby parasitic capacitance generated between the conductor 118 and each of the conductors 114*a* and 110*a* can be easily reduced.

In FIG. 1B, the gates of the transistors 52*aa* and 52*ab* are embedded in the opening in the insulator 117; however, the semiconductor device in this embodiment is not limited thereto. The shapes of the transistors 52*aa* and 52*ab* may be set as appropriate in accordance with the structures of the capacitors 53*aa* and 53*ab*, the sense amplifier 61, and the like.

As described above, the memory cell 51*aa* (memory cell 51*ab*) is stacked over the sense amplifier 61, and in the memory cell 51*aa* (memory cell 51*ab*), the capacitor 53*aa* (capacitor 53*ab*) is provided under the transistor 52*aa* (transistor 52*ab*), so that the area occupied by the semiconductor device in this embodiment can be reduced. Specifically, the memory cell 51*aa* (memory cell 51*ab*) is designed such that at least part of the conductor 114*a* (conductor 114*b*) overlaps with the conductor 142*a* (conductor 142*b*). Moreover, the memory cell 51*aa* (memory cell 51*ab*) is preferably designed such that at least part of the conductor 114*a* (conductor 114*b*) overlaps with the conductor 142*a* (conductor 142*b*) and any of the plurality of transistors 90. For example, when the minimum feature size is F, the area occupied by the memory cell 51*aa* (memory cell 51*ab*) can be approximately 8.5 $F^2$.

As illustrated in FIGS. 1A and 1B, a contact portion of the conductor 118 serving as the wiring BLa is shared between the memory cells 51*aa* and 51*ab*, so that the occupation area can be further reduced. However, the semiconductor device in this embodiment is not limited to the structure, and for example, one contact portion of the conductor 118 serving as the wiring BLa may be formed in each memory cell.

The conductor 110a is in contact with at least part of the conductor 146a, and is in contact with the end portion of the side surface of the conductor 108a, so that the occupation area can be further reduced.

In the semiconductor device formed in this manner, the integration degree can be 10 times to 100 times that of a DRAM in which a memory cell and a sense amplifier are formed on the same plane.

As described above, the area occupied by the semiconductor device in this embodiment is reduced, so that a semiconductor device in which storage capacity per unit area is large can be provided.

In the case where the sense amplifier and the memory cell are provided on the same plane, the area occupied by these components is the sum of the area occupied by the sense amplifier and the area occupied by the memory cell; thus, to reduce the occupation area, as many memory cells as possible need to be connected to one sense amplifier. Accordingly, as the number of memory cells connected to one sense amplifier is larger, the wiring BLa becomes longer and has a larger parasitic capacitance.

In contrast, in the semiconductor device in this embodiment, the memory cell can be provided over the sense amplifier; thus, the occupation area is not increased largely by the provision of one sense amplifier under a small number of memory cells. When the number of memory cells connected to one sense amplifier is reduced, the length of the wiring BLa can be reduced, and the parasitic capacitance of the wiring BLa can be reduced.

The parasitic capacitance of the wiring BLa is reduced, whereby noise in a signal caused by the parasitic capacitance of the wiring BLa can be reduced, and a semiconductor device in which errors in data reading are reduced can be provided. In addition, the speed of data reading can be increased.

Furthermore, since the parasitic capacitance of the wiring BLa affects the reading voltage, the electrostatic capacitance of the capacitor 53aa (capacitor 53ab) is preferably three times to four times the parasitic capacitance of the wiring BLa. In other words, as the parasitic capacitance of the wiring BLa is smaller, the electrostatic capacitance of the capacitor 53aa (capacitor 53ab) can have a higher margin. Thus, for example, the insulator 144a (insulator 144b) is made thicker to improve the insulation between the conductor 142a (conductor 142b) and the conductor 146a (conductor 146b). Furthermore, for example, the height of the capacitor 53aa (capacitor 53ab) is reduced to improve the productivity of the capacitor 53aa (capacitor 53ab).

Moreover, the electrostatic capacitance of the capacitor 53aa (capacitor 53ab) can be reduced, for example, to approximately 3 fF. Thus, the speed of data writing can be increased.

In addition, when the electrostatic capacitance of the capacitor 53aa (capacitor 53ab) has a margin, the memory cell 51aa (memory cell 51ab) can store multilevel data relatively easily. Furthermore, the electrostatic capacitance of the capacitor 53aa (capacitor 53ab) is increased, whereby the interval between refresh operations can be longer.

Moreover, as illustrated in FIG. 1B, the capacitor 53aa (capacitor 53ab) is provided under the transistor 52aa (transistor 52ab) and the conductor 118 serving as the wiring BLa is provided over the transistor 52aa (transistor 52ab), whereby the parasitic capacitance of the wiring BLa caused by the capacitor 53aa (capacitor 53ab) can be reduced.

<Oxide Semiconductor>

The structure of the semiconductor 106b is described in detail below. In this section, a detailed structure of each of the insulator 106a and the insulator 106ca (insulator 106cb) will be described in addition to that of the semiconductor 106b.

The semiconductor 106b is an oxide semiconductor containing indium, for example. The semiconductor 106b can have high carrier mobility (electron mobility) by containing indium, for example. The semiconductor 106b preferably contains an element M. The element M is preferably Ti, Ga, Y, Zr, La, Ce, Nd, Sn, or Hf. Note that two or more of the above elements may be used in combination as the element M in some cases. The element M is an element having high binding energy with oxygen, for example. The element M is an element whose binding energy with oxygen is higher than that of indium, for example. The element M is an element that can increase the energy gap of the oxide semiconductor, for example. Furthermore, the semiconductor 106b preferably contains zinc. When the oxide semiconductor contains zinc, the oxide semiconductor is easily crystallized, in some cases.

Note that the semiconductor 106b is not limited to the oxide semiconductor containing indium. The semiconductor 106b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For example, the insulator 106a and the insulator 106ca are oxide semiconductors including one or more elements, or two or more elements other than oxygen included in the semiconductor 106b. Since the insulator 106a and the insulator 106ca each include one or more elements, or two or more elements other than oxygen included in the semiconductor 106b, a defect state is less likely to be formed at the interface between the insulator 106a and the semiconductor 106b and the interface between the semiconductor 106b and the insulator 106ca.

The insulator 106a, the semiconductor 106b, and the insulator 106ca preferably include at least indium. In the case of using an In-M-Zn oxide as the insulator 106a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 106b, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In-M-Zn oxide as the insulator 106ca, when the summation of In and M is assumed to be 100 atomic %, the proportions of In and Mare preferably set to be less than 50 atomic % and greater than 50 atomic %, respectively, further preferably less than 25 atomic % and greater than 75 atomic %, respectively. Note that the insulator 106ca may be an oxide that is of the same type as the oxide of the insulator 106a. Note that the insulator 106a and/or the insulator 106ca do/does not necessarily contain indium in some cases. For example, the insulator 106a and/or the insulator 106ca may be gallium oxide. Alternatively, the insulator 106a and/or the insulator 106ca may be a Ga—Zn oxide. Note that the atomic ratio between the elements included in the insulator 106a, the semiconductor 106b, and the insulator 106ca is not necessarily a simple integer ratio.

In the case of deposition using a sputtering method, typical examples of the atomic ratio between the metal elements of a target that is used for the insulator 106a or the insulator 106ca include In:M:Zn=1:2:4, In:M:Zn=1:3:2, In:M:Zn=1:3:4, In:M:Zn=1:3:6, In:M:Zn=1:3:8, In:M:Zn=1:4:3, In:M:Zn=1:4:4, In:M:Zn=1:4:5, In:M:Zn=1:4:6, In:M:Zn=1:5:6, In:M:Zn=1:6:3, In:M:Zn=1:6:4, In:M:Zn=1:6:5, In:M:Zn=1:6:6, In:M:Zn=1:6:7, In:M:Zn=1:6:8, In:M:Zn=1:6:9, and In:M:Zn=1:10:1. The atomic ratio between the metal elements of the target that is used for the insulator 106a or the insulator 106ca may be M:Zn=10:1.

In the case of deposition using a sputtering method, typical examples of the atomic ratio between the metal elements of a target that is used for the semiconductor 106b include In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, In:M:Zn=4:2:4.1, and In:M:Zn=5:1:7. In particular, when a sputtering target containing In, Ga, and Zn at an atomic ratio of 4:2:4.1 is used, the deposited semiconductor 106b may contain In, Ga, and Zn at an atomic ratio of around 4:2:3.

An indium gallium oxide has small electron affinity and a high oxygen-blocking property. Therefore, the insulator 106ca preferably includes an indium gallium oxide. The gallium atomic ratio [Ga/(In+Ga)] is, for example, higher than or equal to 70%, preferably higher than or equal to 80%, further preferably higher than or equal to 90%.

For the semiconductor 106b, an oxide with a wide energy gap may be used, for example. For example, the energy gap of the semiconductor 106b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Here, the energy gap of the insulator 106a is larger than that of the semiconductor 106b. The energy gap of the insulator 106ca is larger than that of the semiconductor 106b.

As the semiconductor 106b, an oxide having an electron affinity larger than those of the insulators 106a and 106ca is used. For example, as the semiconductor 106b, an oxide having an electron affinity larger than those of the insulators 106a and 106ca by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum. In other words, the energy level of the conduction band minimum of the insulator 106a or the insulator 106ca is closer to the vacuum level than the energy level of the conduction band minimum of the semiconductor 106b is.

By applying gate voltage at this time, a channel is formed in the semiconductor 106b having the largest electron affinity among the insulator 106a, the semiconductor 106b, and the insulator 106ca. Note that when a high gate voltage is applied, current also flows in the insulator 106a near the interface with the semiconductor 106b and in the insulator 106ca near the interface with the semiconductor 106b in some cases.

The insulator 106a and the insulator 106ca are formed using a substance that can function as a conductor, a semiconductor, or an insulator when they are used alone. However, when the transistor is formed using a stack including the insulator 106a, the semiconductor 106b, and the insulator 106ca, electrons flow in the semiconductor 106b, at and in the vicinity of the interface between the semiconductor 106b and the insulator 106a, and at and in the vicinity of the interface between the semiconductor 106b and the insulator 106ca; thus, the insulator 106a and the insulator 106ca have a region not functioning as a channel of the transistor. For that reason, in this specification and the like, the insulator 106a and the insulator 106ca are not referred to as a semiconductor but an insulator or an oxide insulator. Note that the reason why the insulator 106a and the insulator 106ca are referred to as an insulator or an oxide insulator is because they are closer to an insulator than the semiconductor 106b is in terms of their functions in the transistor; thus, a substance that can be used for the semiconductor 106b is used for the insulator 106a and the insulator 106ca in some cases.

Here, in some cases, there is a mixed region of the insulator 106a and the semiconductor 106b between the insulator 106a and the semiconductor 106b. Furthermore, in some cases, there is a mixed region of the semiconductor 106b and the insulator 106ca between the semiconductor 106b and the insulator 106ca. The mixed region has a low density of defect states. For that reason, the stack of the insulator 106a, the semiconductor 106b, and the insulator 106ca has a band structure where energy is changed continuously at each interface and in the vicinity of the interface (continuous junction). Note that the boundary between the insulator 106a and the semiconductor 106b and the boundary between the insulator 106ca and the semiconductor 106b are not clear in some cases.

At this time, electrons move mainly in the semiconductor 106b, not in the insulator 106a and the insulator 106ca. As described above, when the density of defect states at the interface between the insulator 106a and the semiconductor 106b and the density of defect states at the interface between the semiconductor 106b and the insulator 106ca are decreased, electron movement in the semiconductor 106b is less likely to be inhibited and the on-state current of the transistor can be increased.

As factors in inhibiting electron movement are decreased, the on-state current of the transistor can be increased. For example, in the case where there is no factor in inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of the top or bottom surface of the semiconductor 106b (a formation surface; here, the top surface of the insulator 106a) is less than 1 μm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nM, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P-V can be measured using a scanning probe microscope SPA-500 manufactured by SII Nano Technology Inc.

Moreover, the thickness of the insulator 106ca is preferably as small as possible to increase the on-state current of the transistor. It is preferable that the thickness of the insulator 106ca is smaller than that of the insulator 106a and smaller than that of the semiconductor 106b. For example, the insulator 106ca is formed to include a region having a thickness of less than 10 nm, preferably less than or equal to 5 nm, further preferably less than or equal to 3 nm. Meanwhile, the insulator 106ca has a function of blocking entry of elements other than oxygen (such as hydrogen and silicon) included in the adjacent insulator into the semiconductor 106b where a channel is formed. For this reason, it is preferable that the insulator 106ca have a certain thickness. For example, the insulator 106ca is formed to include a region having a thickness of greater than or equal to 0.3 nm, preferably greater than or equal to 1 nm, further preferably greater than or equal to 2 nm.

To improve reliability, the insulator 106a is preferably thick. For example, the insulator 106a includes a region with a thickness of, for example, greater than or equal to 10 nm, preferably greater than or equal to 20 nm. When the thickness of the insulator 106a is made large, a distance from the interface between the adjacent insulator and the insulator 106a to the semiconductor 106b in which a channel is formed can be large. Since the productivity of the semiconductor device might be decreased, the insulator 106a has a region with a thickness of, for example, less than or equal to 80 nm.

Each of the insulator 106a, the semiconductor 106b, and the insulator 106ca described in this embodiment, especially the semiconductor 106b, is an oxide semiconductor with a low impurity concentration and a low density of defect states (a small number of oxygen vacancies) and thus can be referred to as a highly purified intrinsic or substantially highly purified intrinsic oxide semiconductor. Since a highly purified intrinsic or substantially highly purified intrinsic oxide semiconductor has few carrier generation sources, the carrier density can be low. Thus, a transistor in which a channel region is formed in the oxide semiconductor rarely has a negative threshold voltage (is rarely normally on). A highly purified intrinsic or substantially highly purified intrinsic oxide semiconductor has a low density of defect states and accordingly has a low density of trap states in some cases. Furthermore, a highly purified intrinsic or substantially highly purified intrinsic oxide semiconductor has an extremely low off-state current; the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V even when an element has a channel width (W) of $1 \times 10^6$ μm and a channel length (L) of 10 μm.

Accordingly, the transistor in which the channel region is formed in the highly purified intrinsic or substantially highly purified intrinsic oxide semiconductor can have a small change in electrical characteristics and high reliability. Charges trapped by the trap states in the oxide semiconductor take a long time to be released and may behave like fixed charges. Thus, the transistor whose channel region is formed in the oxide semiconductor having a high density of trap states has unstable electrical characteristics in some cases. Examples of impurities are hydrogen, nitrogen, alkali metal, and alkaline earth metal.

Hydrogen contained in the insulator 106a, the semiconductor 106b, and the insulator 106ca reacts with oxygen bonded to a metal atom to be water, and also causes an oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Hydrogen trapped by an oxygen vacancy might form a shallow donor level in a band structure of a semiconductor. Thus, a transistor including an oxide semiconductor that contains hydrogen is likely to be normally on. For this reason, it is preferable that hydrogen be reduced as much as possible in the insulator 106a, the semiconductor 106b, and the insulator 106ca. Specifically, the hydrogen concentration in the insulator 106a, the semiconductor 106b, and the insulator 106ca, which is measured by secondary ion mass spectrometry (SIMS), is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, still further preferably lower than or equal to $5 \times 10^{18}$ atoms/cm$^3$, yet further preferably lower than or equal to $1 \times 10^{18}$ atoms/cm$^3$, even further preferably lower than or equal to $5 \times 10^{17}$ atoms/cm$^3$, and further preferably lower than or equal to $1 \times 10^{16}$ atoms/cm$^3$.

When the insulator 106a, the semiconductor 106b, and the insulator 106ca contain silicon or carbon, which is one of elements belonging to Group 14, oxygen vacancies in the insulator 106a, the semiconductor 106b, and the insulator 106ca are increased, which makes the insulator 106a, the semiconductor 106b, and the insulator 106ca n-type. Thus, the concentration of silicon or carbon (measured by SIMS) in the insulator 106a, the semiconductor 106b, and the insulator 106ca or the concentration of silicon or carbon (measured by SIMS) at and in the vicinity of the interface with the insulator 106a, the semiconductor 106b, and the insulator 106ca is set to be lower than or equal to $2 \times 10^{18}$ atoms/cm$^3$, preferably lower than or equal to $2 \times 10^{17}$ atoms/cm$^3$.

In addition, the concentration of an alkali metal or alkaline earth metal in the insulator 106a, the semiconductor 106b, and the insulator 106ca, which is measured by SIMS, is set to be lower than or equal to $1 \times 10^{18}$ atoms/cm$^3$, preferably lower than or equal to $2 \times 10^{16}$ atoms/cm$^3$. An alkali metal and an alkaline earth metal might generate carriers when bonded to an oxide semiconductor, in which case the off-state current of the transistor might be increased. Thus, it is preferable to reduce the concentration of an alkali metal or alkaline earth metal in the insulator 106a, the semiconductor 106b, and the insulator 106ca.

Furthermore, when containing nitrogen, the insulator 106a, the semiconductor 106b, and the insulator 106ca easily become n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

In addition, regions of the semiconductor 106b or the insulator 106ca that are in contact with the conductor 108a and the conductor 108b include low-resistance regions in some cases. The low-resistance regions are mainly formed when oxygen is extracted by the conductor 108a and the conductor 108b that are in contact with the semiconductor 106b, or when a conductive material in the conductor 108a or the conductor 108b is bonded to an element in the semiconductor 106b. The formation of the low-resistance regions leads to a reduction in contact resistance between the conductor 108a or 108b and the semiconductor 106b, whereby the transistor 52aa can have a large on-state current.

The semiconductor 106b might have a smaller thickness in a region between the conductor 108a and the conductor 108b than in regions overlapping with the conductor 108a and the conductor 108b. This is because part of the top surface of the semiconductor 106b is removed at the time of formation of the conductor 108a and the conductor 108b. In formation of the conductor to be the conductor 108a and the conductor 108b, a region with low resistance like the above low-resistance regions is formed on the top surface of the semiconductor 106b in some cases. By removal of a region of the top surface of the semiconductor 106b that is positioned between the conductor 108a and the conductor 108b, the channel can be prevented from being formed in the low-resistance region on the top surface of the semiconductor 106b.

Note that the three-layer structure including the insulator 106a, the semiconductor 106b, and the insulator 106ca is an example. For example, a two-layer structure not including the insulator 106a or the insulator 106ca may be employed. Alternatively, a single-layer structure including neither the insulator 106a nor the insulator 106ca may be employed. Still alternatively, it is possible to employ an n-layer structure (n is an integer of four or more) that includes any of the insulator, semiconductor, and conductor given as examples of the insulator 106a, the semiconductor 106b, and the insulator 106ca.

<Semiconductor Substrate, Insulator, Conductor>

Components other than the semiconductor of the transistor 52aa are described in detail below.

For the semiconductor substrate 120, a single-material semiconductor substrate formed using silicon, germanium, or the like or a semiconductor substrate formed using silicon carbide, silicon germanium, gallium arsenide, indium phosphide, zinc oxide, gallium oxide, or the like may be used, for example. A single crystal silicon substrate is preferably used as the semiconductor substrate 120. Alternatively, as the semiconductor substrate 120, a semiconductor substrate in which an insulator region is provided in the semiconductor substrate, e.g., a silicon on insulator (SOI) substrate or the like may be used.

As the semiconductor substrate 120, for example, a semiconductor substrate including impurities imparting p-type conductivity is used. However, a semiconductor substrate including impurities imparting n-type conductivity may be used as the semiconductor substrate 120. Alternatively, the semiconductor substrate 120 may be an i-type semiconductor substrate.

The low-resistance region 121 provided in the semiconductor substrate 120 preferably contains an element that imparts n-type conductivity, such as phosphorus or arsenic, or an element that imparts p-type conductivity, such as boron or aluminum. Similarly, the low-resistance region 123 also preferably contains an element that imparts n-type conductivity, such as phosphorus or arsenic, or an element that imparts p-type conductivity, such as boron or aluminum. Since the low-resistance region 123 preferably serves as the LDD region, the concentration of the element imparting a conductivity type contained in the low-resistance region 123 is preferably lower than that of the element imparting a conductivity type contained in the low-resistance region 121. Note that the low-resistance region 121 may be formed using silicide.

The insulator 124 and the insulator 125 can each be formed using, for example, an insulator containing one or more materials selected from aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like. A high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide may be used.

It is preferable that the conductor 126 be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Still alternatively, a stacked-layer structure including a film of metal nitride and a film of any of the above metals may be used for the conductor 126. As a metal nitride, tungsten nitride, molybdenum nitride, or titanium nitride can be used. When the metal nitride film is provided, adhesiveness of the metal film can be increased; thus, separation can be prevented.

The insulators 128, 130, 136, 140, 148, and 149 may each be formed so as to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

At least one of the insulators 130, 136, 140, 148, and 149 preferably has a function of blocking oxygen and impurities such as hydrogen. An insulator having a function of blocking oxygen and an impurity such as hydrogen is provided below the transistor 52aa, whereby stable electric characteristics of the transistor 52aa can be achieved.

An insulator with a function of blocking oxygen and impurities such as hydrogen may have a single-layer structure or a layered structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum can be used.

The conductors 134a, 138a, 142a, and 146a may each be formed so as to have a single-layer structure or a layered structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

As the insulator 144a, the insulator that can be used as the insulators 124 and 125 is used. In particular, a high-k material such as hafnium silicate ($HfSi_xO_y$ (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is preferably used. The use of such a high-k material enables sufficient capacitance of the capacitor 53aa to be ensured even if the insulator 144a is made thick. The insulator 144a having a large thickness can suppress leakage current generated between the conductor 142a and the conductor 146a.

A hafnium-containing oxide with a crystal structure has higher dielectric constant than a hafnium-containing oxide with an amorphous structure in some cases. For example, hafnium dioxide has relative dielectric constant of approximately 13 to 18 in an amorphous state; however, the relative dielectric constant is increased to 40 or higher by the transition to a cubic crystal phase. Such crystallization of the oxide containing hafnium requires high-temperature heat treatment in many cases, for example, heat treatment at approximately 700° C.

As the insulator 101, an insulator having a function of blocking hydrogen or water is used. Hydrogen or water in the insulator provided near the insulator 106a, the semiconductor 106b, and the insulator 106ca is one of the factors of carrier generation in the insulator 106a, the semiconductor 106b, and the insulator 106ca which also function as oxide semiconductors. Because of this, the reliability of the transistor 52aa might be decreased. In the semiconductor substrate 120 of the transistor 90, hydrogen is used to terminate a dangling bond of the semiconductor element; thus, the hydrogen might diffuse into the transistor 52aa. However, if such a structure includes the insulator 101 having a function of blocking hydrogen or water, diffusion of hydrogen or water from below the transistor 52aa can be inhibited, leading to an improvement in the reliability of the transistor 52aa. It is preferable that the insulator 101 be less permeable to hydrogen or water than the insulator 105 and the insulator 104.

The insulator 101 preferably has a function of blocking oxygen. If oxygen diffused from the insulator 104 can be blocked by the insulator 101, oxygen can be effectively supplied from the insulator 104 to the insulator 106a, the semiconductor 106b, and the insulator 106ca.

The insulator 101 can be formed using, for example, aluminum oxide, aluminum oxynitride, gallium oxide, gallium oxynitride, yttrium oxide, yttrium oxynitride, hafnium oxide, or hafnium oxynitride. The use of such a material enables the insulator 101 to function as an insulating film having an effect of blocking diffusion of oxygen, hydrogen, and water. The insulator 101 can be formed using, for example, silicon nitride or silicon nitride oxide. The use of such a material enables the insulator 101 to function as an insulating film having an effect of blocking diffusion of hydrogen and water.

As the insulator 107, any of the insulators that can be used as the insulator 149 and the like is used.

At least part of the conductor 102a preferably overlaps with the semiconductor 106b in a region where the semiconductor 106b is positioned between the conductor 108a and the conductor 108b. The conductor 102a functions as a back gate of the transistor 52aa. The conductor 102a can control the threshold voltage of the transistor 52aa. Control of the threshold voltage can prevent the transistor 52aa from being turned on when voltage applied to the gate (conductor 114a) of the transistor 52aa is low, e.g., 0 V or lower. Thus, the electrical characteristics of the transistor 52aa can be easily made normally-off characteristics.

Note that the conductor 102a serving as a back gate may be connected to a wiring or a terminal to which a predetermined potential is supplied. For example, the conductor 102a may be connected to a wiring to which a constant potential is supplied. The constant potential can be a high power supply potential or a low power supply potential such as a ground potential.

The conductor 102a may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 105 is provided to cover the conductor 102a. An insulator similar to the insulator 104 or the insulator 112a to be described later can be used as the insulator 105.

The insulator 103 is provided to cover the insulator 105. The insulator 103 preferably has a function of blocking oxygen. Providing the insulator 103 can prevent extraction of oxygen from the insulator 104 by the conductor 102a. Accordingly, oxygen can be effectively supplied from the insulator 104 to the insulator 106a, the semiconductor 106b, and the insulator 106ca. By improving the coverage with the insulator 103, extraction of oxygen from the insulator 104 can be further reduced and oxygen can be more effectively supplied from the insulator 104 to the insulator 106a, the semiconductor 106b, and the insulator 106ca.

As the insulator 103, an oxide or a nitride containing boron, aluminum, silicon, scandium, titanium, gallium, yttrium, zirconium, indium, lanthanum, cerium, neodymium, hafnium, or thallium is used. It is preferable to use hafnium oxide or aluminum oxide.

Of the insulators 105, 103, and 104, the insulator 103 preferably includes an electron trap region. When the insulators 105 and 104 have a function of inhibiting release of electrons, the electrons trapped in the insulator 103 behave as if they are negative fixed charges. Thus, the insulator 103 has a function of a floating gate.

The amounts of hydrogen and water contained in the insulator 104 are preferably small. For example, the insulator 104 may be formed to have a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used for the insulator 104. Preferably, silicon oxide or silicon oxynitride is used.

The insulator 104 is preferably an insulator containing excess oxygen. Such insulator 104 makes it possible to supply oxygen from the insulator 104 to the insulator 106a, the semiconductor 106b, and the insulator 106ca. The supplied oxygen can reduce oxygen vacancies which are to be defects in the insulator 106a, the semiconductor 106b, and the insulator 106ca which are oxide semiconductors. As a result, the insulator 106a, the semiconductor 106b, and the insulator 106ca can be oxide semiconductors with a low density of defect states and stable characteristics.

In this specification and the like, excess oxygen refers to oxygen in excess of the stoichiometric composition, for example. Alternatively, excess oxygen refers to oxygen released from a film or layer containing excess oxygen by heating, for example. Excess oxygen can move inside a film or a layer. Excess oxygen moves between atoms in a film or a layer, or replaces oxygen that is a constituent of a film or a layer and moves like a billiard ball, for example.

The insulator 104 containing excess oxygen releases oxygen molecules, the number of which is greater than or equal to $1.0 \times 10^{14}$ molecules/cm$^2$ and less than or equal to $1.0 \times 10^{16}$ molecules/cm$^2$ and preferably greater than or equal to $1.0 \times 10^{15}$ molecules/cm$^2$ and less than or equal to $5.0 \times$ $10^{15}$ molecules/cm$^2$ in thermal desorption spectroscopy (TDS) analysis in the range of a surface temperature from 100° C. to 700° C. or from 100° C. to 500° C.

A method for measuring the amount of released molecules using TDS analysis is described below by taking the amount of released oxygen as an example.

The total amount of gas released from a measurement sample in TDS analysis is proportional to the integral value of the ion intensity of the released gas. Then, comparison with a reference sample is made, whereby the total amount of released gas can be calculated.

For example, the number of oxygen molecules (N$_{O2}$) released from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that CH$_3$OH, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is not taken into consideration either because the proportion of such a molecule in the natural world is negligible.

$$N_{O2}=N_{H2}/S_{H2} \times S_{O2} \times \alpha$$

The value N$_{H2}$ is obtained by conversion of the number of hydrogen molecules desorbed from the standard sample into densities. The value S$_{H2}$ is the integral value of ion intensity when the standard sample is subjected to the TDS analysis. Here, the reference value of the standard sample is set to N$_{H2}$/S$_{H2}$. S$_{O2}$ is the integral value of ion intensity when the measurement sample is analyzed by TDS. The value α is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W, using a silicon substrate containing a certain amount of hydrogen atoms as the reference sample.

Furthermore, in the TDS analysis, oxygen is partly detected as an oxygen atom. The ratio of oxygen molecules to oxygen atoms can be calculated from the ionization rate of the oxygen molecules. Note that since the above α includes the ionization rate of the oxygen molecules, the number of the released oxygen atoms can also be estimated through the measurement of the number of the released oxygen molecules.

Note that N$_{O2}$ is the number of the released oxygen molecules. The number of released oxygen in the case of being converted into oxygen atoms is twice the number of the released oxygen molecules.

Furthermore, the insulator from which oxygen is released by heat treatment may contain a peroxide radical. Specifically, the spin density attributed to the peroxide radical is greater than or equal to 5×10$^{17}$ spins/cm$^3$. Note that the insulator containing a peroxide radical may have an asymmetric signal with a g factor of approximately 2.01 in electron spin resonance (ESR).

The insulator 104 may have a function of preventing diffusion of impurities from the semiconductor substrate 120.

As described above, the top surface or the bottom surface of the semiconductor 106b preferably has high planarity. Thus, to improve the planarity, the top surface of the insulator 104 may be subjected to planarization treatment performed by a chemical mechanical polishing (CMP) method or the like.

The conductors 108a and 108b serve as a source electrode and a drain electrode of the transistor 52aa.

The conductors 108a and 108b may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 112a functions as a gate insulating film of the transistor 52aa. Like the insulator 104, the insulator 112a may be an insulator containing excess oxygen. Such insulator 112a makes it possible to supply oxygen from the insulator 112a to the insulator 106a, the semiconductor 106b, and the insulator 106ca.

The insulator 112a and the insulator 117 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 112a and the insulator 117 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 114a functions as a gate electrode of the transistor 52aa. The conductor 114a is formed using the conductor that can be used as the conductor 102a.

Here, as illustrated in FIG. 1C, the semiconductor 106b can be electrically surrounded by an electric field of the conductor 102a and the conductor 114a (a structure in which a semiconductor is electrically surrounded by an electric field of a conductor is referred to as a surrounded channel (s-channel) structure). Therefore, a channel is formed in the entire semiconductor 106b (the top, bottom, and side surfaces). In the s-channel structure, a large amount of current can flow between a source and a drain of a transistor, so that a high on-state current can be obtained.

In the case where the transistor has the s-channel structure, a channel is formed also in the side surface of the semiconductor 106b. Therefore, as the semiconductor 106b has a larger thickness, the channel region becomes larger. In other words, the thicker the semiconductor 106b is, the larger the on-state current of the transistor is. In addition, when the semiconductor 106b is thicker, the proportion of the region with a high carrier controllability increases, leading to a smaller subthreshold swing value. For example, the semiconductor 106b has a region with a thickness greater than or equal to 10 nm, preferably greater than or equal to 20 nm, further preferably greater than or equal to 30 nm. Since the productivity of the semiconductor device might be decreased, the semiconductor 106b has a region with a thickness of, for example, less than or equal to 150 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

The insulator 116 and the insulator 117 function as protective insulating films of the transistor 52aa. Here, the thickness of the insulator 116 can be greater than or equal to 5 nm, or greater than or equal to 20 nm, for example. It is preferable that at least part of the insulator 116 be in contact with the top surface of the insulator 117.

The insulator 116 may be formed to have a single-layer structure or a stacked-layer structure including an insulator containing, for example, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 116 preferably has a blocking effect against oxygen, hydrogen, water, alkali metal, alkaline earth metal, and the like. As such an insulator, for example, a nitride insulating film can be used. As examples of the nitride insulating film, a silicon nitride film, a silicon nitride oxide film, an aluminum nitride film, an aluminum nitride oxide film, and the like can be given. Note that instead of the nitride insulating film, an oxide insulating film having a blocking effect against oxygen, hydrogen, water, and the like, may be provided. As examples of the oxide insulating film, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Here, it is preferable that the insulator 116 be formed by a sputtering method and it is further preferable that the insulator 116 be formed by a sputtering method in an atmosphere containing oxygen. When the insulator 116 is formed by a sputtering method, oxygen is added to the vicinity of a surface of the insulator 117 (after the formation of the insulator 116, an interface between the insulator 116 and the insulator 117) at the same time as the formation.

It is preferable that the insulator 116 be less permeable to oxygen than the insulator 117 and have a function of blocking oxygen. Providing the insulator 116 can prevent oxygen from being externally released to above the insulator 116 at the time of supply of oxygen from the insulator 117 to the insulator 106a, the semiconductor 106b, and the insulator 106ca.

Aluminum oxide is preferably used as the insulator 116 because it is highly effective in preventing transmission of both oxygen and impurities such as hydrogen and moisture.

An oxide that can be used for the insulator 106a or the insulator 106ca can be used for the insulator 116. Such an oxide can be relatively easily formed by a sputtering method, and thus, oxygen can be effectively added to the insulator 117. The insulator 116 is preferably formed with an oxide insulator containing In, such as an In—Al oxide, an In—Ga oxide, or an In—Ga—Zn oxide. An oxide insulator containing In is favorably used for the insulator 116 because the number of particles generated at the time of the deposition by a sputtering method is small.

The insulator 119 functions as an interlayer insulating film. The insulator 119 may be formed using the insulator that can be used as the insulator 105.

As the conductor 110a and the conductor 118, the conductor that can be used for the conductor 108a and the conductor 108b is used.

As described above, when a highly purified intrinsic or substantially highly purified intrinsic oxide semiconductor is used as the semiconductor 106b, the transistor 52aa (transistor 52ab) with extremely low off current can be provided in the memory cell 51aa (memory cell 51ab). Accordingly, the data holding period in the memory cell 51aa (memory cell 51ab) becomes longer, so that the power consumption can be reduced.

However, if impurities such as hydrogen and water are diffused into the transistor 52aa (transistor 52ab) after the fabrication of the transistor 52aa (transistor 52ab) and affect the semiconductor 106b, such an effect is not sufficiently obtained in some cases. In particular, in the case where the capacitor and the like are fabricated after the fabrication of the transistor 52aa (transistor 52ab), high-temperature heat treatment is needed in the fabrication process in some cases; thus, thermally diffused impurities may affect the semiconductor 106b.

In contrast, in the semiconductor device in this embodiment, the capacitor 53aa (capacitor 53ab) is formed over the transistor 90 included in the sense amplifier 61, and the transistor 52aa (transistor 52ab) is formed over the capacitor 53aa (capacitor 53ab). That is, since no capacitor or the like is formed over the transistor 52aa (transistor 52ab), the high-temperature heat treatment or the like which might affect the semiconductor 106b is not needed after the fabrication of the transistor. Thus, there arises no problem even if a high-k material is used for the insulator 144a (insulator 144b) of the capacitor 53aa (capacitor 53ab) to increase the electrostatic capacitance. In this manner, the transistor 52aa (transistor 52ab) including the highly purified intrinsic or substantially highly purified intrinsic semiconductor 106b can be formed.

For example, in the case where a main memory device is fabricated using the semiconductor device in this embodiment, the storage capacity of the memory device, is determined by the area occupied by the semiconductor device; thus, the area occupied by the memory cell needs to be reduced as small as possible. Thus, the area occupied by the capacitor 53aa (capacitor 53ab) is preferably small. Because of this, the relative dielectric constant of the insulator 144a needs to be increased as much as possible. As described above, to increase the relative dielectric constant of the insulator 144a, an oxide containing hafnium, which is a high-k material, is used and the oxide is crystallized by heat treatment or the like.

The heat treatment is performed on the oxide containing hafnium at a high temperature of approximately 700° C., for example. If the heat treatment is performed after the fabrication of the transistor 52aa (transistor 52ab), the semiconductor 106b might be affected by thermal diffusion of impurities such as water and hydrogen. However, in the semiconductor device in this embodiment, there is no such a possibility because the heat treatment is performed before the transistor 52aa (transistor 52ab) is fabricated. As a result, a main memory device including a semiconductor device in which data is held for a long time and power consumption is reduced can be provided.

<Configuration Example of Memory Circuit>

Figure 2:
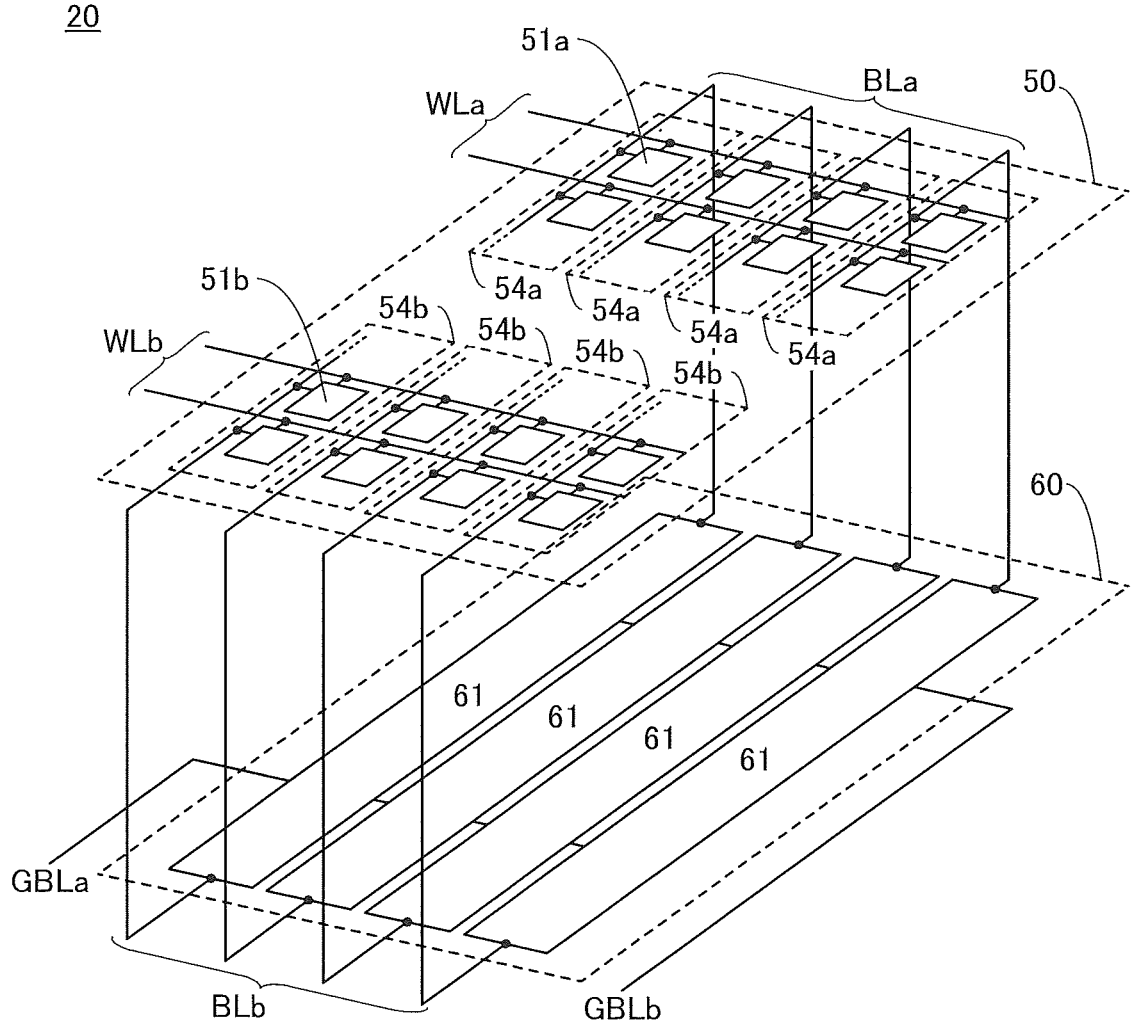
FIG. 2 is a block diagram illustrating a semiconductor device of one embodiment of the present invention.
Figure 3:
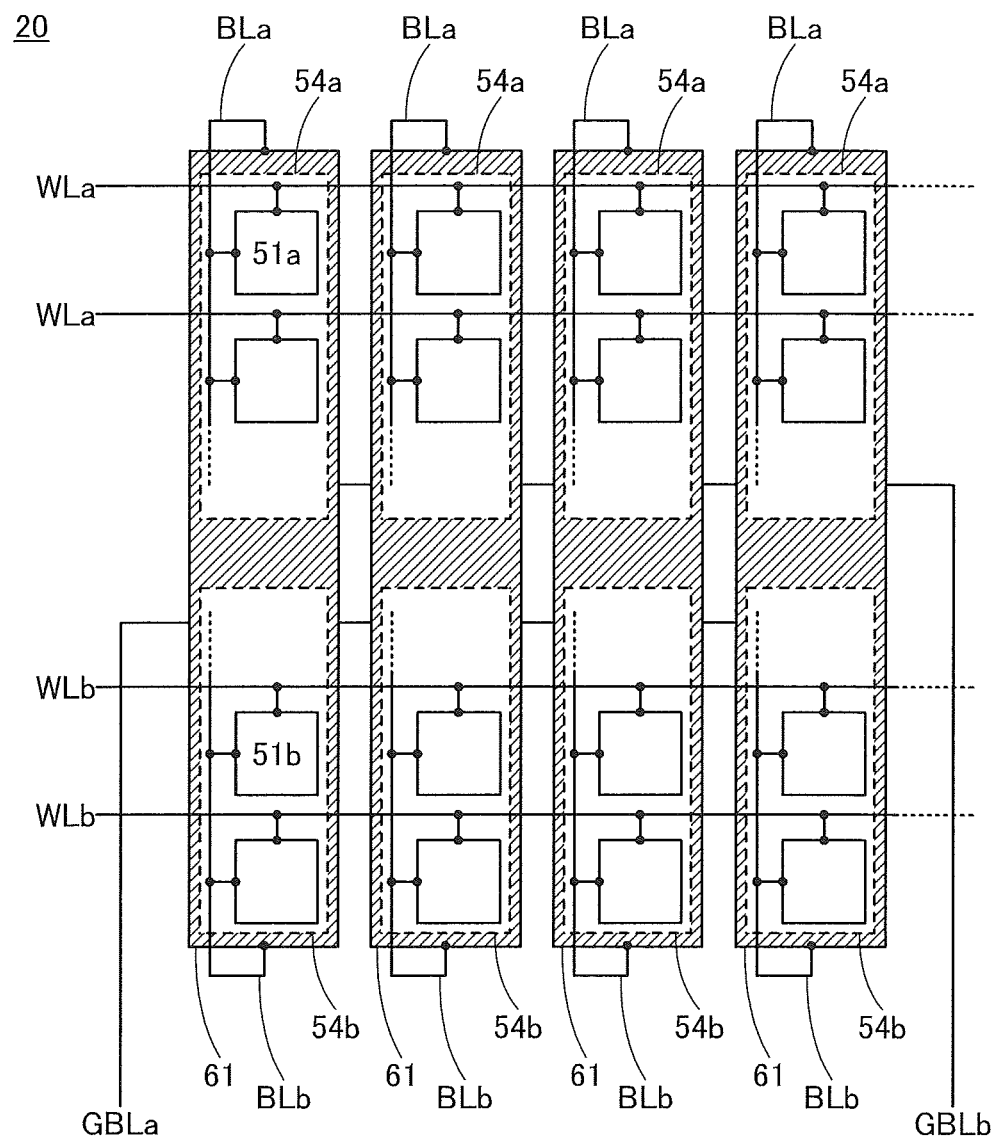
FIG. 3 is a block diagram illustrating a semiconductor device of one embodiment of the present invention.

FIG. 2 illustrates a configuration example of a memory circuit 20 in which the memory cell and the sense amplifier in FIGS. 1A to 1D are used. The memory circuit 20 includes a plurality of memory cells 51a and a plurality of memory cells 51b provided in a cell array 50 and a plurality of sense amplifiers 61 provided in a sense amplifier circuit 60. FIG. 3 is a top view of the memory circuit 20 in FIG. 2. Here, two adjacent memory cells 51a or two adjacent memory cells 51b can have structures similar to those of the memory cells 51aa and 51ab in FIGS. 1A to 1D, and the structure of the sense amplifier 61 can be similar to that in FIGS. 1A to 1D. Note that, hereinafter the memory cell 51a and the memory cell 51b are collectively referred to as memory cells 51 in some cases.

The memory cell 51a is connected to a wiring WLa and the wiring BLa. The memory cell 51a is selected in accordance with a potential supplied to the wiring WLa, and a potential corresponding to data to be written to the memory cell 51a (hereinafter the potential is also referred to as writing potential) is supplied to the wiring BLa; in this manner, data is written to the memory cell 51a. Similarly, the memory cell 51b is also connected to a wiring WLb and a wiring BLb. Note that, hereinafter the wiring WLa and the wiring WLb are collectively referred to as wirings WL and the wiring BLa and the wiring BLb are collectively referred to as wirings BL in some cases.

In the sense amplifier circuit 60, a plurality of sense amplifiers 61 are connected to the wirings BL, a wiring GBLa, and a wiring GBLb. Note that, hereinafter the wiring GBLa and the wiring GBLb are collectively referred to as wirings GBL in some cases. Here, a configuration example in which the sense amplifier 61 is connected to two wirings BLa and BLb is shown. The sense amplifier 61 is also connected to the wirings GBLa and GBLb.

The sense amplifier circuit 60 has a function of amplifying a signal that is input and controlling output of the amplified signal. Specifically, the sense amplifier circuit 60 has a function of amplifying the potentials of the wirings BL (hereinafter, the potentials are also referred to as reading potentials), which correspond to data stored in the memory cells 51, and outputting them to the wirings GBL at a predetermined timing. Since the reading potentials are amplified by the sense amplifier circuit 60, data can be surely read even in the case where a potential read from the memory cell 51 is extremely low. Furthermore, since output of the amplified potentials to the wirings GBL is controlled, each of the wirings GBL can be shared.

The memory circuit 20 in FIG. 2 and FIG. 3 includes four sets of one sense amplifier 61 and a plurality of memory cells 51a and a plurality of memory cells 51b which are stacked over the sense amplifier 61. Note that the number of sets included in the memory circuit 20 of one embodiment of the present invention may be one, two, three, or more than four.

In FIG. 2 and FIG. 3, a region 54a including the plurality of memory cells 51a and a region 54b including the plurality of memory cells 51b overlap with one sense amplifier 61 connected to the plurality of memory cells 51a and the plurality of memory cells 51b.

In FIG. 2 and FIG. 3, the sense amplifier 61 is connected to the wiring BLa and the wiring BLb. The plurality of memory cells 51a in one region 54a are connected to the same wiring BLa. The plurality of memory cells 51b in one region 54b are connected to the same wiring BLb.

The plurality of wirings WLa are shared by four regions 54a, and the plurality of wirings WLb are shared by four regions 54b. Specifically, one wiring WLa is connected to four memory cells 51a, and one wiring WLb is connected to four memory cells 51b.

Since the cell array 50 in FIG. 2 and FIG. 3 has an open-type layout, the wirings BLa do not intersect with the wirings WLb, and the wirings BLb do not intersect with the wirings WLa.

Each of the sense amplifiers 61 is connected to the wiring GBLa and the wiring GBLb.

Such a layout type of a cell array is called an open-type layout in some cases. In an open-type layout, the density of memory cells can be higher than that in a folded layout, which is described later, and thus the area of the cell array 50 can be reduced. As a result, the area of the memory circuit 20 can be reduced, and the storage capacity per unit area of the memory circuit 20 can be increased.

In one embodiment of the present invention, in the memory circuit 20, the cell array 50 is stacked over the sense amplifiers 61. In the region 54a or the region 54b, at least one memory cell 51 is positioned so as to overlap with the sense amplifier 61. Accordingly, the area of the memory circuit 20 can be smaller than that in the case where the cell array 50 and the sense amplifiers 61 are positioned in the same layer. Consequently, the storage capacity per unit area of the memory circuit 20 can be increased. The memory cell 51 may be positioned so as to overlap with one sense amplifier 61; alternatively, the memory cell 51 may be positioned so as to overlap with the plurality of sense amplifiers 61. The number of the memory cells 51 stacked over one sense amplifier 61, i.e., the number of the memory cells 51 in the pair of regions 54a and 54b can be freely set, for example, to 512 or less, preferably 256 or less, and at least two.

In order to reduce the power consumption of the memory circuit 20, the number of the memory cells 51 in the regions 54a and 54b is preferably reduced. However, when the number of the memory cells 51 in the regions 54a and 54b is reduced, the number of the sense amplifiers 61 needs to be increased to maintain the storage capacity. Here, in the case where the cell array 50 and the sense amplifiers 61 are provided in the same layer, an increase in the number of the sense amplifiers 61 directly leads to an increase in the area of the memory circuit 20. Therefore, it is difficult to reduce the number of the memory cells 51 in the regions 54a and 54b to a predetermined number or less.

In contrast, one embodiment of the present invention employs a stacked structure of the cell array 50 and the sense amplifiers 61; thus, even when the number of the sense amplifiers 61 is increased, an increase in the area of the memory circuit 20 can be suppressed. Therefore, the power consumption of the memory circuit 20 can be easily reduced by reducing the number of the memory cells 51 in the regions 54a and 54b. Specifically, the number of the memory cells 51 stacked over one sense amplifier 61, i.e., the number of the memory cells 51 in the pair of regions 54a and 54b can be 64 or less, preferably 32 or less, further preferably 16 or less, still further preferably 8 or less. Note that the total area of the sense amplifiers 61 is preferably smaller than or equal to the area of the cell array 50; however, even in the case where the total area of the sense amplifiers 61 is larger than the area of the cell array 50, an increase in the area of the memory circuit 20 can be reduced.

In the stacked structure of the cell array 50 and the sense amplifiers 61, the lengths of the wirings BL connecting the cell array 50 to the sense amplifiers 61 can be shortened. Moreover, when the number of the memory cells 51 stacked over one sense amplifier 61, i.e., the number of the memory cells 51 in the pair of regions 54a and 54b is reduced, the wirings BL connecting the cell array 50 to the sense amplifiers 61 can be further shortened. Consequently, the wiring resistance and the parasitic capacitance of the wirings BL can be reduced, and a reduction in the power consumption of the memory circuit 20 and an increase in its operation speed can be achieved. In addition, noise in the reading potential can be reduced; thus, errors in reading operation can be reduced. Furthermore, the parasitic capacitance of the wiring BL is reduced, whereby the electrostatic capacitance of the capacitor can be reduced. Accordingly, the area of the capacitor provided in the memory cell 51 can be small; thus, the size of the memory cell 51 can be small. For example, the electrostatic capacitance of the capacitor 53aa or 53ab can be set to 4 fF or less, preferably 3 fF or less.

<Configuration Example of Semiconductor Device Including Memory Circuit>

Next, a configuration example of a semiconductor device including the memory circuit 20 is illustrated with reference to FIG. 4.

Figure 4:
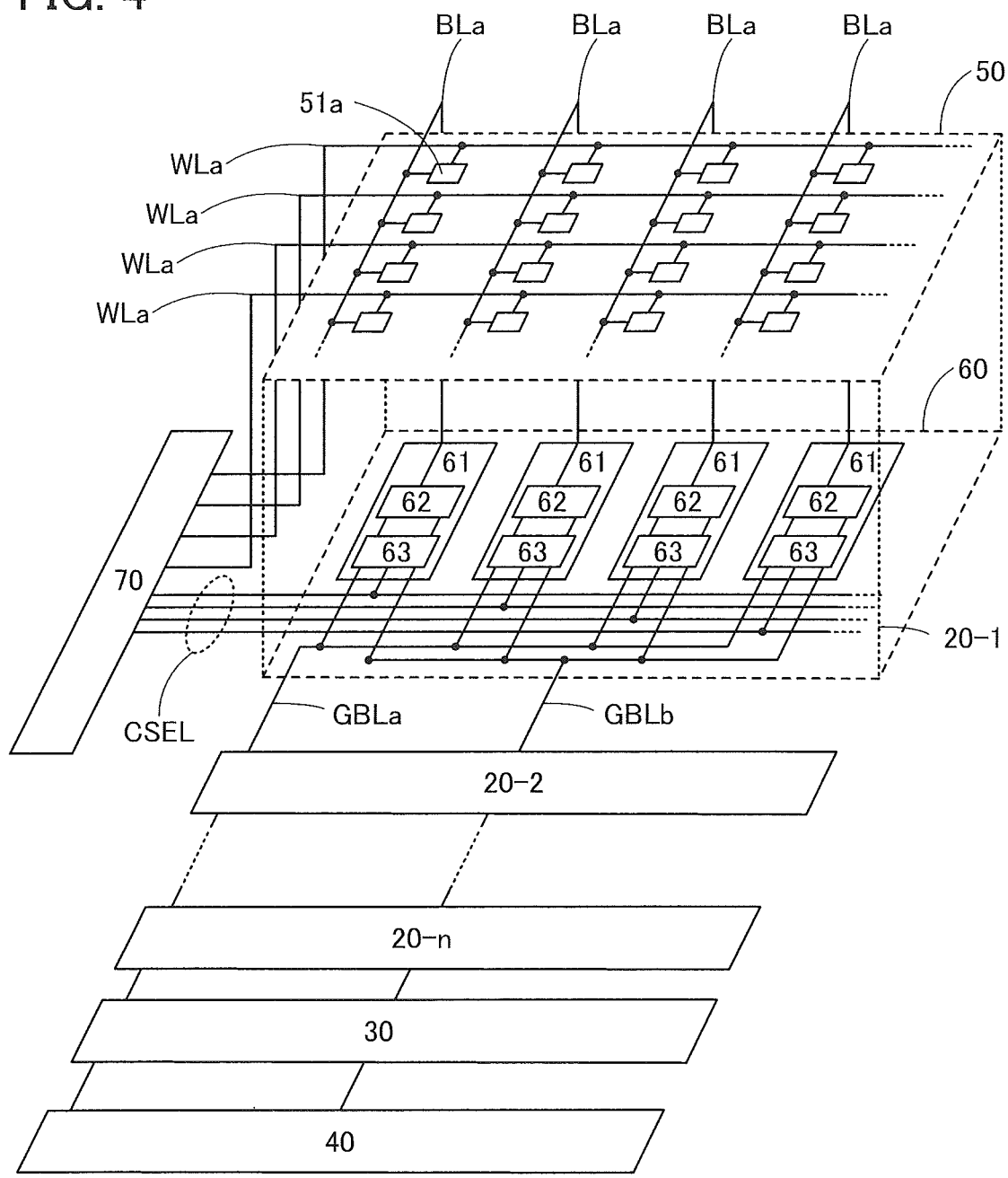
FIG. 4 is a block diagram illustrating a semiconductor device of one embodiment of the present invention.

The semiconductor device illustrated in FIG. 4 includes memory circuits 20, a main amplifier 30, and an input/output circuit 40. Here, a configuration in which the semiconductor device includes n (n is a natural number of 2 or more) memory circuits 20 (memory circuits 20-1 to 20-n) is shown. In FIG. 4, as in FIG. 2 and FIG. 3, the memory circuit 20 includes the cell array 50 including the plurality of memory cells 51 and the sense amplifier circuit 60 including the plurality of sense amplifiers 61. The configuration in which the memory circuit 20-1 includes the cell array 50 and the sense amplifier circuit 60 is shown in FIG. 4; the memory circuits 20-2 to 20-n can have the same configuration as the memory circuit 20-1. Note that in the memory circuit 20-1 in FIG. 4, the wirings BLb, the wirings WLb, the memory cells 51b, and the like illustrated in FIG. 2 and FIG. 3 are not illustrated for simplicity. Furthermore, in the sense amplifier circuit 60 in FIG. 4, one wiring GBLa and one wiring GBLb are provided; however, the configuration is not limited thereto, and a plurality of wirings GBLa and a plurality of wirings GBLb may be provided.

The main amplifier 30 is connected to the memory circuits 20 and the input/output circuit 40. The main amplifier 30 has a function of amplifying a signal that is input. Specifically, the main amplifier 30 has a function of amplifying the potentials of the wirings GBL and outputting them to the input/output circuit 40. Note that the main amplifier 30 is not necessarily provided.

The input/output circuit 40 has a function of outputting the potentials of the wirings GBL or the potentials read from the main amplifier 30 as reading data to the outside.

In the case where the wirings BL are connected to the respective wirings GBL, the number of the wirings GBL needs to be the same as the number of the wirings BL, and each of the wirings GBL is connected to the main amplifier 30. In this case, the main amplifier 30 needs to amplify all the signals supplied to the wirings GBL whose number is the same as that of the wirings BL, and the power consumption for driving the main amplifier 30 and the wirings GBL is increased. Furthermore, when a distance between the wirings GBL is shortened, the parasitic capacitance generated between the wirings GBL is increased. In order to prevent that, the wirings GBL need to be supplied with signals in consideration of attenuation or delay of signals due to the parasitic capacitance; for example, the amplification factor in the sense amplifier circuit 60 is increased. As a result, power consumption for reading and writing data is increased.

In contrast, in one embodiment of the present invention, the wiring GBL is shared by the plurality of wirings BL; the sense amplifier circuit 60 has a function of selecting the predetermined wirings BL from the plurality of wiring BL and outputting the potentials of the selected wirings BL to the wirings GBL. For this reason, the number of the wirings GBL connected to the main amplifier 30 can be reduced, and thus the number of signals to be amplified in the main amplifier 30 can be reduced. As a result, the power consumption of the main amplifier 30 can be reduced. Furthermore, the number of the wirings GBL can be reduced and the distance between the wirings GBL can be lengthened; thus, the parasitic capacitance generated between the wirings GBL can be reduced and attenuation of signals supplied to the wirings GBL can be reduced. Consequently, a load on the sense amplifier circuit 60 and the main amplifier 30 due to the amplification of signals can be reduced, and thus the power consumption of the semiconductor device can be reduced.

By reducing the number of the wirings GBL for a reduction in parasitic capacitance, the signals of the wirings GBL can be directly output to the input/output circuit 40 without being amplified. In this case, the main amplifier 30 can be omitted, and thus the power consumption and the area of the semiconductor device can be reduced.

Note that the number of the wirings GBL is not particularly limited, and may be a given number smaller than the number of the wirings BL.

Note that here, the configuration in which data stored in the memory cell 51 is output to the outside from the input/output circuit 40 is shown; the operation of writing data to the memory cell 51 can be performed on the basis of the same principle. Specifically, writing data that is input from the outside is output to the main amplifier 30 from the input/output circuit 40, and potentials amplified by the main amplifier 30 are input to the sense amplifier circuit 60. Then, potentials amplified by the sense amplifier circuit 60 are supplied to the wirings BL as writing potentials. Note that the timing of outputting the wiring potentials to the wirings BL can be controlled by the sense amplifier circuit 60. Therefore, the above effect can also be obtained in data writing.

The wirings WL are connected to a driver circuit 70. The driver circuit 70 has a function of supplying a signal for selecting the memory cells 51 in which data is written (hereinafter, the signal is also referred to as a write word signal) to the wiring WL. Note that the driver circuit 70 can be formed using a decoder or the like.

The sense amplifiers 61 are connected to the memory cells 51 through the wirings BL. Here, two wirings BL (a wiring BLa and a wiring BLb) are connected to the same sense amplifier 61. The sense amplifier 61 includes an amplifier circuit 62 and a switch circuit 63.

The amplifier circuit 62 has a function of amplifying the potential of the wiring BL. Specifically, the amplifier circuit 62 has a function of amplifying a difference between the potential of the wiring BL and a reference potential and holding the amplified potential difference. For example, in the case where the potential of the wiring BLa is amplified, a difference between the potential of the wiring BLa and the potential of the wiring BLb (i.e., a reference potential) is amplified. In the case where the potential of the wiring BLb is amplified, a difference between the potential of the wiring BLa (i.e., a reference potential) and the potential of the wiring BLb is amplified.

The switch circuit 63 has a function of determining whether the amplified potential of the wiring BL is output to the wiring GBL. Specifically, the switch circuit 63 has a function of controlling electrical connection between the wiring BLa and the wiring GBLa and electrical connection between the wiring BLb and the wiring GBLb.

The switch circuit 63 is connected to one of a plurality of wirings CSEL, and the operation of the switch circuit 63 is controlled on the basis of a signal supplied to the wiring CSEL from the driver circuit 70. Specifically, electrical connection between the wiring BLa and the wiring GBLa and electrical connection between the wiring BLb and the wiring GBLb are controlled. Accordingly, the wiring BL through which a potential is supplied to the wiring GBL can be selected from among the plurality of wirings BL, and the wiring GBL can be shared. As a result, the number of the wirings GBL can be reduced.

Here, in one embodiment of the present invention, with the use of the switch circuits 63 and the wirings CSEL, signals to be output from the input/output circuit 40 to the outside can be selected from among signals output from the wirings BL. Therefore, the input/output circuit 40 does not need to select some of the plurality of signals with the use of a multiplexer or the like. Accordingly, the configuration of the input/output circuit 40 can be simplified, and the area thereof can be reduced.

In the above configuration, the switch circuits 63 and the wirings CSEL are preferably positioned so as to overlap with the cell array 50 as illustrated in FIG. 4. Specifically, the switch circuits 63 and the wirings CSEL are preferably positioned so as to overlap with the memory cells 51. Accordingly, an increase in the area of the memory circuit 20 can be reduced, and the sense amplifier circuit 60 can have a function of selecting an output signal.

Note the here, the wirings WL and the wirings CSEL are connected to the driver circuit 70; however, the wirings WL and the wirings CSEL may be connected to different driver circuits. In this case, the potentials of the wirings WL and the wirings CSEL are controlled by different driver circuits.

Next, examples of positions of the sense amplifiers 61 and the wirings CSEL in the sense amplifier circuit 60 will be described.

Figure 5A:
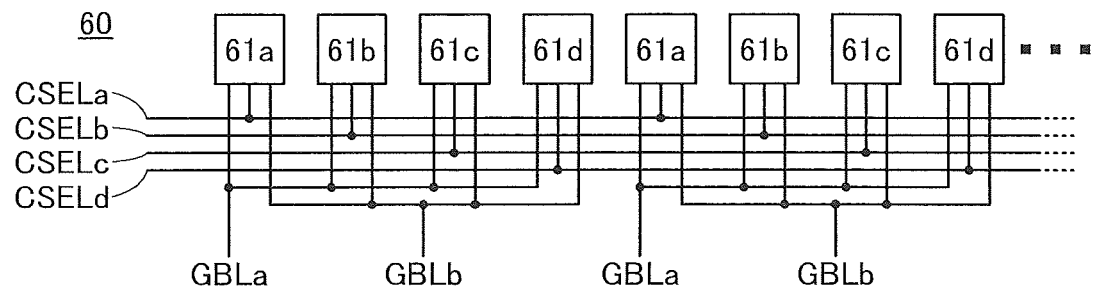
FIGS. 5A to 5D are block diagrams each illustrating a semiconductor device of one embodiment of the present invention.

In the example of FIG. 5A, four sense amplifiers 61 (sense amplifiers 61a to 61d) are arranged in one line periodically and each of the sense amplifiers 61 is connected to one of four wirings CSEL (wirings CSELa to CSELd). Specifically, the sense amplifier 61a is connected to the wiring CSELa, the sense amplifier 61b is connected to the wiring CSELb, the sense amplifier 61c is connected to the wiring CSELc, and the sense amplifier 61d is connected to the wiring CSELd. Each of the sense amplifiers 61 is connected to the wiring GBLa and the wiring GBLb.

Figure 5B:
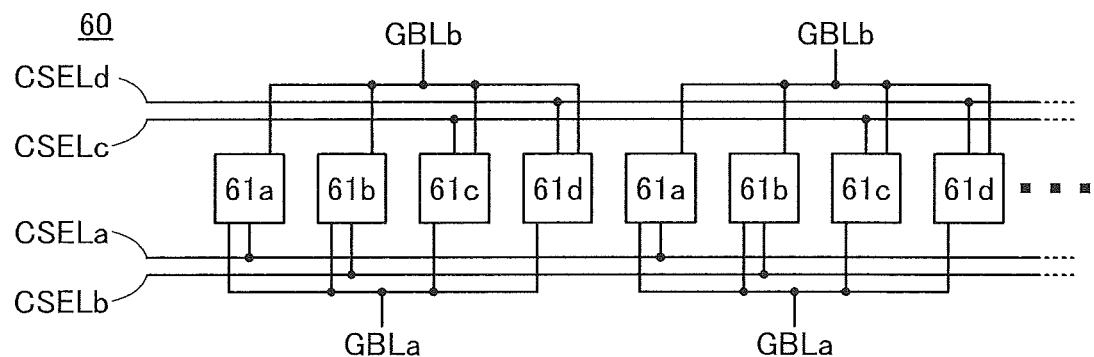

Some of the wirings CSEL may be provided on the both sides of the sense amplifiers 61. For example, as illustrated in FIG. 5B, between the wirings CSELa and CSELb and the wirings CSELc and CSELd, the sense amplifiers 61 can be provided.

Figure 5C:
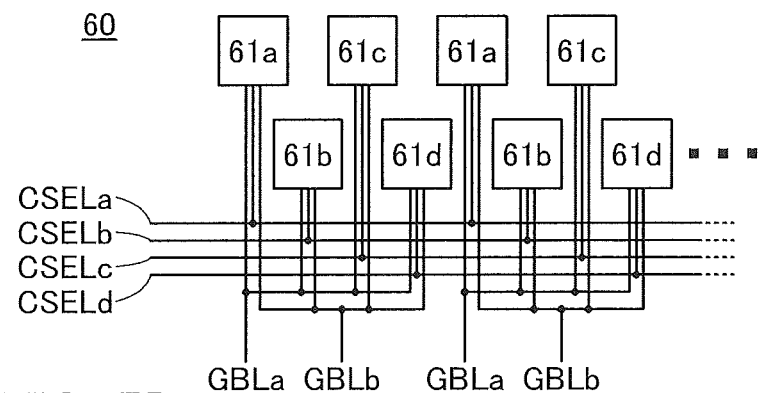

Alternatively, as illustrated in FIG. 5C, the sense amplifiers 61 may be arranged in a zigzag line. In this case, part of the sense amplifier 61 may be arranged so as to overlap with part of the adjacent sense amplifier 61. For example, the sense amplifier 61b is arranged so as to overlap with part of the sense amplifier 61a and part of the sense amplifier 61c. Accordingly, the length of the sense amplifier circuit 60 in the width direction (the horizontal direction in the drawing) can be shorter than those in FIGS. 5A and 5B.

Figure 5D:
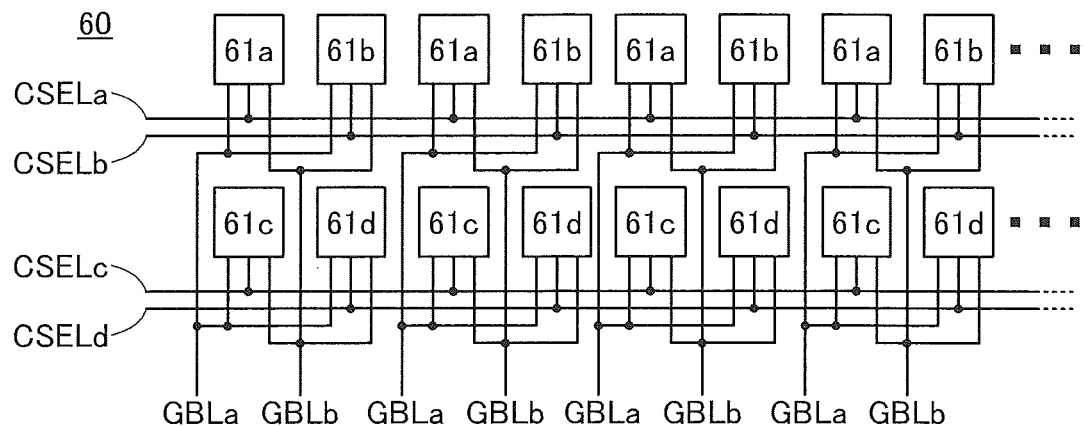

The sense amplifiers 61 may be provided in a plurality of lines. For example, as illustrated in FIG. 5D, the sense amplifiers 61 can be provided in two lines. Here, the sense amplifiers 61a to 61d provided in two rows and two columns are arranged periodically.

<Configuration Example of Sense Amplifier>

Next, a specific configuration example of the sense amplifier 61 of one embodiment of the present invention will be described.

Figure 6:
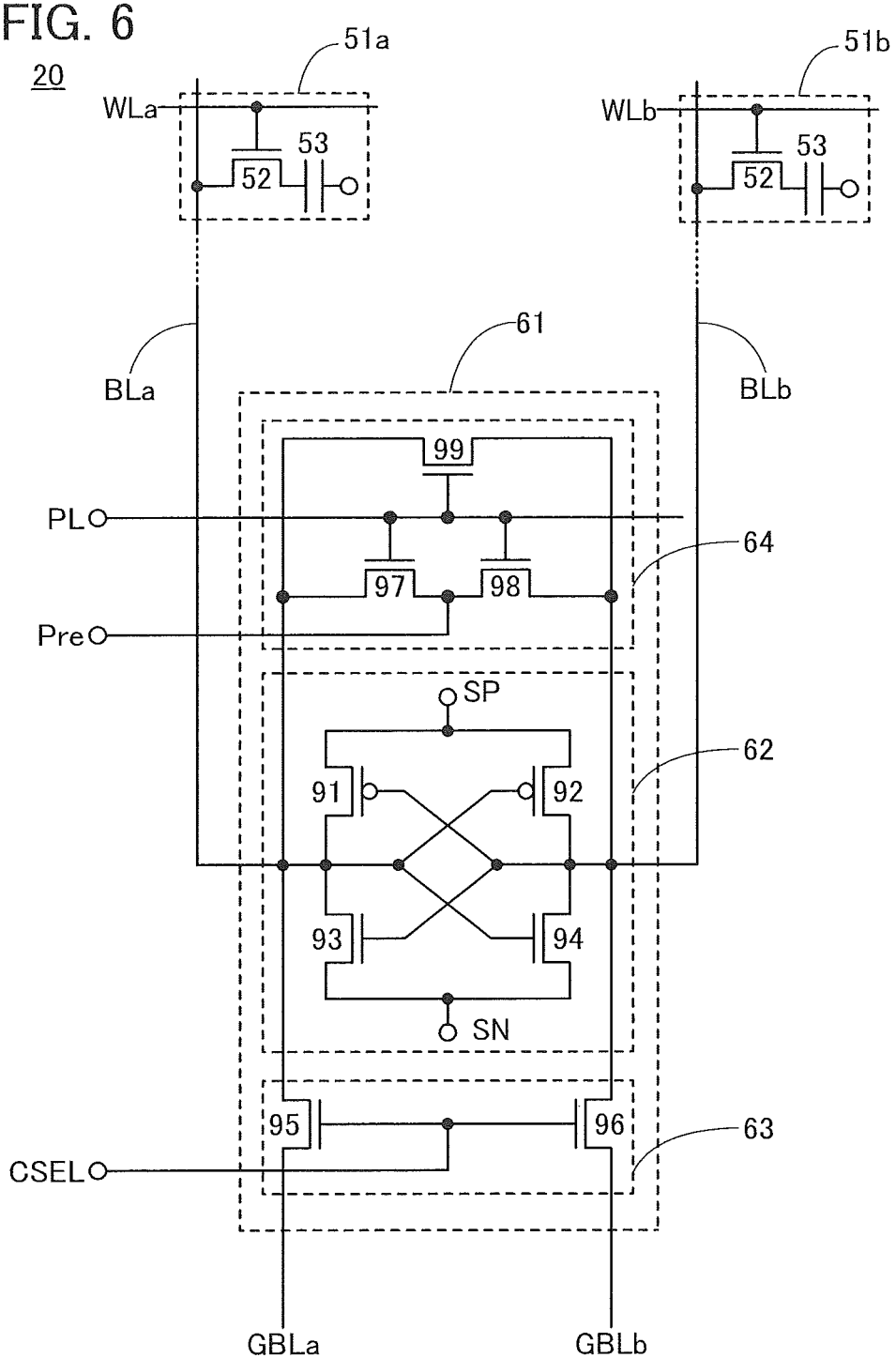
FIG. 6 is a circuit diagram illustrating a semiconductor device of one embodiment of the present invention.

FIG. 6 illustrates an example of a circuit configuration of the memory cells 51 and the sense amplifier 61 electrically connected to the memory cells 51. The memory cells 51 are connected to the sense amplifier 61 through the wirings BL. In the example shown here, the memory cell 51a is connected to the sense amplifier 61 through the wiring BLa, and the memory cell 51b is connected to the sense amplifier 61 through the wiring BLb.

In the example of FIG. 6, one memory cell 51 is connected to one wiring BL; however, a plurality of memory cells 51 may be connected to one wiring BL.

In the memory cell 51, the transistor 52 may be provided with a back gate.

The sense amplifier 61 includes the amplifier circuit 62, the switch circuit 63, and a precharge circuit 64.

The amplifier circuit 62 includes p-channel transistors 91 and 92 and n-channel transistors 93 and 94. One of a source and a drain of the transistor 91 is connected to a wiring SP, and the other thereof is connected to a gate of the transistor 92, a gate of the transistor 94, and the wiring BLa. One of a source and a drain of the transistor 93 is connected to the gate of the transistor 92, the gate of the transistor 94, and the wiring BLa, and the other thereof is connected to a wiring SN. One of a source and a drain of the transistor 92 is connected to the wiring SP, and the other thereof is connected to a gate of the transistor 91, a gate of the transistor 93, and the wiring BLb. One of a source and a drain of the transistor 94 is connected to the gate of the transistor 91, the gate of the transistor 93, and the wiring BLb, and the other thereof is connected to the wiring SN. The amplifier circuit 62 has a function of amplifying the potential of the wiring BLa and the potential of the wiring BLb. In FIG. 6, the sense amplifier 61 including the amplifier circuit 62 functions as a latch sense amplifier.

The switch circuit 63 includes n-channel transistors 95 and 96. The transistors 95 and 96 may be p-channel transistors. One of a source and a drain of the transistor 95 is connected to the wiring BLa, and the other thereof is connected to the wiring GBLa. One of a source and a drain of the transistor 96 is connected to the wiring BLb, and the other thereof is connected to the wiring GBLb. Gates of the transistor 95 and the transistor 96 are connected to the wiring CSEL. The switch circuit 63 has a function of controlling electrical connection between the wiring BLa and the wiring GBLa and electrical connection between the wiring BLb and the wiring GBLb on the basis of a potential supplied to the wiring CSEL.

The precharge circuit 64 includes n-channel transistors 97, 98, and 99. The transistors 97, 98, and 99 may be p-channel transistors. One of a source and a drain of the transistor 97 is connected to the wiring BLa, and the other thereof is connected to a wiring Pre. One of a source and a drain of the transistor 98 is connected to the wiring BLb, and the other thereof is connected to the wiring Pre. One of a source and a drain of the transistor 99 is connected to the wiring BLa, and the other thereof is connected to the wiring BLb. A gate of the transistor 97, a gate of the transistor 98, and a gate of the transistor 99 are connected to a wiring PL. The precharge circuit 64 has a function of initializing the potentials of the wiring BLa and the wiring BLb.

The amplifier circuit 62, the switch circuit 63, and the precharge circuit 64 are preferably positioned so as to overlap with the memory cells 51.

<Operation Example of Sense Amplifier>

Next, operation examples of the memory cells 51 and the sense amplifier 61 illustrated in FIG. 6 in data reading will be described with reference to a timing chart of FIG. 7.

First, in a period T1, the transistors 97 to 99 included in the precharge circuit 64 are turned on, so that the potentials of the wirings BLa and BLb are initialized. Specifically, a high-level potential VH_PL is supplied to the wiring PL, whereby the transistors 97 to 99 in the precharge circuit 64 are turned on. Accordingly, a potential Vpre of the wiring Pre is supplied to the wirings BLa and BLb. Note that the potential Vpre can be, for example, (VH_SP+VL_SN)/2.

Note that in the period T1, a low-level potential VL_CSEL is supplied to the wiring CSEL, and accordingly, the transistors 95 and 96 in the switch circuit 63 are off. A low-level potential VL_WL is supplied to the wiring WLa, and accordingly, the transistor 52 in the memory cell 51a is off. The low-level potential VL_WL is also supplied to the wiring WLb, and accordingly, the transistor 52 in the memory cell 51b is off (not shown in FIG. 7). The potential Vpre is supplied to the wirings SP and SN, and accordingly, the amplifier circuit 62 is off.

Then, a low-level potential VL_PL is supplied to the wiring PL to turn off the transistors 97 to 99 in the precharge circuit 64. In a period T2, the wiring WLa is selected. Specifically, in FIG. 7, a high-level potential VH_WL is supplied to the wiring WLa to select the wiring WLa and turn on the transistor 52 in the memory cell 51a. The wiring BLa and the capacitor 53 are thus electrically connected to each other through the transistor 52. Since the wiring BLa and the capacitor 53 are electrically connected to each other, the potential of the wiring BLa changes according to the amount of charge held in the capacitor 53.

Figure 7:
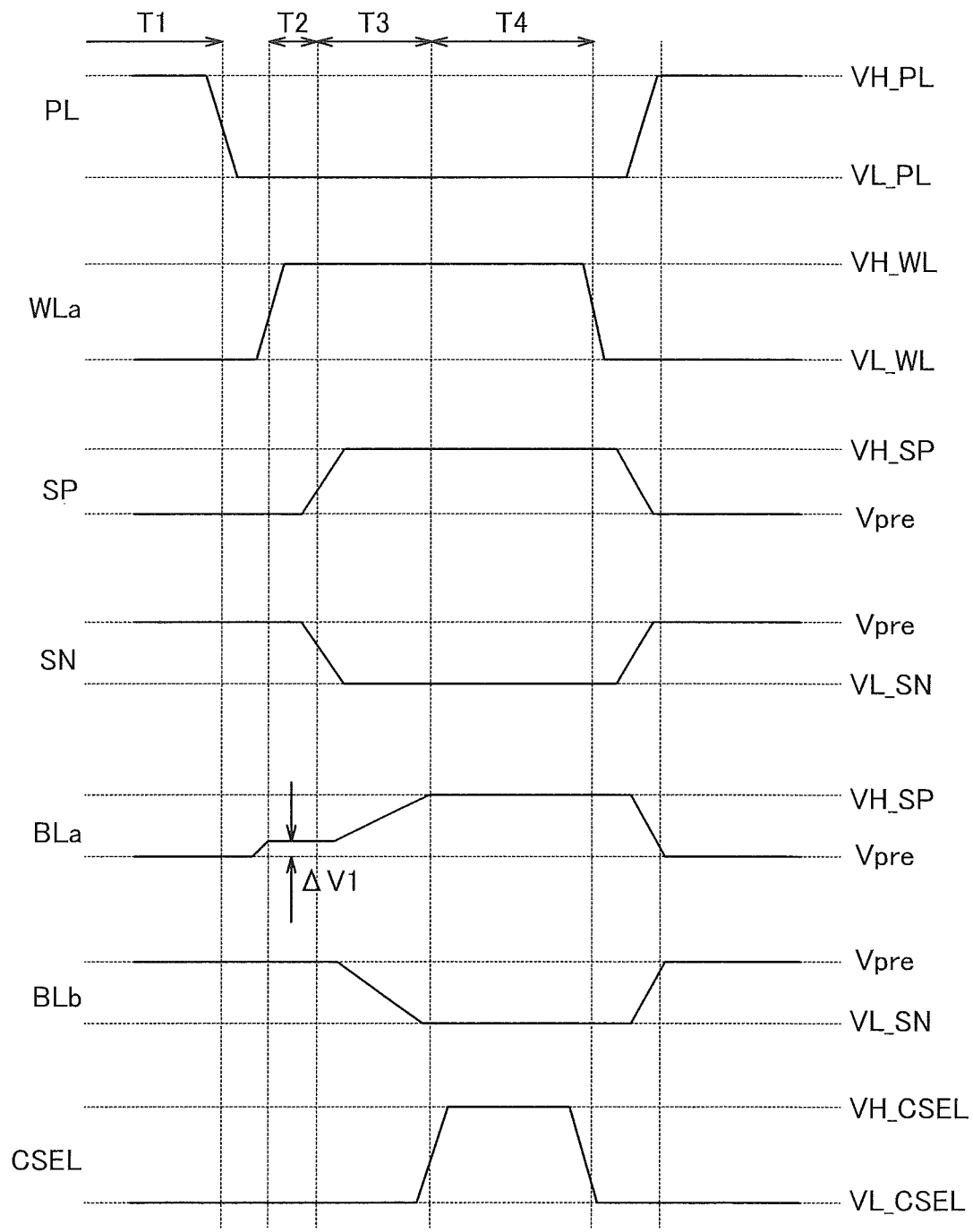
FIG. 7 is a timing chart illustrating a semiconductor device of one embodiment of the present invention.

The timing chart in FIG. 7 shows, as an example, the case where the amount of charge accumulated in the capacitor 53 is large. Specifically, in the case where the amount of charge accumulated in the capacitor 53 is large, charge is released from the capacitor 53 to the wiring BLa, so that the potential of the wiring BLa rises from the potential Vpre by ΔV1. In the case where the amount of charge accumulated in the capacitor 53 is small, charge flows from the wiring BLa into the capacitor 53, so that the potential of the wiring BLa falls by ΔV2.

Note that in the period T2, the low-level potential VL_CSEL is kept supplied to the wiring CSEL, and thus the transistors 95 and 96 in the switch circuit 63 remain off. The potential Vpre is kept supplied to the wirings SP and SN, and thus the amplifier circuit 62 remains off.

In a period T3, the high-level potential VH_SP is supplied to the wiring SP and the low-level potential VL_SN is supplied to the wiring SN, whereby the amplifier circuit 62 is turned on. The amplifier circuit 62 has a function of amplifying the potential difference between the wirings BLa and BLb (ΔV1 in FIG. 7). Accordingly, in the timing chart in FIG. 7, the amplifier circuit 62 is turned on, whereby the potential of the wiring BLa rises from the potential Vpre+ΔV1 to approach the potential VH_SP of the wiring SP. The potential of the wiring BLb falls from the potential Vpre to approach the potential VL_SN of the wiring SN.

Note that in the case where the potential of the wiring BLa is Vpre-ΔV2 at the beginning of the period T3, the amplifier circuit 62 is turned on, whereby the potential of the wiring BLa falls from the potential Vpre-ΔV2 to approach the potential VL_SN of the wiring SN. The potential of the wiring BLb rises from the potential Vpre to approach the potential VH_SP of the wiring SP.

In the period T3, the low-level potential VL_PL is kept supplied to the wiring PL to keep the transistors 97 to 99 in the precharge circuit 64 off. The low-level potential VL_CSEL is kept supplied to the wiring CSEL, thereby keeping the transistors 95 and 96 in the switch circuit 63 off. The high-level potential VH_WL is kept supplied to the wiring WLa; thus, the transistor 52 in the memory cell 51a remains on. Consequently, charge corresponding to the potential VH_SP of the wiring BLa is accumulated in the capacitor 53 in the memory cell 51a.

Next, in a period T4, the potential supplied to the wiring CSEL is changed to turn on the switch circuit 63. Specifically, in FIG. 7, a high-level potential VH_CSEL is supplied to the wiring CSEL, so that the transistors 95 and 96 in the switch circuit 63 are turned on. Accordingly, the potential of the wiring BLa is supplied to the wiring GBLa, and the potential of the wiring BLb is supplied to the wiring GBLb.

In the period T4, the low-level potential VL_PL is still supplied to the wiring PL, so that the transistors 97 to 99 in the precharge circuit 64 remain off. The high-level potential VH_WL is kept supplied to the wiring WLa; thus, the transistor 52 in the memory cell 51a remains on. The high-level potential VH_SP is kept supplied to the wiring SP and the low-level potential VL_SN is kept supplied to the wiring SN; thus, the amplifier circuit 62 remains on. As a result, charge corresponding to the potential VH_SP of the wiring BLa is accumulated in the capacitor 53 in the memory cell 51a.

When the period T4 is over, the potential supplied to the wiring CSEL is changed to turn off the switch circuit 63. Specifically, in FIG. 7, the low-level potential VL_CSEL is supplied to the wiring CSEL, so that the transistors 95 and 96 in the switch circuit 63 are turned off.

Furthermore, when the period T4 is over, the wiring WLa is deselected. Specifically, in FIG. 7, the low-level potential VL_WL is supplied to the wiring WLa, whereby the wiring WLa is deselected to turn off the transistor 52 in the memory cell 51a. Through the operation, charge corresponding to the potential VH_SP of the wiring BLa is held in the capacitor 53; thus, data is held in the memory cell 51a even after the data is read out.

Through the operation in the periods T1 to T4, data is read from the memory cell 51a. Data in the memory cell 51b can be read similarly.

Note that data can be written to the memory cell 51 on the basis of the above principle. Specifically, as in the case where data is read, first, the transistors 97 to 99 in the precharge circuit 64 are temporarily turned on to initialize the potentials of the wirings BLa and BLb. Then, the wiring WLa connected to the memory cell 51a to which data is to be written or the wiring WLb connected to the memory cell 51b to which data is to be written is selected to turn on the transistor 52 in the memory cell 51a or 51b. The wiring BLa or BLb and the capacitor 53 are thus electrically connected to each other through the transistor 52. Then, the high-level potential VH_SP is supplied to the wiring SP and the low-level potential VL_SN is supplied to the wiring SN to turn on the amplifier circuit 62. The potential supplied to the wiring CSEL is then changed to turn on the switch circuit 63. Specifically, the high-level potential VH_CSEL is supplied to the wiring CSEL, so that the transistors 95 and 96 in the switch circuit 63 are turned on. Consequently, the wirings BLa and GBLa are electrically connected to each other and the wirings BLb and GBLb are electrically connected to each other. Writing potentials are supplied to the wirings GBLa and GBLb, whereby the writing potentials are supplied to the wirings BLa and BLb through the switch circuit

63. Consequently, charge is accumulated in the capacitor 53 according to the potential of the wiring BLa or BLb and thus data is written to the memory cell 51*a* or 51*b*.

Note that after the potential of the wiring GBLa is supplied to the wiring BLa and the potential of the wiring GBLb is supplied to the wiring BLb, the relation in level between the potential of the wiring BLa and the potential of the wiring BLb is maintained by the amplifier circuit 62 as long as the sense amplifier 61 is on even after the transistors 95 and 96 in the switch circuit 63 are turned off. Therefore, the timing of turning off the transistors 95 and 96 in the switch circuit 63 may be either before or after the wiring WLa is selected.

As described above, in one embodiment of the present invention, the wiring GBL is shared by the plurality of wirings BL; the sense amplifier circuit 60 has a function of selecting the predetermined wirings BL of the plurality of wirings BL and outputting the potentials of the selected wirings BL to the wirings GBL. Therefore, the number of the wirings GBL can be reduced, the distance between the wirings GBL can be lengthened, and the parasitic capacitance generated between the wirings GBL can be reduced. As a result, the power consumption of the semiconductor device in this embodiment can be reduced.

Furthermore, in one embodiment of the present invention, parasitic capacitance is reduced as a result of a reduction in the number of the wirings GBL, and thus the main amplifier 30 can be omitted. Accordingly, the power consumption and the area of the semiconductor device in this embodiment can be reduced.

In one embodiment of the present invention, the sense amplifier circuit 60 can select signals to be output from the input/output circuit 40 to the outside from among the signals output from the wirings BL. Therefore, the input/output circuit 40 does not need to select some of the plurality of signals. Accordingly, the configuration of the input/output circuit 40 can be simplified, and the area thereof can be reduced.

<Configuration Example of Memory Device>

Figure 8:
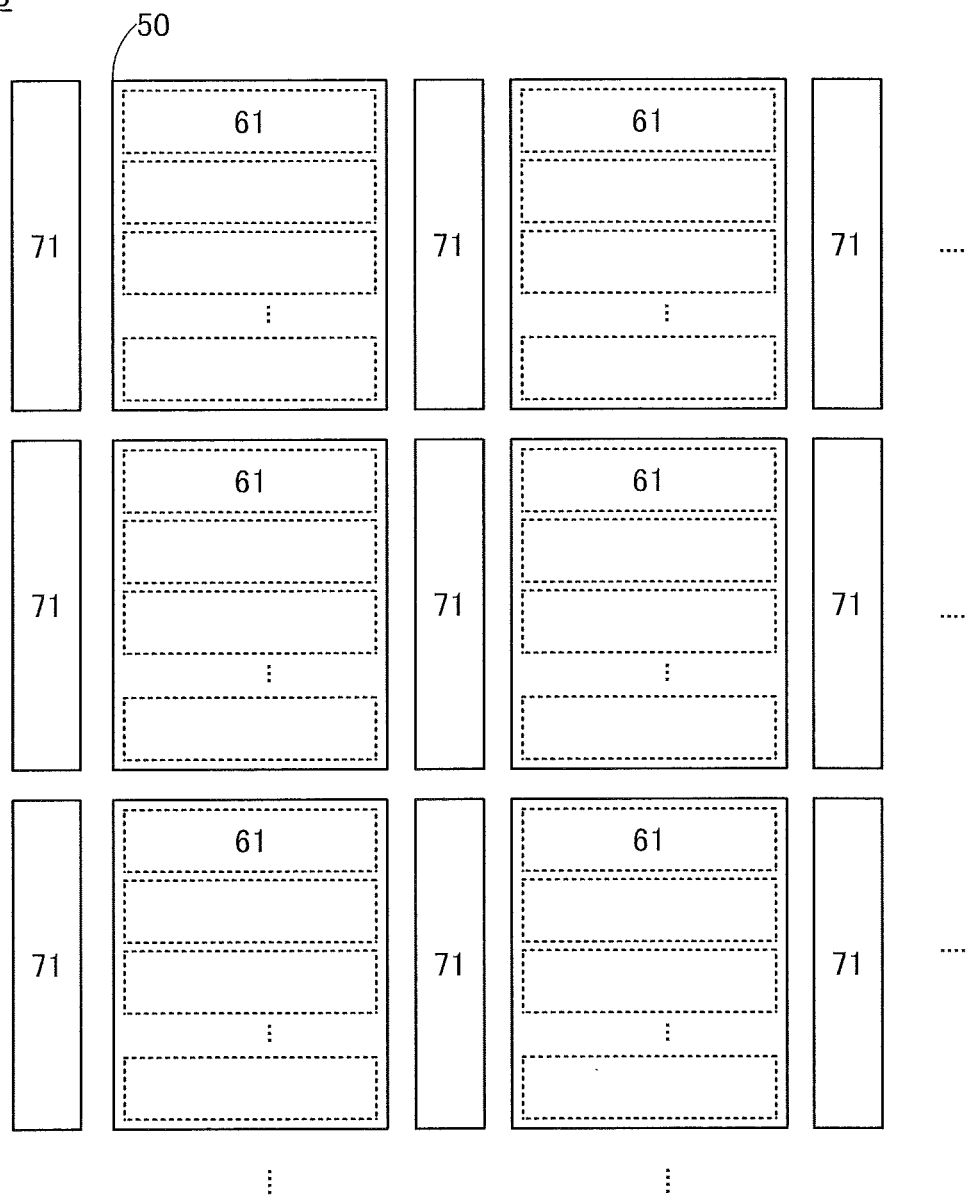
FIG. 8 is a block diagram illustrating a semiconductor device of one embodiment of the present invention.

FIG. 8 illustrates a structure example of an array 75. The array 75 includes the cell arrays 50 each including the memory cells 51 (not illustrated), the sense amplifiers 61, and row decoders 71 for controlling the potentials of the wirings WL.

In the array 75 illustrated in FIG. 8, the plurality of sense amplifiers 61 positioned in a first layer overlap with the cell array 50 positioned in a second layer. The number of the memory cells 51 in the cell array 50 and the number of the sense amplifiers 61 overlapping with the cell array 50 can be determined by a designer as appropriate.

The row decoder 71 is positioned in the first layer or the second layer. The row decoder 71 has a function of controlling the potentials of the wirings WL connected to the memory cells 51 in the cell array 50 which is adjacent to the row decoder 71.

Figure 9:
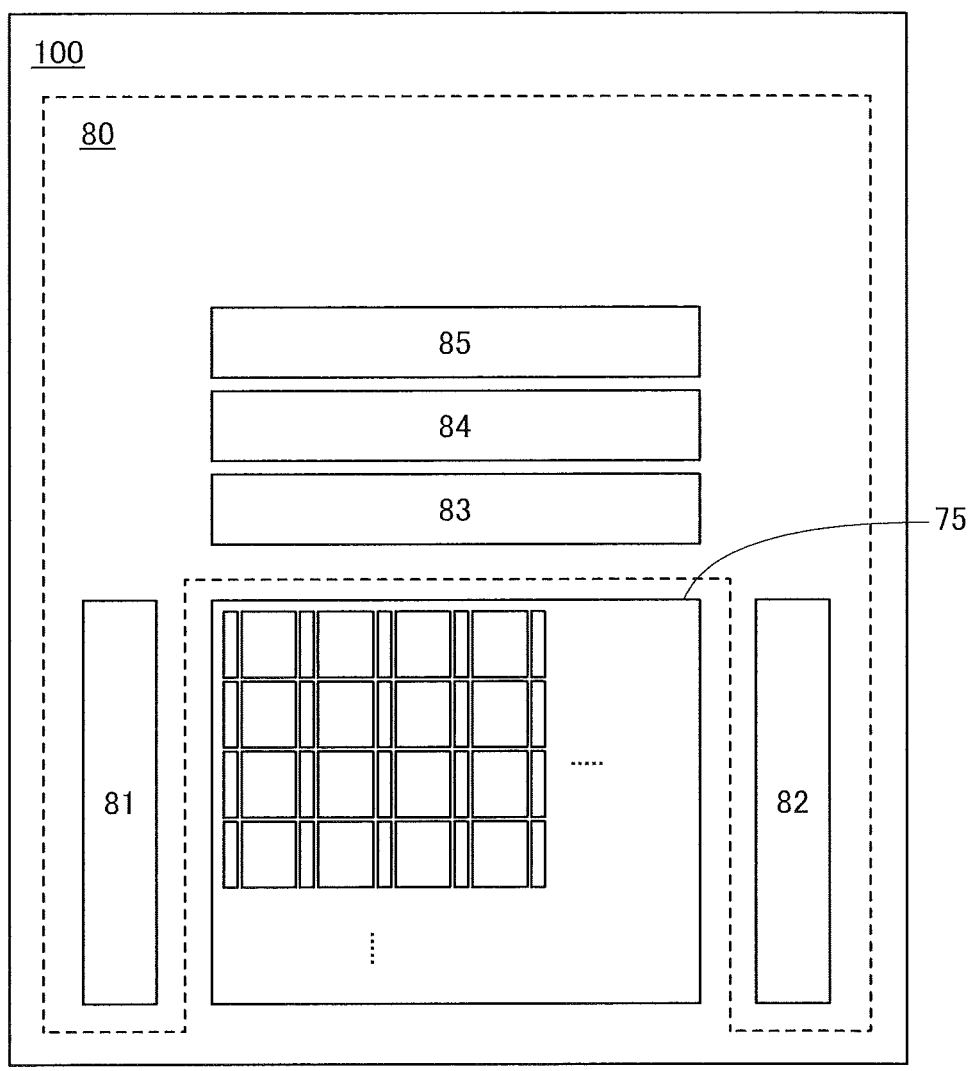
FIG. 9 is a block diagram illustrating a semiconductor device of one embodiment of the present invention.

FIG. 9 illustrates a configuration example of the memory device 100 including the array 75 illustrated in FIG. 8 and a driver circuit 80 which controls the operation of the array 75.

In the memory device 100 illustrated in FIG. 9, the driver circuit 80 includes a row decoder 81, a column decoder 82, a main amplifier 83, a writing circuit 84, and a buffer 85.

The row decoder 81 has a function of selecting some of the plurality of row decoder 71 included in the array 75 in FIG. 8 on the basis of a specified address. The wirings WL (not illustrated) are selected by the row decoders 71 that are selected by the row decoder 81.

The column decoder 82 has a function of selecting the memory cells 51 in the column direction at the time of data writing or reading on the basis of a specified address. Specifically, the column decoder 82 has a function of controlling the potential of the wiring CSEL in the memory circuit 20 illustrated in FIG. 6.

The main amplifier 83 has a function of amplifying the potentials of the wirings GBL for data reading. Note that the main amplifier 83 corresponds to the main amplifier 30 in FIG. 4.

The writing circuit 84 has a function of writing data to the memory cell 51 in the specified address. Specifically, in the memory circuit 20 illustrated in FIG. 6, the writing circuit 84 has a function of supplying a potential to the wiring GBL on the basis of data input from the outside.

The buffer 85 has a function of controlling input to the memory device 100 of signals used for driving the driver circuit 80 or the array 75 and data written to the array 75. In addition, the buffer 85 has a function of controlling output from the memory device 100 of data read out from the array 75.

The writing circuit 84 and the buffer 85 correspond to the input/output circuit 40 in FIG. 4.

Note that the memory device 100 may include an address buffer that can temporarily store the address of the specified memory cell 51.

MODIFICATION EXAMPLE

The structure of the semiconductor device in this embodiment is not limited to that above structure. A semiconductor device having a structure different from the above structure is described below.

FIGS. 10A to 10C show an example of the semiconductor device having a structure different from that of the semiconductor device in FIGS. 1A to 1D. FIG. 10A is a top view of some components (the conductor 146*a*, the conductor 146*b*, the semiconductor 106*ba*, the semiconductor 106*bb*, the conductor 114*a*, and the conductor 114*b*) of the semiconductor device, which corresponds to that in FIG. 1A. FIG. 10B is, like FIG. 1B, a cross-sectional view taken along dashed-dotted line A1-A2 in FIG. 10A. FIG. 10C is, like FIG. 1C, a cross-sectional view taken along dashed-dotted line A3-A4 in FIG. 10A.

The semiconductor device in FIGS. 10A to 10C is different from the semiconductor device in FIGS. 1A to 1C in that a conductor 156 serving as the wiring BL is provided under the capacitor 53*aa* and the capacitor 53*ab*.

Accordingly, an insulator 157 having an opening and the conductor 156 formed in the opening are provided over the insulator 130. An insulator 155 is provided over the insulator 157. A conductor 154 is provided in an opening which is formed in the insulator 155, the insulator 132, the insulator 136, the insulator 140, and the insulator 148 and reaches the conductor 156. A conductor 152 is provided in an opening which is formed in the insulator 149 and reaches the conductor 154. A conductor 150 is provided in an opening which is formed in the insulator 101, the insulator 107, the insulator 105, the insulator 103, the insulator 104, and the insulator 117 and reaches the conductor 152.

In the semiconductor device in FIGS. 10A to 10C, a conductor 108*ba* and a conductor 108*bb* corresponding to the conductor 108*b* in FIGS. 1A to 1C, a semiconductor 106*ba* and a semiconductor 106*bb* corresponding to the semiconductor 106*b*, and an insulator 106*aa* and an insulator 106*ab* corresponding to the insulator 106*a* are provided. The conductor 150 is positioned between the conductor 108*ba*, the semiconductor 106*ba*, and the insulator 106*aa* and the conductor 108*bb*, the semiconductor 106*bb*, and the insulator 106*ab*. The conductor 150 is in contact with an end portion of a side surface of the conductor 108*ba* and an end portion of a side surface of the conductor 108*bb*. In addition, the conductor 150 may be in contact with part of the top surface of the conductor 108*ba* and part of the top surface of the conductor 108*bb*. Moreover, the conductor 150 may be in contact with an end portion of a side surface of the semiconductor 106*ba* or an end portion of a side surface of the semiconductor 106*bb*.

Here, as the conductors 150, 152, 154, and 156, the conductor or the like that can be used as the conductors 108*a* and 108*b* may be used. As the insulators 155 and 157, the insulator or the like that can be used as the insulator 136 may be used.

For the other structures of the semiconductor device in FIGS. 10A to 10C, the structures of the semiconductor device in FIGS. 1A to 1C can be referred to.

In this manner, the conductor 156 serving as the wiring BL is provided under the capacitors 53*aa* and 53*ab*, whereby the conductor 114*a* serving as the wiring WL of the memory cell 51*aa* and the conductor 156 serving as the wiring BL are sufficiently apart from each other. Similarly, the conductor 114*b* serving as the wiring WL of the memory cell 51*ab* and the conductor 156 serving as the wiring BL are sufficiently apart from each other. Thus, the parasitic capacitance generated between the wiring BL and the wiring WL can be reduced. As a result, in the semiconductor device in FIGS. 10A to 10C, errors in data reading can be reduced and the operation speed can be increased.

Next, modification examples of the capacitors 53*aa* and 53*ab* are described with reference to FIGS. 11A to 11E. Although only the capacitor 53*aa* is illustrated in FIGS. 11A to 11D, the capacitor 53*ab* can also have a structure similar to that of the capacitor 53*aa*.

Figure 11A:
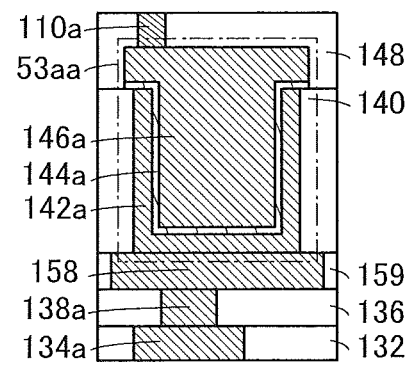
FIGS. 11A to 11E are cross-sectional views each illustrating a semiconductor device of one embodiment of the present invention.

As illustrated in FIG. 11A, in the capacitor 53*aa*, an insulator 159 having an opening may be formed over the insulator 136, and a conductor 158 may be provided in the opening. The bottom surface of the conductor 142*a* is in contact with the top surface of the conductor 158. Here, as the insulator 159, the insulator or the like that can be used as the insulator 136 is used. As the conductor 158, the conductor or the like that can be used as the conductor 134*a* is used.

Figure 11B:
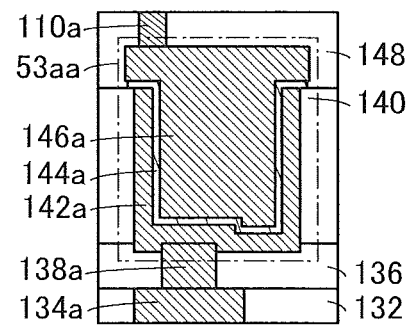

As illustrated in FIG. 11B, in the capacitor 53*aa*, part of the conductor 142*a* is formed in a depression formed in the insulator 136 in some cases. At that time, in the depression in the insulator 136, the top surface of the conductor 138*a* protrudes in some cases. Because of the protrusion of the top surface of the conductor 138*a*, the shapes of the conductor 142*a*, the insulator 144*a*, and the conductor 146*a* may reflect the shape of the conductor 138*a* as illustrated in FIG. 11B.

Figure 11C:
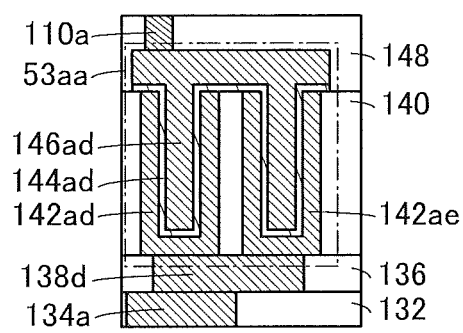

As illustrated in FIG. 11C, two openings are formed in the insulator 140, and a conductor 142*ad* and a conductor 142*ae* may be formed in the respective openings. An insulator 144*ad* and a conductor 146*ad* are formed along the two openings formed in the insulator 140. Here, the conductor 138*d* provided in the opening in the insulator 136 is in contact with the conductors 142*ad* and 142*ae*. Note that three or more openings may be provided in the insulator 140. In this manner, when a plurality of openings are provided in the insulator 140 and a capacitor is formed in the openings, the electrostatic capacitance of the capacitor 53*aa* can be increased without increasing the area of the capacitor 53*aa*.

Figure 11D:
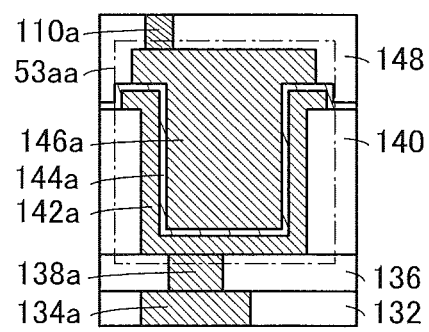

As illustrated in FIG. 11D, the conductor 142*a* may extend beyond the opening in the insulator 140. Here, the insulator 144*a* preferably covers the conductor 142*a*. With such a shape, leakage current can be prevented from flowing between the conductor 142*a* and the conductor 146*a*. In addition, the end portion of the side surface of the conductor 146*a* may be positioned inward or outward from an end portion of a side surface of the conductor 142*a*.

Figure 11E:
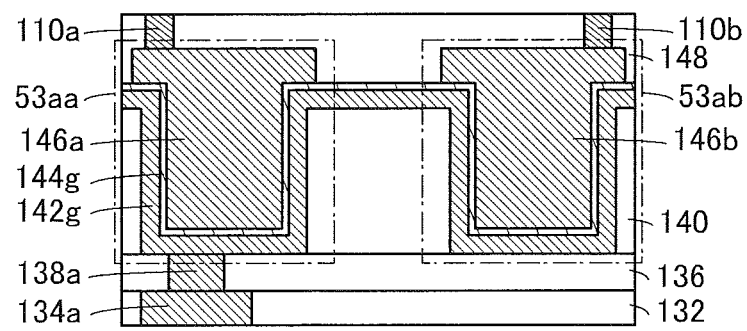

Furthermore, as illustrated in FIG. 11E, a conductor 142*g* and an insulator 144*g* which extend beyond the opening in the insulator 140 may be shared between the capacitor 53*aa* and the capacitor 53*ab*. At this time, there is at least one position where the conductor 142*g* is connected to the conductor 134*a* or the like to which a predetermined potential (such as a ground potential) is supplied. Alternatively, the conductor 142*g* may serve as a wiring to which a predetermined potential (such as a ground potential) is supplied. In this case, the insulator 132, the conductor 134*a*, the insulator 136, and the conductor 138*a* are not necessarily provided in some cases.

Next, modification examples of the conductor 110*a* are described with reference to FIGS. 12A and 12B. Although only the conductor 110*a* is illustrated in FIGS. 12A and 12B, the conductor 110*b* can also have a structure similar to that of the conductor 110*a*.

Figure 12A:
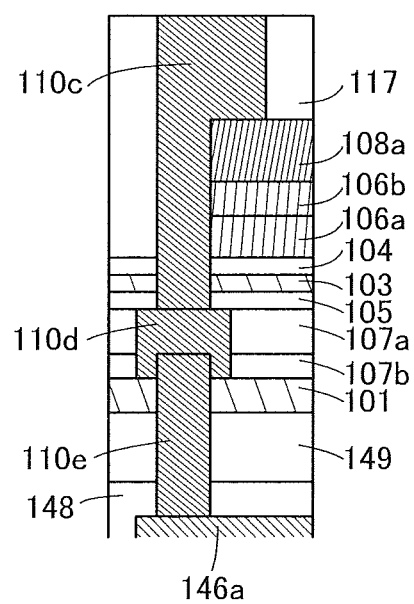
FIGS. 12A and 12B are cross-sectional views each illustrating a semiconductor device of one embodiment of the present invention.
Figure 12B:
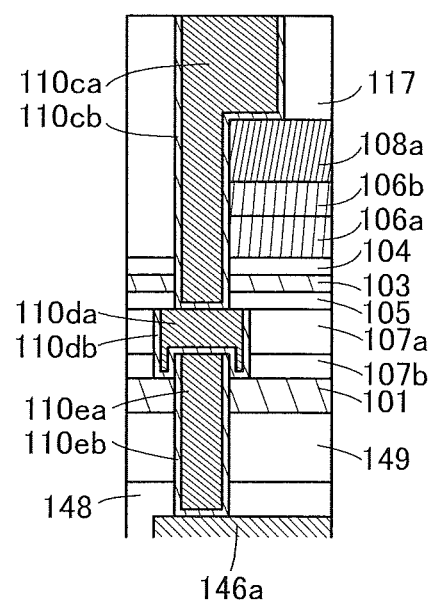

Although the conductor 108*a* and the conductor 146*a* are connected to each other through one conductor 110*a* in the semiconductor device in FIGS. 1A to 1C, the conductor 108*a* and the conductor 146*a* may be connected to each other through a conductor 110*c*, a conductor 110*d*, and a conductor 110*e* as illustrated in FIG. 12A. Note that the insulator 107 in FIG. 1B has a two-layer structure of an insulator 107*a* and an insulator 107*b* in FIG. 12A. Since the insulators 107*a* and 107*b* can be formed with the insulator that is used as the insulator 107, a boundary between the insulator 107*a* and the insulator 107*b* is not clear.

The conductor 110*c* is provided in an opening formed in the insulator 105, the insulator 103, the insulator 104, and the insulator 117. The conductor 110*c* is in contact with at least part of the conductor 110*d*, and is in contact with the end portion of the side surface of the conductor 108*a*. In addition, the conductor 110*c* may be in contact with part of the top surface of the conductor 108*a*. In addition, the conductor 110*c* may be in contact with the end portion of the side surface of the semiconductor 106*b*.

The conductor 110*d* is provided in an opening formed in the insulator 107*a* and the insulator 107*b* and is in contact with the conductor 110*e* in the opening.

The conductor 110*e* is provided in an opening formed in the insulator 148, the insulator 149, the insulator 101, and the insulator 107*b*. Here, the top surface of the conductor 110*e* is preferably substantially aligned with the top surface of the insulator 107*b*. In addition, as illustrated in FIG. 12A, the bottom surface of the conductor 110*d* is in contact with part of the top surface and the side surface of the conductor 110*e*, and the top surface of the conductor 110*d* is in contact with the bottom surface of the conductor 110*c*. It is particularly preferable that the top surface of the conductor 110*d* be larger than the bottom surface of the conductor 110*c*. With such a structure, the conductor 110*c* and the conductor 110*e* can be electrically connected to each other more surely.

As the conductors 110*c*, 110*d*, and 110*e*, the conductor that can be used as the conductor 110*a* is used.

Alternatively, as illustrated in FIG. 12B, the conductors 110*c*, 110*d*, and 110*e* may each have a two-layer structure. Alternatively, a stacked-layer structure of three or more layers may be employed.

Here, a conductor 110*cb* is formed in contact with a side surface and a bottom surface of a conductor 110*ca*. A conductor 110*db* is formed in contact with a side surface and a bottom surface of a conductor 110*da*. A conductor 110*eb* is formed in contact with a side surface and a bottom surface of a conductor 110*ea*.

As the conductors 110*ca*, 110*cb*, 110*da*, 110*db*, 110*ea*, and 110*eb*, the conductor that can be used as the conductor 110*a* is used. Moreover, the conductors 110*cb*, 110*db*, and 110*eb*, each of which is used as a lower layer, each preferably have high adhesion to an insulator which is in contact with each of the conductors, such as the insulator 149.

For the conductors 110*ca*, 110*da*, and 110*ea*, copper, tungsten, or the like is used, and for the conductors 110*cb*, 110*db*, and 110*eb*, tantalum, tantalum nitride, titanium nitride, or the like is used, for example. Particularly when copper is used for the conductors 110*ca*, 110*da*, and 110*ea*, tantalum, tantalum nitride, titanium nitride, or the like is used for the conductors 110*cb*, 110*db*, and 110*eb*; as a result, diffusion of copper to the outside of the conductors 110*cb*, 110*db*, and 110*eb* can be suppressed.

Furthermore, in the case where a metal nitride such as tantalum nitride or titanium nitride is used for the conductors 110*cb*, 110*db*, and 110*eb*, impurities such as hydrogen and water can be prevented from diffusing into the semiconductor 106*b* through the conductors 110*ca*, 110*cb*, 110*da*, 110*db*, 110*ea*, and 110*eb*. Thus, deterioration of characteristics of the transistors 52*aa* and 52*ab* is suppressed and stable characteristics can be obtained.

Next, modification examples of the transistor 52*aa* are described with reference to FIGS. 13A to 13D. FIGS. 13A to 13D are cross-sectional views of the transistors 52*aa* in the channel length direction and those in the channel width direction like FIGS. 1B and 1C. The transistor 52*ab* can have the same structure.

Figure 13A:
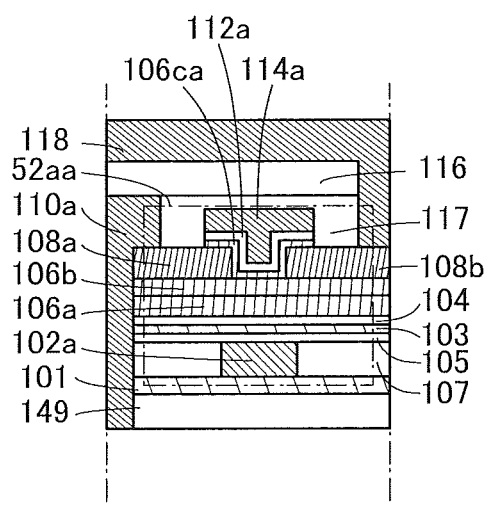
FIGS. 13A to 13D are cross-sectional views illustrating semiconductor devices of one embodiment of the present invention.
Figure 13B:
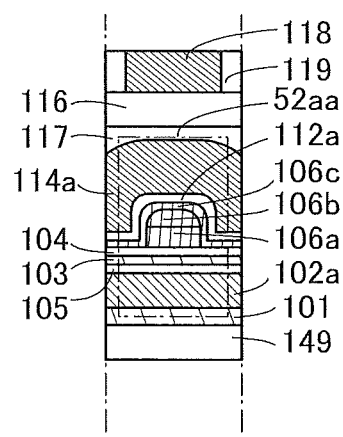

The transistor 52*aa* in FIGS. 13A and 13B is different from the transistor 52*aa* in FIGS. 1A to 1D in that the insulators 106*ca* and 112*a* are formed so as to cover part of the top surface of the conductor 108*a*, the top surface of the conductor 108*b*, and the like, and that the insulator 117 is formed to cover the insulator 112*a* and the conductor 114*a*. For the other structures of the transistor 52*aa* in FIGS. 13A and 13B, the structures of the transistor 52*aa* in FIGS. 1A to 1D can be referred to.

Note that the structure of the transistor 52*aa* is not limited to that illustrated in FIGS. 13A and 13B. For example, the insulator 106*ca* or the insulator 112*a* may be partly formed by patterning.

Figure 13C:
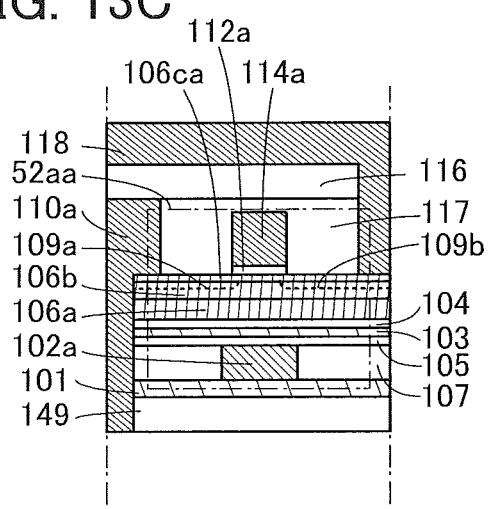
Figure 13D:
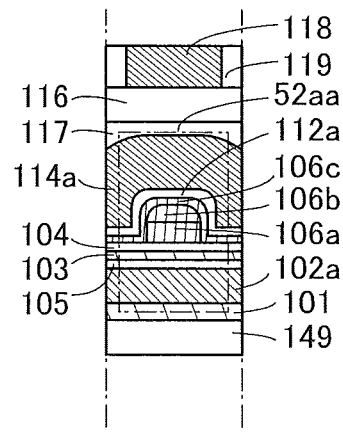

The transistor 52*aa* in FIGS. 13C and 13D is different from the transistor 52*aa* in FIGS. 1A to 1D in that the conductors 108*a* and 108*b* are not formed and that the conductors 110*a* and 118 are provided in contact with low-resistance regions 109*a* and 109*b* serving as a source region and a drain region. The transistor 52*aa* in FIGS. 13C and 13D is formed by a gate-first method by which the low-resistance regions 109*a* and 109*b* serving as a source region and a drain region are formed after the conductor 114*a* serving as a gate is formed in the process for fabricating the transistor. For the other structures of the transistor 52*aa* in FIGS. 13C and 13C, the structures of the transistor 52*aa* in FIGS. 1A to 1D can be referred to.

Preferable examples of the element that is added to the low-resistance regions 109*a* and 109*b* are boron, magnesium, aluminum, silicon, titanium, vanadium, chromium, nickel, zinc, gallium, germanium, yttrium, zirconium, niobium, molybdenum, indium, tin, lanthanum, cerium, neodymium, hafnium, tantalum, and tungsten. These elements relatively easily form oxides and the oxides can serve as a semiconductor or an insulator; therefore, these elements are suitable as an element that is added to the insulator 106*a*, the semiconductor 106*b*, or the insulator 106*ca*. For example, the concentration of the element in the low-resistance regions 109*a* and 109*b* is preferably higher than or equal to $1\times10^{14}/cm^2$ and lower than or equal to $2\times10^{16}/cm^2$. The concentration of the element in the low-resistance regions 109*a* and 109*b* in the insulator 106*ca* is higher than that in the region of the semiconductor 106*ca* other than the low-resistance regions 109*a* and 109*b* (for example, the region of the semiconductor 106*ca* overlapping with the conductor 114*a*).

Since the low-resistance regions 109*a* and 109*b* can become n-type by containing nitrogen, the concentration of nitrogen, which is measured by SIMS, in the low-resistance regions 109*a* and 109*b* is higher than that in a region of the semiconductor 106*b* other than the low-resistance regions 109*a* and 109*b* (for example, the region of the semiconductor 106*b* overlapping with the conductor 114*a*).

The formation of the low-resistance region 109*a* and the low-resistance region 109*b* leads to a reduction in contact resistance between the conductor 110*a* or 118 and the insulator 106*a*, the semiconductor 106*b*, or the insulator 106*ca*, whereby the transistor 52*aa* in FIGS. 13C and 13D can have a large on-state current.

Figure 14A:
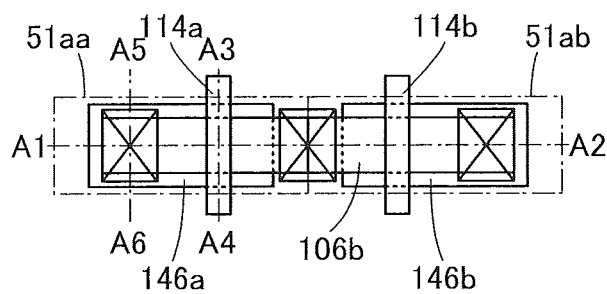
FIGS. 14A to 14D are a top view and cross-sectional views illustrating a semiconductor device of one embodiment of the present invention.
Figure 14D:
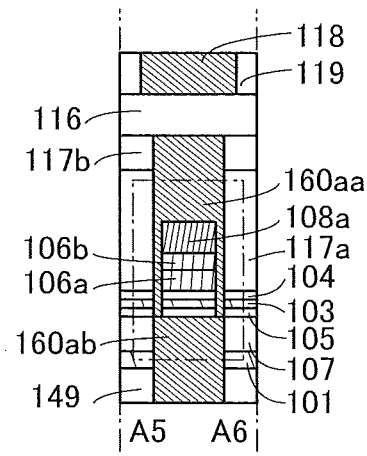
Figure 14B:
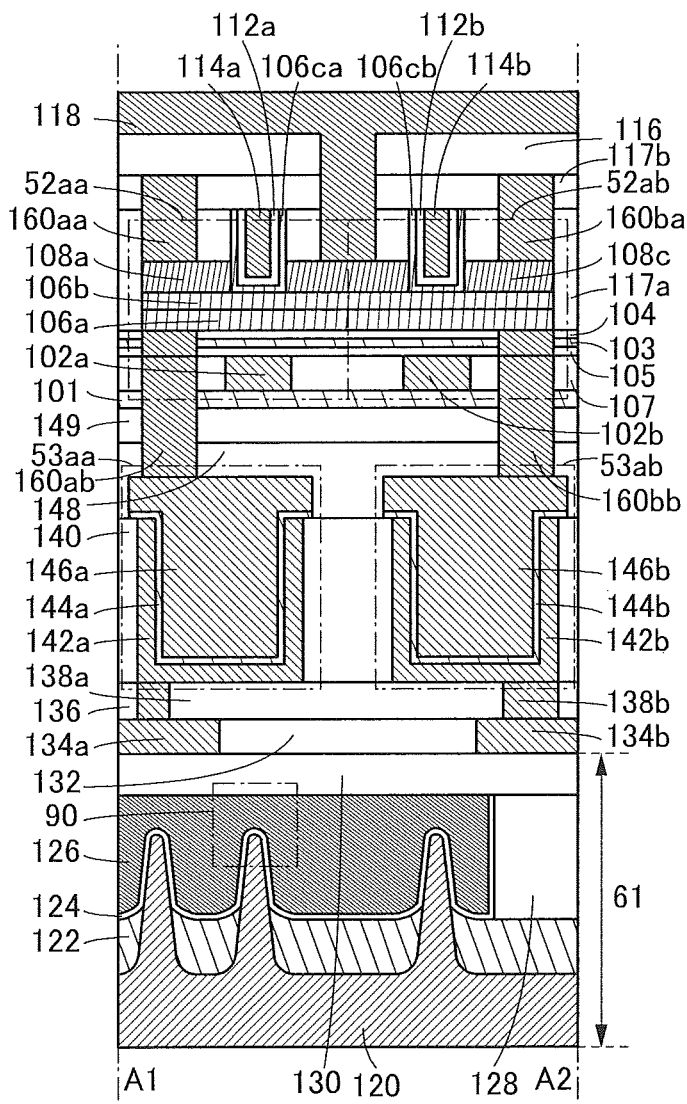
Figure 14C:
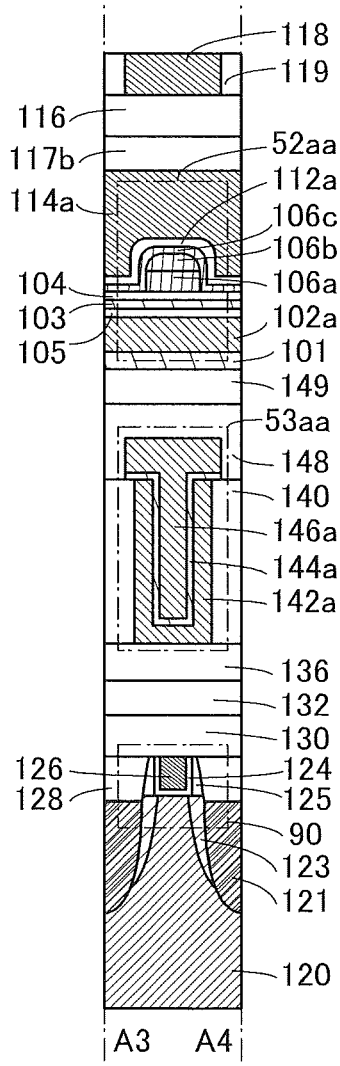

FIGS. 14A to 14D show an example of the semiconductor device having a structure different from that of the semiconductor device in FIGS. 1A to 1D. FIG. 14A is a top view of some components (the conductor 146*a*, the conductor 146*b*, the semiconductor 106*b*, the conductor 114*a*, and the conductor 114*b*) of the semiconductor device, which corresponds to that in FIG. 1A. FIG. 14B is, like FIG. 1B, a cross-sectional view taken along dashed-dotted line A1-A2 in FIG. 14A, and FIG. 14C is, like FIG. 1C, a cross-sectional view taken along dashed-dotted line A3-A4 in FIG. 14A. FIG. 14D is a cross-sectional view taken along dashed-dotted line A5-A6 in FIG. 14A, and illustrates layers above the insulator 149.

The semiconductor device in FIGS. 14A to 14D is different from the semiconductor device in FIGS. 1A to 1C in that a conductor 160*ab* and a conductor 160*aa* are provided as plugs connecting the conductor 108*a* to the conductor 146*a* and that the conductor 160*aa* is in contact with the end portion of the side surface of the conductor 108*a* in the channel width direction. Note that a conductor 160*bb* and a conductor 160*ba* which serve as plugs connecting the conductor 108*c* to the conductor 146*b* have the same structures. The description of the structures of the conductors 160*ab* and 160*aa* can be referred to for the structures of the conductors 160*bb* and 160*ba*; thus, the components of the conductors 160*bb* and 160*ba* are not described in some cases.

In the semiconductor device in FIGS. 14A to 14D, the conductor 160*ab* is provided in an opening which is formed in the insulator 148, the insulator 149, the insulator 101, and the insulator 107 and reaches the conductor 146*a*. In addition, the conductor 160*aa* is provided in an opening which is formed in the insulator 105, the insulator 103, the insulator 104, an insulator 117*a*, and an insulator 117*b* and reaches the conductor 146*a*. As illustrated in FIG. 14D, the conductor 108*a* and the semiconductor 106*b*, the insulator 106*a*, the insulator 104, the insulator 103, and the insulator 105 which overlap with the conductor 108*a* are provided in the opening. The conductor 160*aa* is provided on the surfaces thereof. The bottom surface of the conductor 160*aa* is in contact with the top surface of the conductor 160*ab*. Thus, the conductor 160*aa* is in contact with part of the top surface of the conductor 108*a* and the end portion of the side surface of the conductor 108a in the channel width direction. In addition, the conductor 160aa may be in contact with the end portion of the side surface of the semiconductor 106b in the channel width direction. Here, an end portion of a side surface of each of the conductor 108a and the semiconductor 106b in the channel width direction refers to an end portion of a side surface on the A5 side or an end portion of a side surface on the A6 side in FIG. 14D or to both of them.

With such a structure, the length of the memory cell 51aa in the channel length direction can be shortened. As a result, the area occupied by the semiconductor device in FIGS. 14A to 14D can be reduced as compared with the area occupied by the semiconductor device in FIGS. 1A to 1C.

Moreover, as illustrated in FIG. 14B, an insulator 117b is provided over the insulator 117a and the top surfaces of the conductor 160aa and the insulator 117b are substantially aligned with each other, whereby the distance between the conductor 160aa and the conductor 114a can be further shortened. Furthermore, when the transistor 52aa has a structure in which the conductor 114a, the insulator 112a, and the insulator 106ca are embedded in the insulator 117a, the width of the conductor 114a in the channel length direction can be reduced; thus, the parasitic capacitance between the conductor 160aa and the conductor 114a and the distance between the conductor 160aa and the conductor 114a can be shortened.

Although not illustrated, the conductor 160aa of the semiconductor device in FIGS. 14A to 14D may also be in contact with the end portion of the side surface of the conductor 108a in the channel length direction like the conductor 110a of the semiconductor device in FIGS. 1A to 1C. In other words, the conductor 160aa may be in contact with the side surface of the conductor 108a in three directions. With such a structure, the conductor 160aa and the conductor 108a can be electrically connected to each other more surely.

As the conductors 160aa and 160ab, the conductor or the like that can be used as the conductor 110a is used. As the insulators 117a and 117b, the insulator or the like that can be used as the insulator 117 is used.

For the other structures of the semiconductor device in FIGS. 14A to 14D, the structures of the semiconductor device in FIGS. 1A to 1C can be referred to.

In Embodiment 1, one embodiment of the present invention has been described. Other embodiments of the present invention will be described in Embodiments 2 to 6. Note that one embodiment of the present invention is not limited thereto. That is, various embodiments of the invention are described in Embodiments 1 to 6, and thus one embodiment of the present invention is not limited to a specific embodiment. Although an example in which one embodiment of the present invention is applied to a memory is described, one embodiment of the present invention is not limited thereto. Depending on circumstances or conditions, one embodiment of the present invention may be applied to another circuit. Furthermore, depending on circumstances or conditions, one embodiment of the present invention is not necessarily applied to a memory. Although an example in which a channel formation region of a transistor includes an oxide semiconductor is described as one embodiment of the present invention, one embodiment of the present invention is not limited thereto. Depending on circumstances or conditions, in one embodiment of the present invention, a transistor may include another semiconductor material such as silicon, germanium, silicon germanium, silicon carbide, gallium arsenide, aluminum gallium arsenide, indium phosphide, gallium nitride, or an organic semiconductor. Furthermore, depending on circumstances or conditions, in one embodiment of the present invention, a transistor does not necessarily include an oxide semiconductor.

The structure and method described in this embodiment can be combined as appropriate with any of the other structures and methods described in the other embodiments. Note that a content (or part thereof) described in this embodiment can be applied to, combined with, or replaced with another content (or part thereof) described in this embodiment and/or a content (or part thereof) described in another or other embodiments. Note that in each embodiment, a content described in the embodiment is a content described with reference to a variety of diagrams or a content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. This applies also to other embodiments.

Embodiment 2

In this embodiment, another configuration example of a memory circuit of one embodiment of the present invention will be described.

Figure 15A:
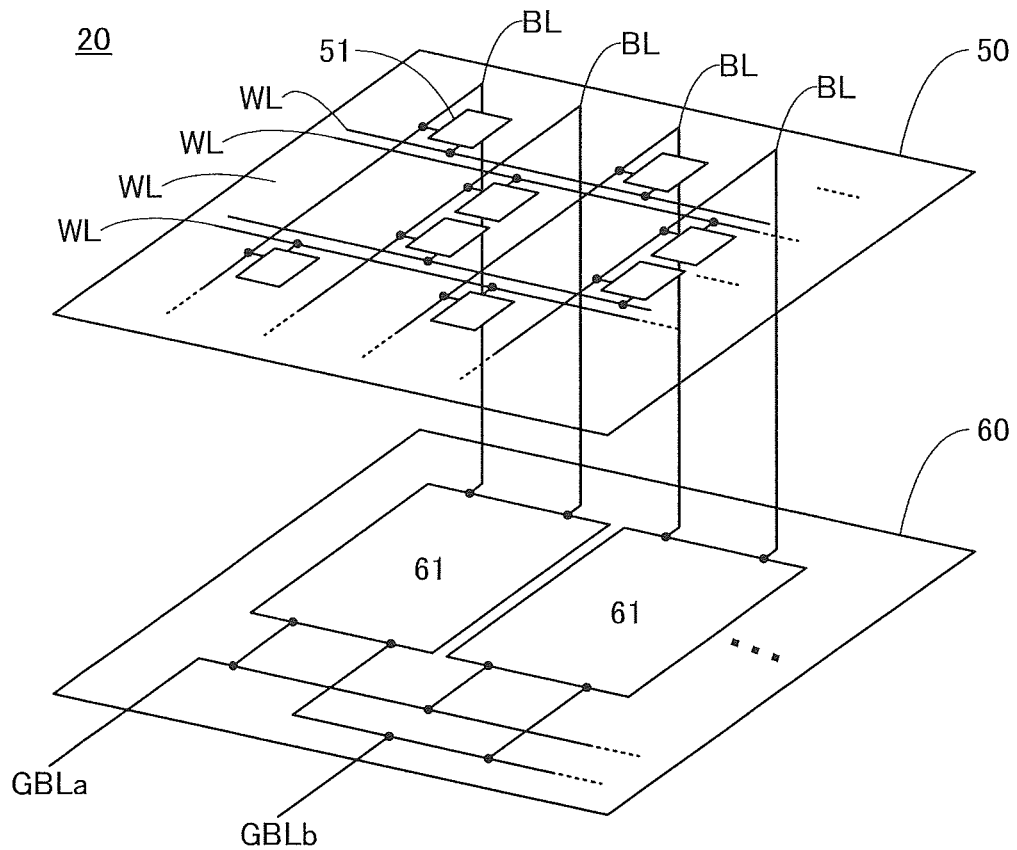
FIGS. 15A and 15B are block diagrams illustrating a semiconductor device of one embodiment of the present invention.
Figure 15B:
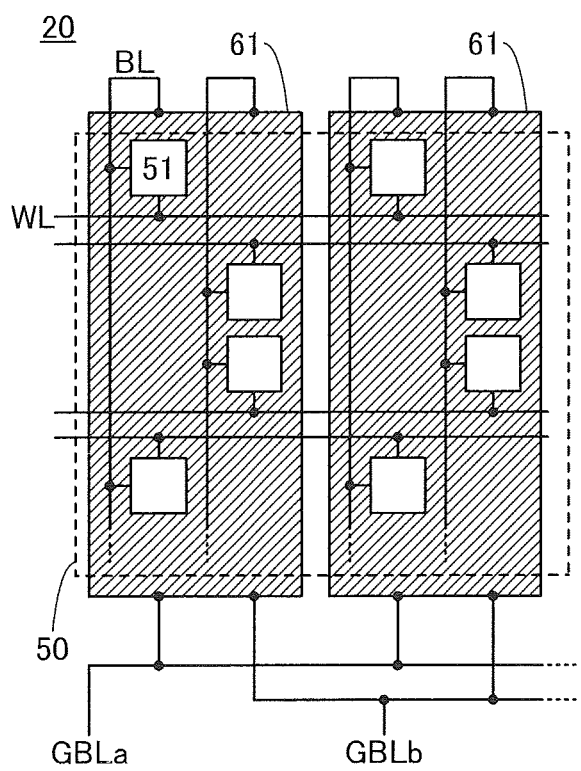

FIG. 15A illustrates a configuration example of the memory circuit 20. FIG. 15B is a top view of the memory circuit 20 illustrated in FIG. 15A. The memory circuit 20 illustrated in FIGS. 15A and 15B has, like the memory circuit 20 illustrated in FIG. 2 and FIG. 3, a structure in which the memory cells 51 are stacked over the sense amplifiers 61. However, in the memory circuit 20 illustrated in FIGS. 15A and 15B, the layout of the cell array 50 is a folded layout. In contrast, the layout of the cell array 50 in the memory circuit 20 illustrated in FIG. 2 and FIG. 3 is an open-type layout. The memory circuit 20 illustrated in FIGS. 15A and 15B is different from the memory circuit 20 illustrated in FIG. 2 and FIG. 3 in the layout of the cell array 50.

In the memory circuit 20 illustrated in FIGS. 15A and 15B, two sets of one sense amplifier 61 and a plurality of memory cells 51 stacked over the one sense amplifier 61 are provided, for example. Note that the number of sets included in the memory circuit 20 of one embodiment of the present invention may be three or more.

In FIGS. 15A and 15B, the four memory cells 51 overlap with the one sense amplifier 61 connected to the plurality of memory cells 51. Note that the number of the memory cells 51 overlapping with the one sense amplifier 61 included in the memory circuit 20 of one embodiment of the present invention may be one, two, three, or more than four.

In FIGS. 15A and 15B, the sense amplifier 61 is connected to one wiring BL and another wiring BL adjacent to the one wiring BL. Each of the sense amplifiers 61 is connected to the wiring GBLa and the wiring GBLb.

In the cell array 50 illustrated in FIGS. 15A and 15B, which is a folded layout, the memory cell 51 connected to one wiring BL and the memory cell 51 connected to another wiring BL adjacent to the one wiring BL are not connected to the same wiring WL.

With such a structure, when data is read by one sense amplifier 61, an influence of noise in two wirings BL connected to the sense amplifier 61 can be reduced. Thus, in the memory circuit 20, errors in data reading can be reduced.

Next, a configuration example of the cell array 50 in this embodiment is described with reference to FIG. 16 and FIGS. 17A and 17B. Note that for the structure of the sense amplifier 61, the structure of the sense amplifier 61 in FIGS. 1A to 1D can be referred to because these are similar to each other.

Figure 16:
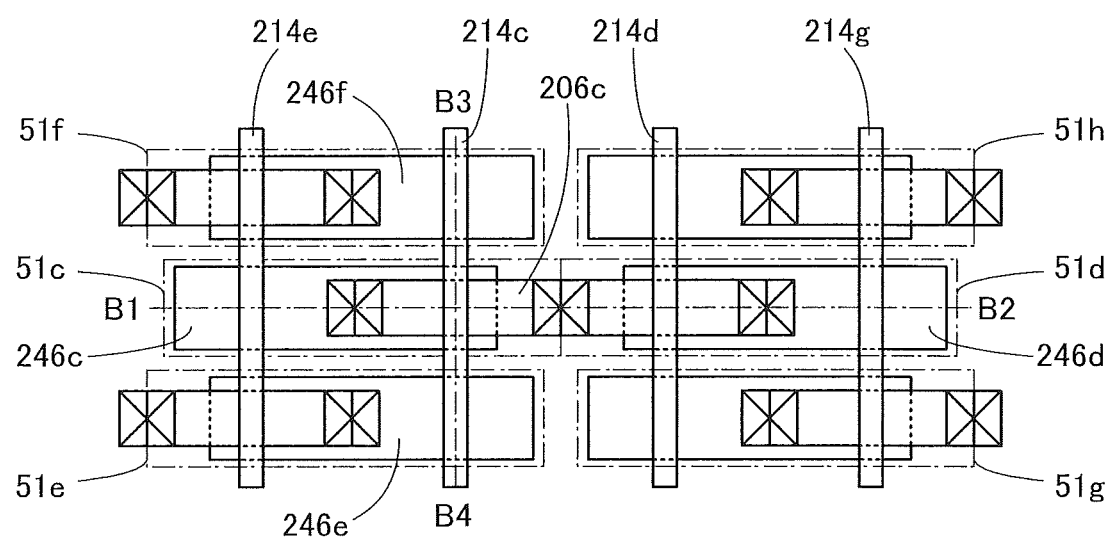
FIG. 16 is a top view illustrating a semiconductor device of one embodiment of the present invention.

FIG. 16 is a top view of some components (the memory cell 51*c*, the memory cell 51*d*, the memory cell 51*e*, the memory cell 51*f*, the memory cell 51*g*, and the memory cell 51*h*) of the cell array 50 in this embodiment. FIG. 17A is a cross-sectional view taken along dashed-dotted line B1-B2 in FIG. 16. FIG. 17B is a cross-sectional view taken along dashed-dotted line B3-B4 in FIG. 16. A region along dashed-dotted line B1-B2 shows a structure of a transistor 52*c* and a transistor 52*d* in the channel length direction, and a region along dashed-dotted line B3-B4 shows a structure of the transistor 52*c* in the channel width direction.

Each structure of the memory cells 51*c* to 51*h* is substantially the same as each structure of the memory cells 51*aa* and 51*ab*. The memory cell 51*c* includes the transistor 52*c* and a capacitor 53*c*. The memory cell 51*d* includes the transistor 52*d* and a capacitor 53*d*.

Figure 17A:
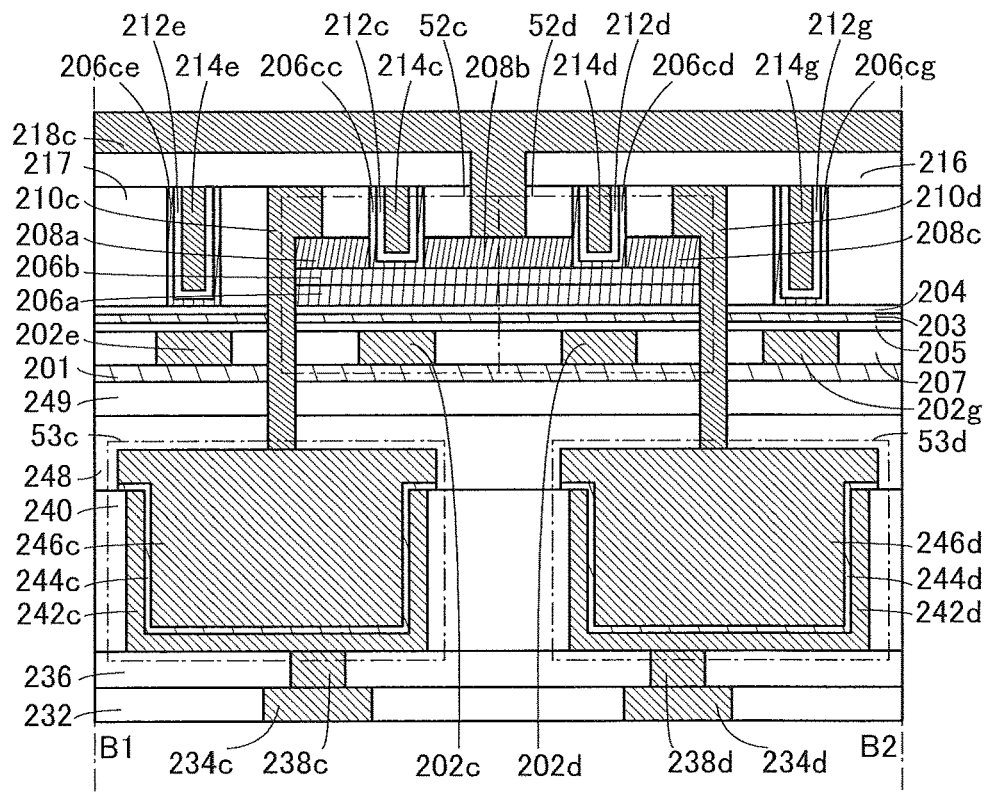
FIGS. 17A and 17B are cross-sectional views illustrating a semiconductor device of one embodiment of the present invention.
Figure 17B:
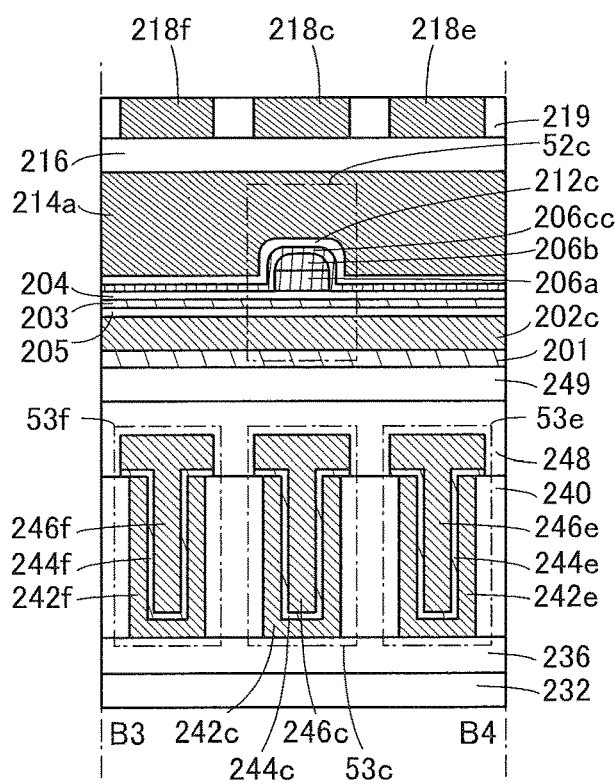

Thus, an insulator 232, a conductor 234*c*, a conductor 234*d*, an insulator 236, a conductor 238*c*, a conductor 238*d*, an insulator 240, a conductor 242*c*, a conductor 242*d*, an insulator 244*c*, an insulator 244*d*, a conductor 246*c*, a conductor 246*d*, an insulator 248, an insulator 249, an insulator 201, an insulator 207, an insulator 205, an insulator 203, an insulator 204, an insulator 206*a*, a semiconductor 206*b*, a conductor 208*a*, a conductor 208*b*, a conductor 208*c*, an insulator 206*cc*, an insulator 206*cd*, an insulator 212*c*, an insulator 212*d*, a conductor 214*c*, a conductor 214*d*, an insulator 217, a conductor 210*c*, a conductor 210*d*, an insulator 216, a conductor 218*c*, and an insulator 219, which are illustrated in FIGS. 17A and 17B, have the same structure as those of the insulator 132, the conductor 134*a*, the conductor 134*b*, the insulator 136, the conductor 138*c*, the conductor 138*d*, the insulator 140, the conductor 142*a*, the conductor 142*b*, the insulator 144*a*, the insulator 144*b*, the conductor 146*a*, the conductor 146*b*, the insulator 148, the insulator 149, the insulator 101, the insulator 107, the insulator 105, the insulator 103, the insulator 104, the insulator 106*a*, the semiconductor 106*b*, the conductor 108*a*, the conductor 108*b*, the conductor 108*c*, the insulator 106*ca*, the insulator 106*cb*, the insulator 112*c*, the insulator 112*d*, the conductor 114*a*, the conductor 114*b*, the insulator 117, the conductor 110*a*, the conductor 110*b*, the insulator 116, the conductor 118, and the insulator 119, respectively.

However, in the memory cells 51*c* which are arranged in the folded layout is different from the memory cells 51*aa* which are arranged in the open-type layout in that the length of the capacitor 53 can be increased. Thus, the capacitor 53*c* can be provided so as to overlap with the wiring WL connected to the memory cells 51*f* and 51*e*. At this time, a conductor 214*e* serves as the wiring WL connected to the memory cells 51*f* and 51*e*, and a side surface and a bottom surface of the conductor 214*e* are covered with an insulator 212*e* and an insulator 206*ce*. In addition, a conductor 202*e* serving as a back gate of the memory cells 51*e* and 51*f* is provided to overlap with the conductor 214*e*. Thus, as illustrated in FIGS. 17A and 17B, at least parts of the conductor 242*c*, the insulator 244*c*, and the conductor 246*c* can be provided to overlap with the conductor 214*e*, the insulator 212*e*, the insulator 206*ce*, and the conductor 202*e*.

For example, if the sizes of the transistors 52*c* and the transistor 52*aa* are almost the same, the length of the capacitor 53*c* in the channel length direction can be approximately twice as large as that of the capacitor 53*aa* in the channel length direction.

When the capacitor 53*c* is provided in this manner, the electrostatic capacitance of the capacitor 53*c* can have a margin. Accordingly, for example, the thickness of the insulator 244*c* can be large to improve the insulation between the conductors 242*c* and 246*c*. Furthermore, for example, the height of the capacitor 53*c* (also referred to as the height of the conductor 242*a* or the depth of an opening in the insulator 240) can be further small to improve yield of the capacitor 53*c*.

Needless to say, the memory cells 51*d* to 51*h* in FIG. 16 can each have the same structure as that of the memory cell 51*c*. Thus, as illustrated in FIG. 17A, at least parts of the conductor 242*d*, the insulator 244*d*, and the conductor 246*d* can be provided to overlap with a conductor 214*g*, an insulator 212*g*, an insulator 206*cg*, and a conductor 202*g*.

In addition, as illustrated in FIG. 17B, at least parts of a conductor 242*e*, an insulator 244*e*, and a conductor 246*e* can be provided to overlap with the conductor 214*c*, the insulator 212*c*, the insulator 206*cc*, and a conductor 202*c*. Moreover, as illustrated in FIG. 17B, at least parts of a conductor 242*f*, an insulator 244*f*, and a conductor 246*f* can be provided to overlap with the conductor 214*c*, the insulator 212*c*, the insulator 206*cc*, and the conductor 202*c*. A conductor 218*e* illustrated in FIG. 17B is a conductor serving as the wiring BL connected to the memory cells 51*e* and 51*g*. In addition, a conductor 218*f* illustrated in FIG. 17B is a conductor serving as the wiring BL connected to the memory cells 51*f* and 51*h*.

The structures and the methods described in this embodiment can be combined as appropriate with any of the structures and the methods described in the other embodiments.

Embodiment 3

In this embodiment, an example of a method for manufacturing a semiconductor device illustrated in FIGS. 1A to 1C is described with reference to FIGS. 18A to 18H, FIGS. 19A to 19F, FIGS. 20A to 20F, FIGS. 21A to 21H, FIGS. 22A to 22F, and FIGS. 23A to 23F. Note that in this embodiment, a method for manufacturing memory cells above the insulator 130.

First, a method for fabricating the capacitors 53*aa* and 53*ab* is described.

First, an insulator to be the insulator 132 is formed over the insulator 130. Any of the above-described insulators that can be used as the insulator 132 can be used as the insulator to be the insulator 132. The insulator to be the insulator 132 can be deposited by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving electric charges from plasma. In that case, accumulated electric charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. For that reason, a formed film is less likely to have a pinhole or the like. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

As the sputtering method, a direct current (DC) sputtering method in which a direct-current power source is used as a sputtering power source, a DC sputtering method in which a pulsed bias is applied (i.e., a pulsed DC sputtering method), or a radio frequency (RF) sputtering method in which a high frequency power source is used as a sputtering power source may be used. Alternatively, a magnetron sputtering method using a magnet mechanism inside a chamber, a bias sputtering method in which voltage is also applied to a substrate during deposition, a reactive sputtering method performed in a reactive gas atmosphere, or the like may be used. Alternatively, parallel electrode sputtering (PESP), which is a deposition method using a parallel-plate-type sputtering apparatus, or vapor deposition sputtering (VDSP), which is a deposition method using a facing-targets sputtering apparatus, may be used.

Next, a resist or the like is formed over the insulator to be the insulator 132 and processing is performed using the resist or the like, whereby the insulator 132 having openings is formed. Note that the case where the resist is simply formed also includes the case where an anti-reflection layer is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Figure 18A:
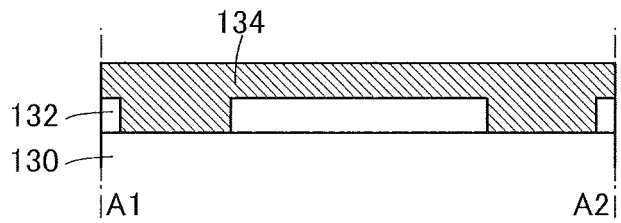
FIGS. 18A to 18H are cross-sectional views illustrating a method for manufacturing a semiconductor device of one embodiment of the present invention.
Figure 18B:
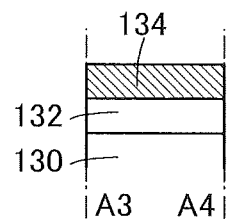

Next, the conductor 134 is formed on the insulator 132 (see FIGS. 18A and 18B). Any of the above-described conductors that can be used as the conductor 134a and the like is used as the conductor 134. The conductor 134 can be formed by a sputtering method, a CVD method, an MBE method, a PLD method, an ALD method, or the like.

Figure 18C:
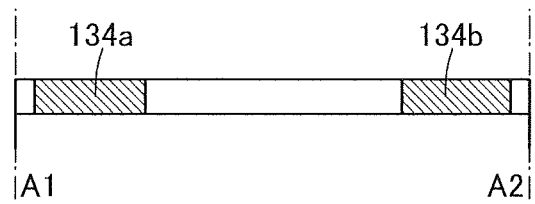
Figure 18D:
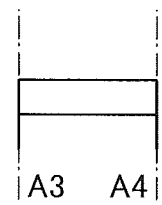

Next, the conductor 134 is processed by a chemical mechanical polishing (CMP) method or the like to remove a portion of the conductor 134 above the openings in the insulator 132; as a result, the conductor 134a and the conductor 134b are formed in the openings in the insulator 132 (see FIGS. 18C and 18D).

Figure 18E:
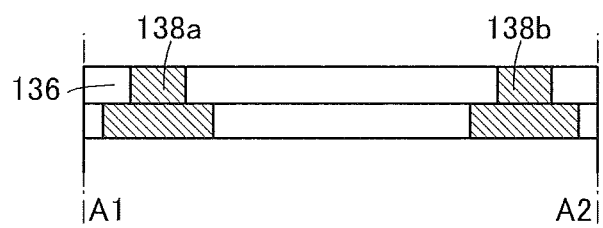
Figure 18F:
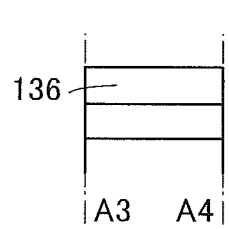

Next, the insulator 136 having openings and the conductors 138a and 138b provided in the openings are formed over the insulator 132 (see FIGS. 18E and 18F). The insulator 136 can be formed by a method similar to that of the insulator 132, and the conductors 138a and 138b can be formed by a method similar to that of the conductors 134a and 134b.

Next, an insulator to be the insulator 140 is formed over the insulator 136. Any of the above-described insulators that can be used as the insulator 140 is used as the insulator to be the insulator 140. The insulator 140 can be deposited by a sputtering method, a CVD method, an MBE method, a PLD method, an ALD method, or the like. Note that the insulator to be the insulator 140 may have a stacked-layer structure, and for example, an aluminum oxide layer may be formed in silicon oxide. In CMP treatment for forming the conductors 142a and 142b, which is described later, the aluminum oxide layer can serve as a stopper.

Figure 18G:
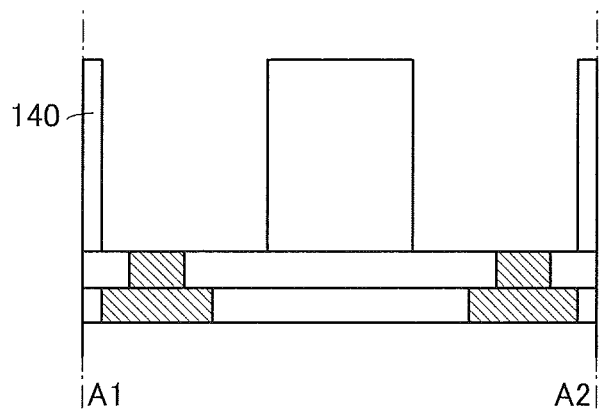
Figure 18H:
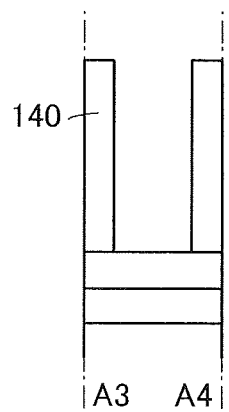

Next, a resist or the like is formed over the insulator to be the insulator 140 and processing is performed using the resist or the like, whereby the insulator 140 having openings is formed (see FIGS. 18G and 18H).

Figure 19A:
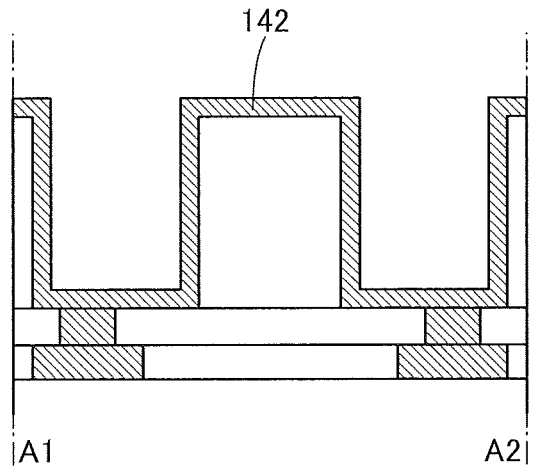
FIGS. 19A to 19F are cross-sectional views illustrating a method for manufacturing a semiconductor device of one embodiment of the present invention.
Figure 19B:
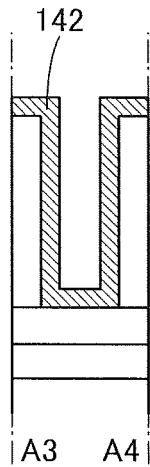

The conductor 142 is formed over the insulator 140 (see FIGS. 19A and 19B). Any of the above-described conductors that can be used as the conductor 142a and the like is used as the conductor 142. The conductor 142 can be deposited by a sputtering method, a CVD method, an MBE method, a PLD method, an ALD method, or the like. In particular, the conductor 142 is formed in the openings in the insulator 140; thus, a CVD method, an ALD method, or the like, which provides good coverage, is preferably used.

Figure 19C:
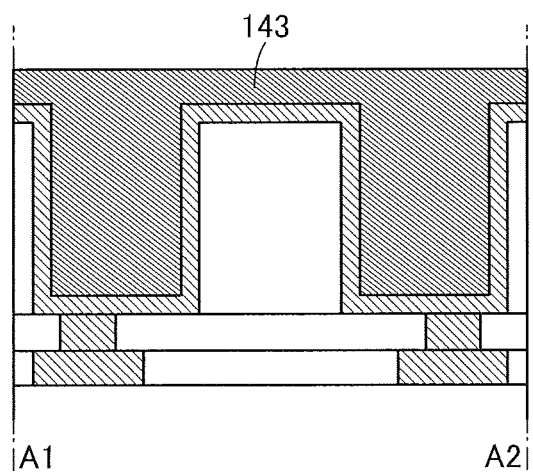
Figure 19D:
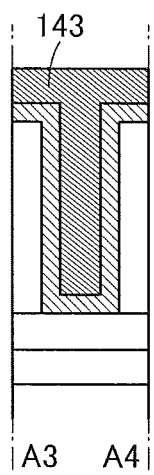

The conductor 143 is formed over the conductor 142 (see FIGS. 19C and 19D). As the conductor 143, a conductor which can have etching selectivity to the conductor 142 is used. The conductor 143 can be deposited by a sputtering method, a CVD method, an MBE method, a PLD method, an ALD method, or the like. In particular, the conductor 143 is formed in the openings in the insulator 140; thus, a CVD method, an ALD method, or the like, which provides good coverage, is preferably used.

Figure 19E:
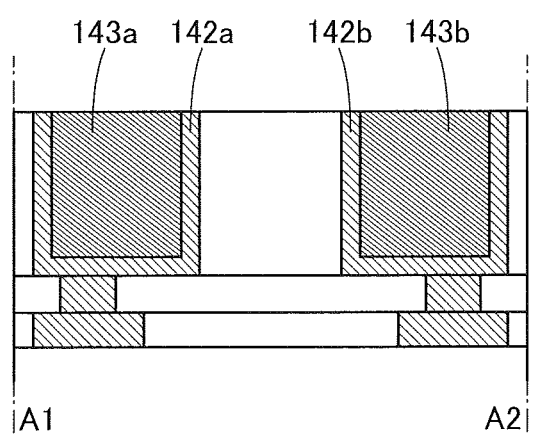
Figure 19F:
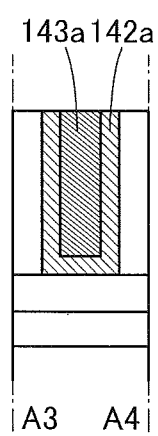

Next, the conductors 142 and 143 are processed by a CMP method or the like to remove a portion of the conductors 142 and 143 above the openings in the insulator 140; as a result, the conductors 142a, 143a 142b, and 143b are formed in the openings in the insulator 140 (see FIGS. 19E and 19F). In this manner, CMP treatment or the like is performed while the openings are filled with the conductor 143, whereby the residue or the like generated in CMP treatment can be prevented from depositing in the openings. Here, an insulating layer to be a stopper in CMP treatment is provided in the insulator 140, whereby the CMP treatment can be performed easily.

Then, etching treatment is performed to remove the conductors 143*a* and 143*b*.

Figure 20A:
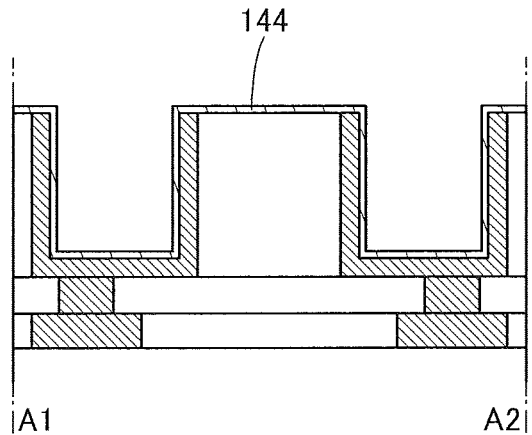
FIGS. 20A to 20F are cross-sectional views illustrating a method for manufacturing a semiconductor device of one embodiment of the present invention.
Figure 20B:
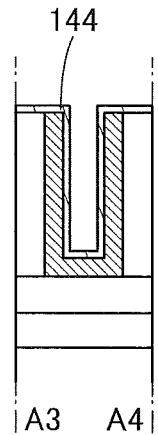

Next, the insulator 144 is formed over the insulator 140 (see FIGS. 20A and 20B). Any of the above-described insulators that can be used as the insulator 144*a* and the like is used as the insulator 144. The insulator 144 can be deposited by a sputtering method, a CVD method, an MBE method, a PLD method, an ALD method, or the like. In particular, the insulator 144 is formed in the openings in the insulator 140; thus, a CVD method, an ALD method, or the like, which provides good coverage, is preferably used.

In the case where the above high-k material, in particular, an oxide containing hafnium is used for the insulator 144*a*, heat treatment is preferably performed to have a crystal structure and to increase relative dielectric constant.

Figure 20C:
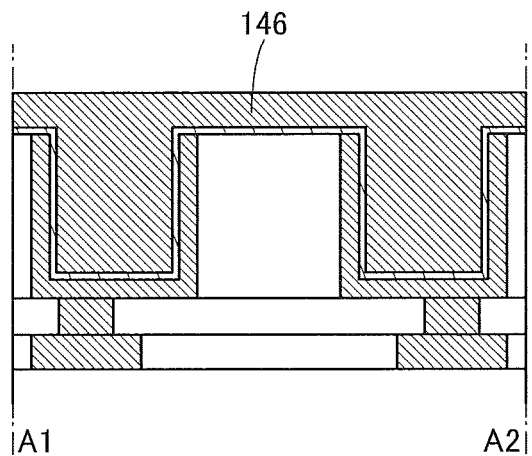
Figure 20D:
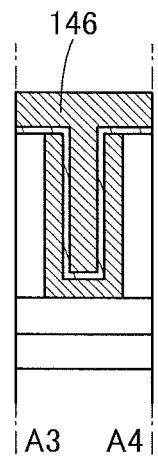
Figure 20E:
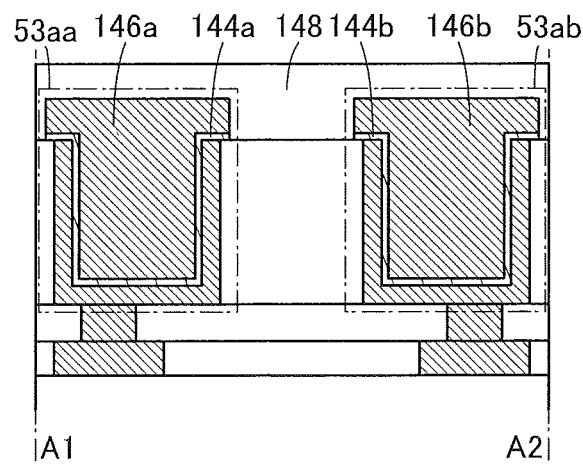
Figure 20F:
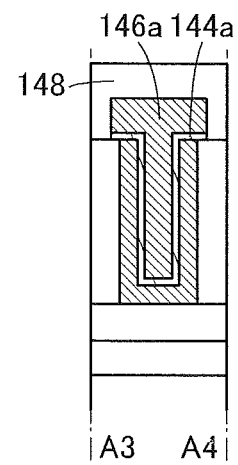

The conductor 146 is formed over the insulator 144 (see FIGS. 20C and 20D). Any of the above-described conductors that can be used as the conductor 146*a* and the like is used as the conductor 146. The conductor 146 can be deposited by a sputtering method, a CVD method, an MBE method, a PLD method, an ALD method, or the like. In particular, the conductor 146 is formed in the openings in the insulator 140; thus, a CVD method, an ALD method, or the like, which provides good coverage, is preferably used.

Then, a resist or the like is formed over the conductor 146 and processing is performed using the resist or the like, whereby the insulator 144*a*, the conductor 146*a*, the insulator 144*b*, and the conductor 146*b* are formed. Here, the insulator 144*a* is formed to cover the outside of the conductor 142*a*. Thus, leakage current flowing between the conductors 142*a* and 146*a* can be prevented.

Next, the insulator 148 is formed over the insulator 140 (see FIGS. 20G and 20H). Any of the above-described insulators that can be used as the insulator 148 is used as the insulator 148. The insulator 148 can be deposited by a sputtering method, a CVD method, an MBE method, a PLD method, an ALD method, or the like.

In this manner, the capacitors 53*aa* and 53*ab* can be formed.

Next, a method for fabricating the transistors 52*aa* and 52*ab* is described.

First, the insulator 149 is formed over the insulator 148. Any of the above-described insulators that can be used as the insulator 149 is used as the insulator 149. The insulator 149 can be deposited by a sputtering method, a CVD method, an MBE method, a PLD method, an ALD method, or the like.

Figure 21A:
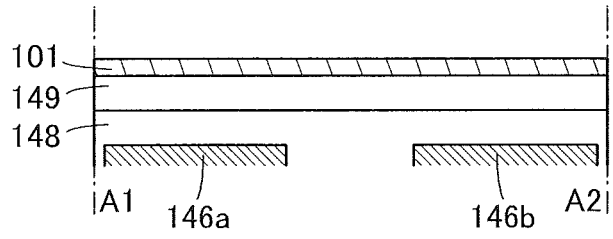
FIGS. 21A to 21H are cross-sectional views illustrating a method for manufacturing a semiconductor device of one embodiment of the present invention.
Figure 21B:
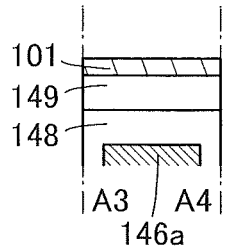

Next, the insulator 101 is formed over the insulator 149 (see FIGS. 21A and 21B). Any of the above-described insulators that can be used as the insulator 101 is used as the insulator 101. The insulator 101 can be deposited by a sputtering method, a CVD method, an MBE method, a PLD method, an ALD method, or the like.

Figure 21C:
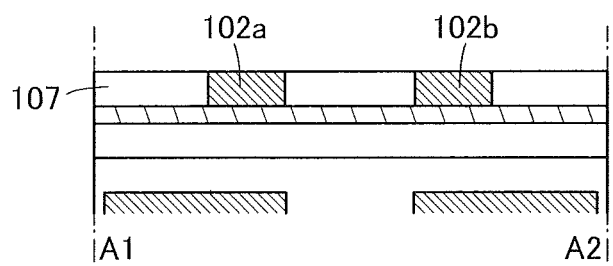
Figure 21D:
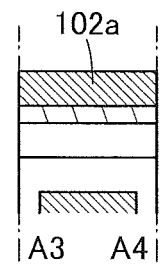

Next, the insulator 107 having openings and the conductors 102*a* and 102*b* provided in the openings are formed over the insulator 101 (see FIGS. 21C and 21D). The insulator 107 can be formed by a method similar to that of the insulator 132, and the conductors 102*a* and 102*b* can be formed by a method similar to that of the conductors 134*a* and 134*b*.

Then, the insulator 105 is formed. Any of the above-described insulators that can be used as the insulator 105 is used as the insulator 105. The insulator 105 can be deposited by a sputtering method, a CVD method, an MBE method, a PLD method, an ALD method, or the like. In order to reduce water and hydrogen contained in the insulator 105, the insulator 105 may be formed while the substrate is being heated.

Then, the insulator 103 is formed. Any of the above-described insulators that can be used as the insulator 103 is used as the insulator 103. The insulator 103 can be deposited by a sputtering method, a CVD method, an MBE method, a PLD method, an ALD method, or the like. In order to reduce water and hydrogen contained in the insulator 103, the insulator 103 may be formed while the substrate is being heated.

Figure 21E:
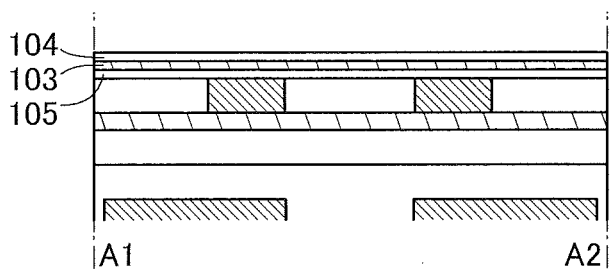
Figure 21F:
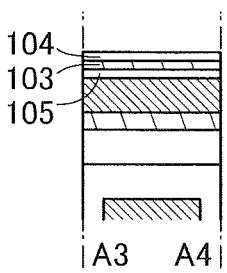

Then, the insulator 104 is formed (see FIGS. 21E and 21F). Any of the above-described insulators that can be used as the insulator 104 is used as the insulator 104. The insulator 104 can be deposited by a sputtering method, a CVD method, an MBE method, a PLD method, an ALD method, or the like. In order to reduce water and hydrogen contained in the insulator 104, the insulator 104 may be formed while the substrate is being heated.

The top surface or the bottom surface of the semiconductor 106*b* to be formed later preferably has high planarity. Thus, to improve the planarity, the top surface of the insulator 104 may be subjected to planarization treatment such as CMP treatment.

Next, heat treatment is preferably performed. The heat treatment can further reduce water and hydrogen in the insulator 105, the insulator 103, and the insulator 104. In addition, the insulator 104 can contain excess oxygen in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace.

Next, an insulator to be the insulator 106*a* is formed. Any of the above-described insulators and semiconductors that can be used for the insulator 106*a* can be used for the insulator to be the insulator 106*a*. The insulator to be the insulator 106*a* can be formed by a sputtering method, a CVD method, an MBE method, a PLD method, an ALD method, or the like. The insulator to be the insulator 106*a* is preferably formed while the substrate is being heated.

Next, a semiconductor to be the semiconductor 106*b* is formed. Any of the above-described semiconductors that can be used for the semiconductor 106*b* can be used for the semiconductor to be the semiconductor 106*b*. The semiconductor to be the semiconductor 106*b* can be formed by a sputtering method, a CVD method, an MBE method, a PLD method, an ALD method, or the like. The semiconductor to be the semiconductor 106*b* is preferably formed while the substrate is being heated. Note that successive film formation of the insulator to be the insulator 106*a* and the semiconductor to be the semiconductor 106b without exposure to the air can reduce entry of impurities into the films and their interface.

Next, heat treatment is preferably performed. The heat treatment can reduce the hydrogen concentration of the insulator 106a and the semiconductor 106b in some cases. The heat treatment can reduce oxygen vacancies in the insulator 106a and the semiconductor 106b in some cases. The heat treatment may be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The heat treatment can increase the crystallinity of the insulator 106a and the semiconductor 106b and can remove impurities, such as hydrogen and water, for example. For the heat treatment, lamp heating can be performed with use of an RTA apparatus. Heat treatment with an RTA apparatus is effective for an improvement in productivity because it needs short time as compared with the case of using a furnace. By heat treatment, the peak intensity is increased and a full width at half maximum is decreased when a CAAC-OS described later is used for the insulator 106a and the semiconductor 106b. In other words, the crystallinity of a CAAC-OS is increased by heat treatment.

By the heat treatment, oxygen can be supplied from the insulator 104 to the insulator to be the insulator 106a and the semiconductor to be the semiconductor 106b. The heat treatment performed on the insulator 104 makes it very easy to supply oxygen to the insulator to be the insulator 106a and the semiconductor to be the semiconductor 106b.

Here, the insulator 103 serves as a barrier film that blocks oxygen. The insulator 103 provided under the insulator 104 can prevent oxygen diffused in the insulator 104 from being diffused into layers under the insulator 104.

Oxygen is supplied to the insulator to be the insulator 106a and the semiconductor to be the semiconductor 106b to reduce oxygen vacancies, whereby highly purified intrinsic or substantially highly purified intrinsic oxide semiconductor with a low density of defect states can be achieved.

High-density plasma treatment or the like may be performed. High-density plasma may be generated using microwaves. For the high-density plasma treatment, for example, an oxidation gas such as oxygen or nitrous oxide may be used. Alternatively, a mixed gas of an oxidation gas and a rare gas such as He, Ar, Kr, or Xe may be used. In the high-density plasma treatment, a bias may be applied to the substrate. Thus, oxygen ions and the like in the plasma can be extracted to the substrate side. The high-density plasma treatment may be performed while the substrate is being heated. For example, in the case where the high-density plasma treatment is performed instead of the heat treatment, the similar effect can be obtained at a temperature lower than the heat treatment temperature. The high-density plasma treatment may be performed before the formation of the insulator to be the insulator 106a, after the formation of the semiconductor 106b, or after the formation of the insulator 117.

Next, a conductor to be the conductor 108 is formed. As the conductor to be the conductor 108, the above conductor that can be used as the conductors 108a, 108b, and 108c is used. The conductor to be the conductor 108 can be deposited by a sputtering method, a CVD method, an MBE method, a PLD method, an ALD method, or the like.

Figure 21G:
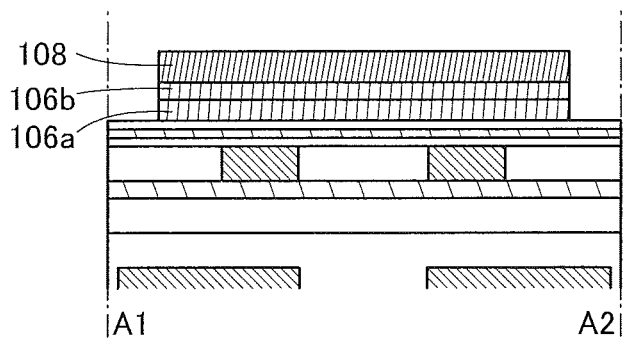
Figure 21H:
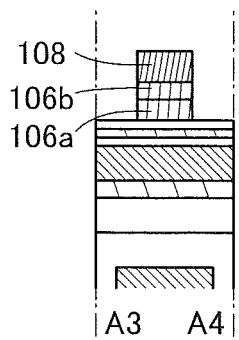

Next, a resist or the like is formed over the conductor to be the conductor 108 and processing is performed using the resist or the like, whereby the conductor 108, the semiconductor 106b, and the insulator 106a are formed (see FIGS. 21G and 21H).

Next, heat treatment may be performed. The heat treatment can further reduce water and hydrogen in the insulator 104, the insulator 103, the insulator 105, the insulator 106a, and the semiconductor 106b. The heat treatment is performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The heat treatment may be performed in an inert gas atmosphere. The heat treatment may be performed in an atmosphere containing an oxidizing gas. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. For the heat treatment, lamp heating can be performed with use of an RTA apparatus. Heat treatment with an RTA apparatus is effective for an improvement in productivity because it needs short time as compared with the case of using a furnace.

Through the heat treatment up to here, the impurities such as water and hydrogen which enters when the transistor 90 in the lower layer and the capacitor 53aa and the capacitor 53ab are fabricated and affects the oxide semiconductor can be reduced before the formation of the oxide semiconductor. Moreover, the temperature of the process which is performed after the formation of the oxide semiconductor is lower than or equal to that of the heat treatment up to here, whereby an influence due to the diffusion of the impurities can be reduced.

When the heat treatment is performed at the stage where the insulator 106a and the semiconductor 106b are formed and a surface of the insulator 104 is exposed, as described above, it is possible to inhibit supply of water and hydrogen to the insulator 106a and the semiconductor 106b and to further reduce water and hydrogen in the insulator 104, the insulator 103, and the insulator 105.

In the case where an etching gas containing impurities such as hydrogen and carbon are used for the formation of the insulator 106a and the semiconductor 106b, the impurities such as hydrogen and carbon sometimes enter the insulator 106a, the semiconductor 106b, and the like. The impurities such as hydrogen and carbon that enter the insulator 106a and the semiconductor 106b at the time of etching can be released by heat treatment performed after the formation of the insulator 106a and the semiconductor 106b.

The high-density plasma treatment may be performed instead of the heat treatment. Alternatively, the high-density plasma treatment may be performed after the heat treatment. In this manner, impurities such as hydrogen and carbon in the semiconductor 106b and the like can be released and oxygen vacancies can be filled with oxygen.

Then, an insulator to be the insulator 117 is formed. Any of the above-described insulators that can be used as the insulator 117 is used as the insulator to be the insulator 117. The insulator to be the insulator 117 can be formed by a sputtering method, a CVD method, an MBE method, a PLD method, an ALD method, or the like.

Here, the insulator 117 is preferably formed by utilizing plasma, further preferably a sputtering method, still further preferably a sputtering method in an atmosphere containing oxygen.

When the insulator to be the insulator 117 is formed by a sputtering method, oxygen is added to the vicinity of a surface of the insulator 104 (after the formation of the insulator 117, an interface between the insulator 104 and the insulator 117) at the same time as the formation. Although the oxygen is added to the insulator 104 as an oxygen radical, for example, the state of the oxygen at the time of being added is not limited thereto. The oxygen may be added to the insulator 104 as an oxygen atom, an oxygen ion, or the like. Note that by addition of oxygen, oxygen in excess of the stoichiometric composition is contained in the insulator 104 in some cases, and the oxygen in such a case can be called excess oxygen. The oxygen gas flow rate or deposition power for sputtering can be set as appropriate in accordance with the amount of oxygen to be added.

Figure 22A:
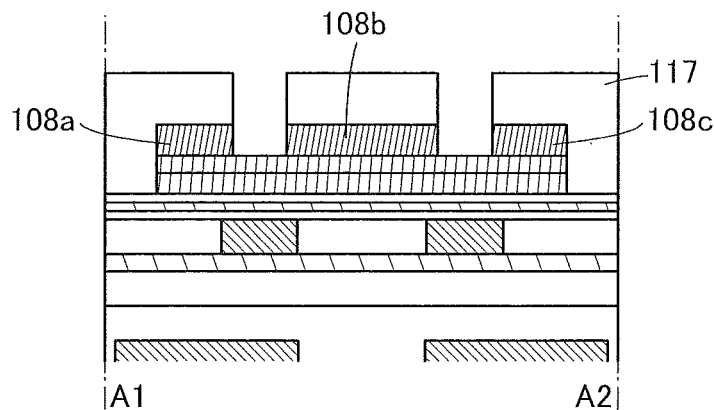
FIGS. 22A to 22F are cross-sectional views illustrating a method for manufacturing a semiconductor device of one embodiment of the present invention.
Figure 22B:
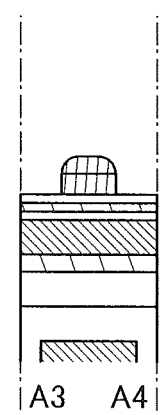

Next, a resist or the like is formed over the insulator to be the insulator 117 and processing is performed using the resist or the like, so that the insulator 117, the conductor 108a, the conductor 108b, and the conductor 108c are formed (see FIGS. 22A and 22B).

In a region of the semiconductor 106b which is in contact with the conductor 108a, 108b, or 108c, a low-resistance region is formed in some cases. In addition, in the semiconductor 106b, a region whose thickness is smaller than that of a region overlapping with the conductor 108a, 108b, or 108c is provided between the conductors 108a and 108b or between the conductors 108b and 108c in some cases. The thin region is formed because part of the top surface of the semiconductor 106b is removed during formation of the conductors 108a, 108b, and 108c.

Then, the insulator 106c is formed over the insulator 117. Any of the above-described insulators or semiconductors that can be used for the insulator 106ca and the like is used for the insulator 106c. The insulator 106c can be formed by a sputtering method, a CVD method, an MBE method, a PLD method, an ALD method, or the like. Before the formation of the insulator 106c, surfaces of the semiconductor 106b and the like may be etched. For example, plasma containing a rare gas can be used for the etching. After that, the insulator 106c is successively formed without being exposed to the air, whereby impurities can be prevented from entering an interface between the semiconductor 106b and the insulator 106c. In some cases, impurities at an interface between films are diffused more easily than impurities in a film. For this reason, a reduction in impurity at the interfaces leads to stable electrical characteristics of a transistor.

Then, the insulator 112 is formed over the insulator 106c. Any of the above-described insulators that can be used as the insulator 112a and the like is used as the insulator 112. The insulator 112 can be formed by a sputtering method, a CVD method, an MBE method, a PLD method, an ALD method, or the like. Note that successive film formation of the insulator 106c and the insulator 112 without exposure to the air can reduce entry of impurities into the films and their interface.

Figure 22C:
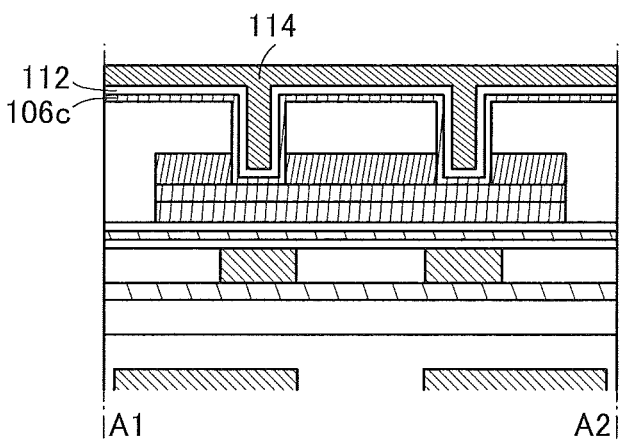
Figure 22D:
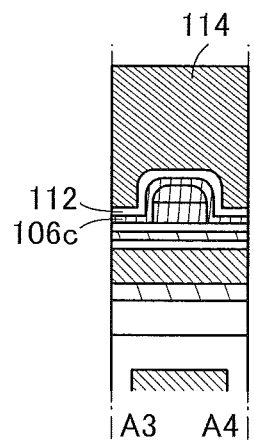

Next, the conductor 114 is formed over the insulator 112 (see FIGS. 22C and 22D). Any of the above-described conductors that can be used as the conductor 114a and the like is used as the conductor 114. The conductor 114 can be formed by a sputtering method, a CVD method, an MBE method, a PLD method, an ALD method, or the like. Note that successive film formation of the insulator 112 and the conductor 114 without exposure to the air can reduce entry of impurities into the films and their interface.

Figure 22E:
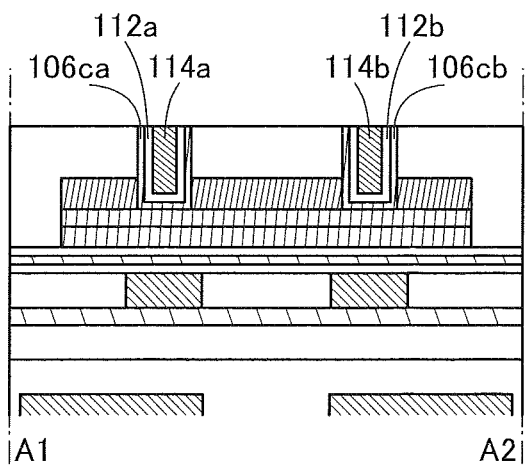
Figure 22F:
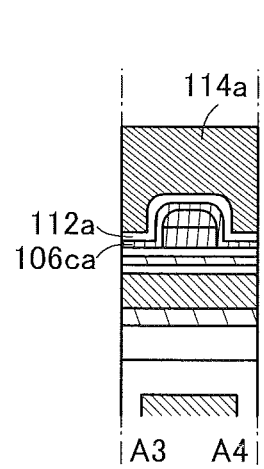

Next, the conductor 114 is polished by using a CMP method or the like until the insulator 117 is exposed, so that the conductor 114a, the insulator 112a, the insulator 106ca, the conductor 114b, the insulator 112b, and the insulator 106cb are formed (see FIGS. 22E and 22F). The conductor 114a serves as a gate electrode of the transistor 52aa and the insulator 112a serves as a gate insulator of the transistor 52aa. The conductor 114b serves as a gate electrode of the transistor 52ab and the insulator 112b serves as a gate insulator of the transistor 52ab. As described above, the conductor 114a, the insulator 112a, the insulator 106ca, the conductor 114b, the insulator 112b, and the insulator 106cb can be formed in a self-aligned manlier.

Figure 23A:
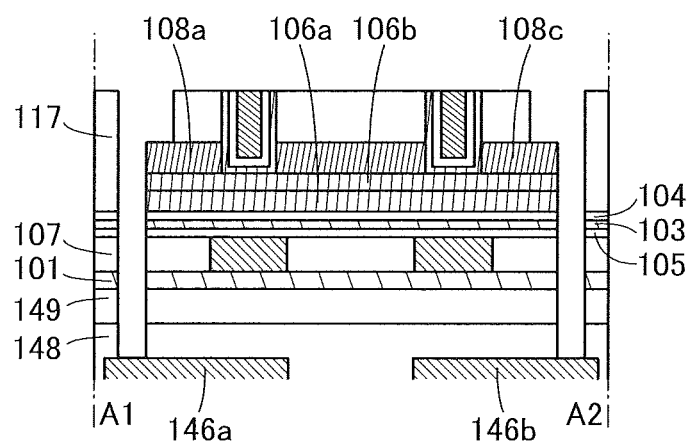
FIGS. 23A to 23F are cross-sectional views illustrating a method for manufacturing a semiconductor device of one embodiment of the present invention.
Figure 23B:
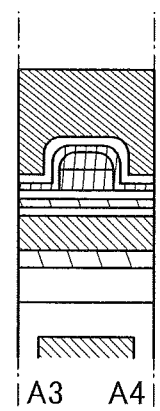

Next, a resist or the like is formed over the insulator 117 and processing is performed using the resist or the like, whereby an opening which reaches the conductor 146a and an opening which reaches the conductor 146b are formed in the insulator 117, the insulator 104, the insulator 103, the insulator 105, the insulator 107, the insulator 101, the insulator 149, and the insulator 148 (see FIGS. 23A and 23B).

Next, a conductor to be the conductor 110a and the conductor 110b is formed over the insulator 117. Any of the above-described conductors that can be used as the conductors 110a and 110b is used as the conductor. The conductor can be deposited by a sputtering method, a CVD method, an MBE method, a PLD method, an ALD method, or the like.

Figure 23C:
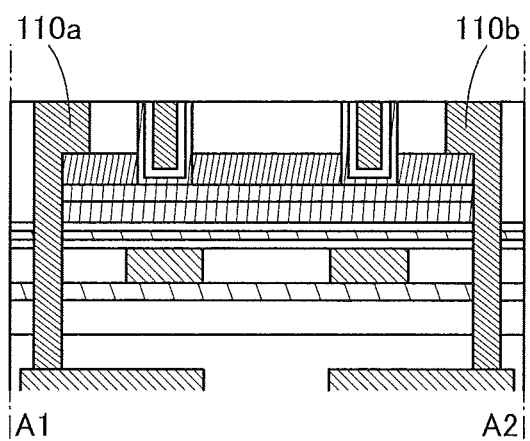
Figure 23D:
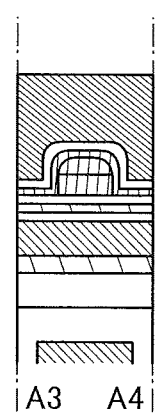

Next, a conductor to be the conductors 110a and 110b are processed by a CMP method or the like to remove a portion of the conductor above the openings in the insulator 117; as a result, the conductors 110a and 110b are formed in the openings in the insulator 117 (see FIGS. 23C and 23D).

Then, the insulator 116 is formed over the insulator 117. Any of the above-described insulators can be used for the insulator 116. The insulator 116 can be formed by a sputtering method, a CVD method, an MBE method, a PLD method, an ALD method, or the like.

Here, as the insulator 116, an oxide insulating film of aluminum oxide or the like having a blocking effect against oxygen, hydrogen, water, or the like is preferably provided.

The insulator 116 is preferably formed by utilizing plasma, further preferably a sputtering method, still further preferably a sputtering method in an atmosphere containing oxygen.

When the insulator 116 is formed by a sputtering method, oxygen is added to the vicinity of a surface of the insulator 117 (after the formation of the insulator 116, an interface between the insulator 117 and the insulator 116) at the same time as the formation. Although the oxygen is added to the insulator 117 as an oxygen radical, for example, the state of the oxygen at the time of being added is not limited thereto. The oxygen may be added to the insulator 117 as an oxygen atom, an oxygen ion, or the like. Note that by addition of oxygen, oxygen in excess of the stoichiometric composition is contained in the insulator 117 in some cases, and the oxygen in such a case can be called excess oxygen. The oxygen gas flow rate or deposition power for sputtering can be set as appropriate in accordance with the amount of oxygen to be added.

Next, heat treatment is preferably performed. By the heat treatment, oxygen added to the insulator 117 can be diffused to be supplied to the insulator 106a, the semiconductor 106b, the insulator 106ca, and the insulator 106cb. The heat treatment is performed at a temperature higher than or equal to 250° C. and lower than or equal to 650° C., preferably higher than or equal to 350° C. and lower than or equal to 450° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

This heat treatment is preferably performed at a temperature lower than that of the heat treatment performed after formation of the semiconductor 106b. A temperature difference between the heat treatment and the heat treatment performed after formation of the semiconductor 106b is to be 20° C. or more and 150° C. or less, preferably 40° C. or more and 100° C. or less. Accordingly, superfluous release of excess oxygen (oxygen) from the insulator 104 and the like can be inhibited. Note that in the case where heating at the time of formation of the layers (e.g., heating at the time of formation of the insulator 116) doubles as the heat treatment after formation of the insulator 116, the heat treatment after formation of the insulator 116 is not necessarily performed.

By the heat treatment, oxygen added to the insulator 117 is diffused into the insulator 104, 112a or 112b. The insulator 116 is less permeable to oxygen than the insulator 117 and functions as a barrier film that blocks oxygen. Since the insulator 116 is provided over the insulator 117, the oxygen diffused in the insulator 117 is prevented from being diffused in layers over the insulator 117, so that the oxygen is diffused mainly laterally or downward in the insulator 117.

The oxygen diffused into the insulator 104, the insulator 117, the insulator 112a, or the insulator 112b is supplied to the insulator 106a, the insulator 106ca, the insulator 106cb, and the semiconductor 106b. The insulator 103 having a function of blocking oxygen is provided below the insulator 104, thereby preventing the oxygen diffused into the insulator 104 from being diffused below the insulator 104.

Thus, the oxygen can be effectively supplied to the insulator 106a, the insulator 106ca, the insulator 106cb, and the semiconductor 106b, especially to a channel formation region in the semiconductor 106b. Oxygen is supplied to the insulator 106a, the insulator 106ca, the insulator 106cb, and the semiconductor 106b to reduce oxygen vacancies in this manner, whereby a highly purified intrinsic or substantially highly purified intrinsic oxide semiconductor with a low density of defect states can be achieved.

Note that heat treatment after the formation of the insulator 116 may be performed at any time after the insulator 116 is formed. For example, the heat treatment may be performed after the insulator 119 is formed.

In this manner, the transistor 52aa and the capacitor 53aa of the memory cell 51aa and the transistor 52ab and the capacitor 53ab of the memory cell 51ab can be formed.

Next, the insulator 119 is formed. Any of the above-described insulators can be used for the insulator 119. The insulator 119 can be formed by a sputtering method, a CVD method, an MBE method, a PLD method, an ALD method, or the like.

Next, a resist or the like is formed over the insulator 119, and an opening is formed in the insulator 119, the insulator 116, and the insulator 117. Then, the conductor to be the conductor 118 is formed to fill the opening. Any of the above-described conductors can be used for the conductor to be the conductor 118. The conductor can be formed by a sputtering method, a CVD method, an MBE method, a PLD method, an ALD method, or the like.

Figure 23E:
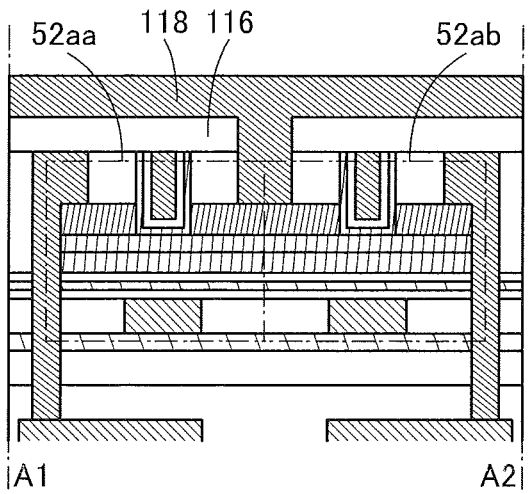
Figure 23F:
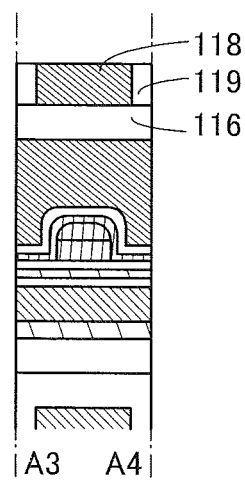

Next, the conductor to be the conductor 118 is processed by a CMP method or the like to remove a portion of the conductor above the opening in the insulator 119; as a result, the conductor 118 is formed in the opening in the insulators 119, 116, and 117 (see FIGS. 23E and 23F).

Through the above steps, the semiconductor device in FIGS. 1A to 1C can be manufactured.

In the above manufacturing steps, heat treatment is performed plural times. As the steps proceed, the heat treatment is performed at lower temperature, whereby an adverse effect of thermal impurity diffusion or the like by heat treatment performed at later steps can be reduced. In particular, in the semiconductor device in this embodiment, high-temperature heat treatment for the high-k material can be performed before the fabrication of the transistor 52aa (transistor 52ab); thus, the above heat treatment can be easily performed.

In the case where the high-k material is used for the capacitor 53aa (capacitor 53ab) of the semiconductor device in this embodiment as described above, for example, high-temperature heat treatment at approximately 700° C. is necessary. Thus, as materials of a wiring, a plug, and the like below the capacitor 53aa (capacitor 53ab), high-melting-point metals such as W, titanium nitride, and tantalum nitride are preferably used. Furthermore, in the case where a low-melting-point metal such as Cu is used in order to reduce wiring resistance, such a material is preferably used for a layer above the capacitor 53aa (capacitor 53ab). In this manner, when the capacitor 53aa (capacitor 53ab) is formed using the high-k material, the occupation area can be reduced and the storage capacity can be increased. Thus, the semiconductor device in this embodiment can be used as a main memory device, which requires high capacity.

In the case where a wiring and the like in the semiconductor device in this embodiment are formed using a low-resistance material such as copper, the heat treatment temperature in each step is preferably kept at approximately 400° C. to 450° C. because the low-melting-point metal such as copper might be melted by high-temperature heat treatment. Reducing wiring resistance in this manner can increase the speed of signal transmission. Thus, the semiconductor device in this embodiment can be used as a memory device serving as a cache memory (e.g., a memory device having a function similar to that of a DRAM in which a CPU chip is incorporated).

Embodiment 4

In this embodiment, the structure of an oxide semiconductor will be described.

Oxide semiconductors are classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, oxide semiconductors are classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS will be described.

A CAAC-OS is an oxide semiconductor having a plurality of c-axis aligned crystal parts (also referred to as pellets).

Figure 24A:
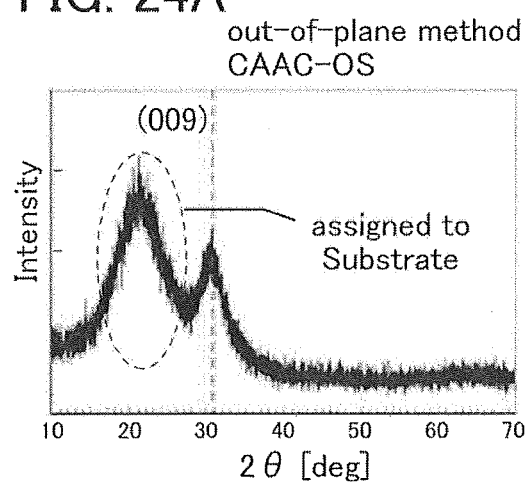
FIGS. 24A to 24E show structural analysis of a CAAC-OS and a single crystal oxide semiconductor by XRD and selected-area electron diffraction patterns of a CAAC-OS.

Analysis of a CAAC-OS by X-ray diffraction (XRD) will be described. For example, when the structure of a CAAC-OS including an $InGaZnO_4$ crystal that is classified as the space group R-3m is analyzed by an out-of-plane method, a peak appears at a diffraction angle (2θ) of around 31° as shown in FIG. 24A. This peak is derived from the (009) plane of the $InGaZnO_4$ crystal, which indicates that crystals in the CAAC-OS have c-axis alignment, and that the c-axes are aligned in the direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 24B:
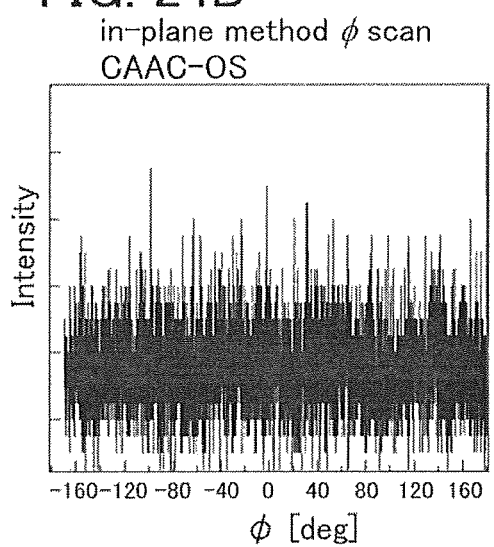
Figure 24C:
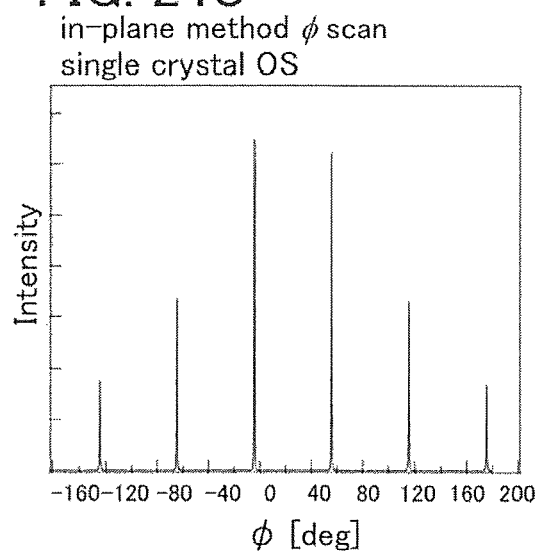

On the other hand, in structural analysis of the CAAC-OS by an in-plane method in which an X-ray is incident on the CAAC-OS in the direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), a peak is not clearly observed as shown in FIG. 24B. In contrast, in the case where single crystal $InGaZnO_4$ is subjected to φ scan with 2θ fixed at around 56°, six peaks which are derived from crystal planes equivalent to the (110) plane are observed as shown in FIG. 24C. Accordingly, the structural analysis using XRD shows that the directions of a-axes and b-axes are irregularly oriented in the CAAC-OS.

Figure 24D:
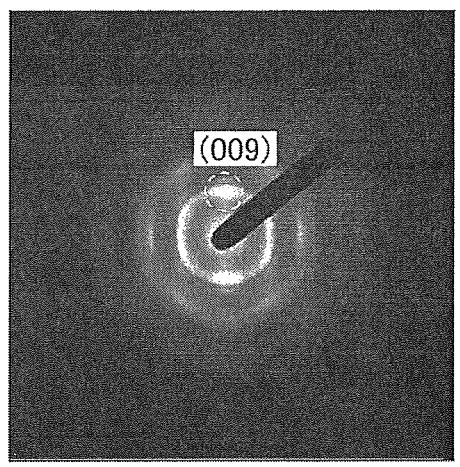
Figure 24E:
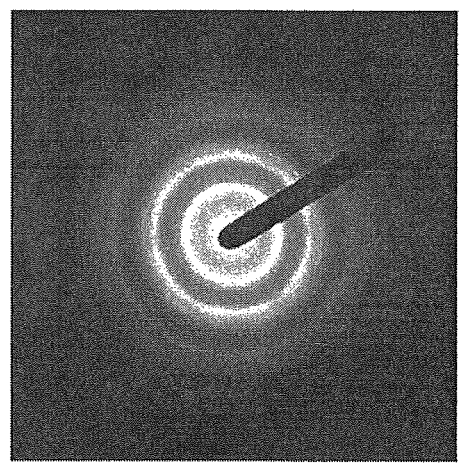

Next, a CAAC-OS analyzed by electron diffraction will be described. For example, when an electron beam with a probe diameter of 300 nm is incident on a CAAC-OS including an $InGaZnO_4$ crystal in the direction parallel to the formation surface of the CAAC-OS, such a diffraction pattern (also referred to as a selected-area transmission electron diffraction pattern) as is shown in FIG. 24D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in the direction substantially perpendicular to the formation surface or the top surface of the CAAC-OS. Meanwhile, FIG. 24E shows a diffraction pattern obtained in such a manner that an electron beam with a probe diameter of 300 nm is incident on the same sample in the direction perpendicular to the sample surface. As shown in FIG. 24E, a ring-like diffraction pattern is observed. Thus, the electron diffraction using an electron beam with a probe diameter of 300 nm also indicates that the a-axes and b-axes of the pellets included in the CAAC-OS do not have regular alignment. The first ring in FIG. 24E is considered to be derived from the (010) plane, the (100) plane, and the like of the $InGaZnO_4$ crystal. The second ring in FIG. 24E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 25A:
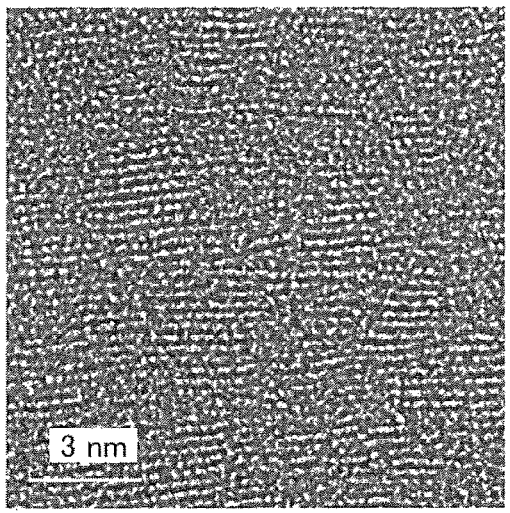
FIGS. 25A to 25E show a cross-sectional TEM image and plan-view TEM images of a CAAC-OS and images obtained through analysis thereof.

FIG. 25A shows a high-resolution TEM image of a cross section of the CAAC-OS observed from the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 25A shows pellets in which metal atoms are arranged in a layered manner. FIG. 25A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 25B:
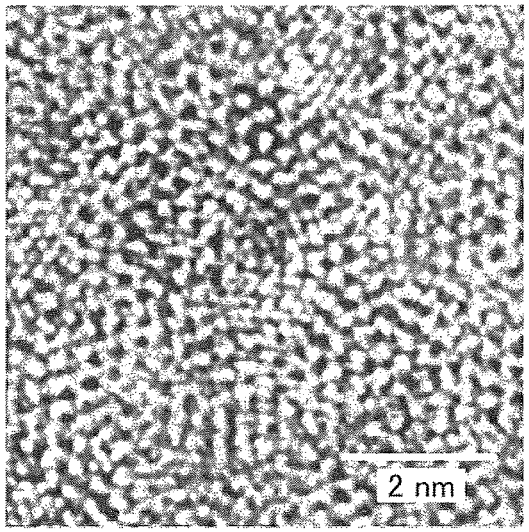
Figure 25C:
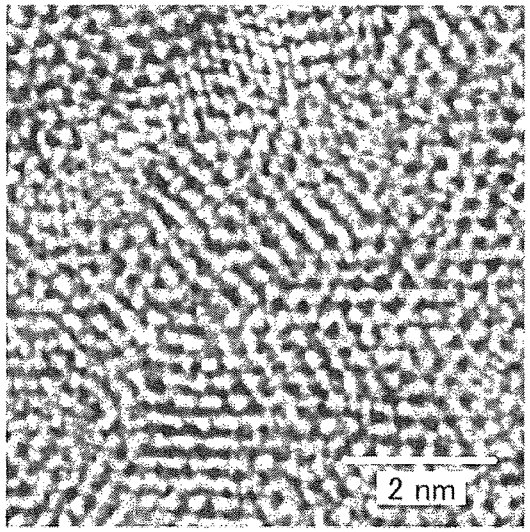
Figure 25D:
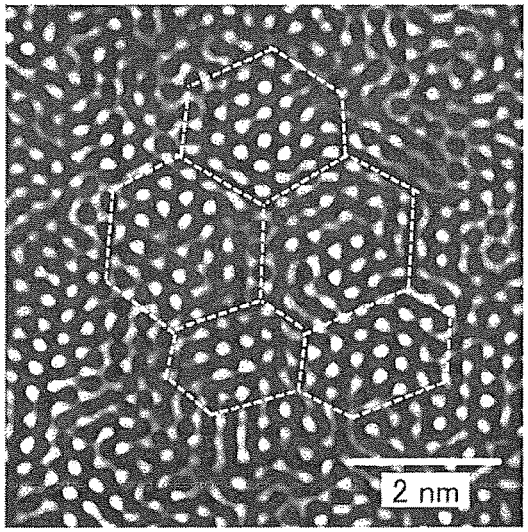
Figure 25E:
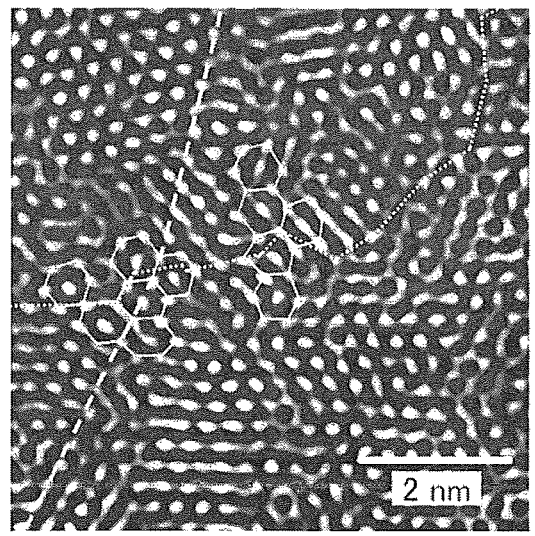

FIGS. 25B and 25C show Cs-corrected high-resolution TEM images of a plane of the CAAC-OS observed from the direction substantially perpendicular to the sample surface. FIGS. 25D and 25E are images obtained through image processing of FIGS. 25B and 25C. The method of image processing is as follows. The image in FIG. 25B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 25D, a portion where a lattice arrangement is broken is shown by dashed lines. A region surrounded by dashed lines is one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 25E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of atomic arrangement in the a-b plane direction, an interatomic bond distance changed by substitution of a metal element, and the like.

As described above, the CAAC-OS has c-axis alignment, its pellets (nanocrystals) are connected in the a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has negligible amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, the impurity contained in the oxide semiconductor might serve as a carrier trap or serve as a carrier generation source. For example, oxygen vacancies in the oxide semiconductor might serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, more preferably lower than $1 \times 10^{10}/cm^3$, and is higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

Analysis of an nc-OS by XRD will be described. When the structure of an nc-OS is analyzed by an out-of-plane method, a peak indicating orientation does not appear. That is, a crystal of an nc-OS does not have orientation.

Figure 26A:
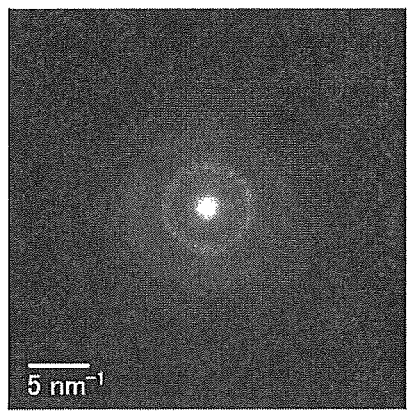
FIGS. 26A to 26D show electron diffraction patterns and a cross-sectional TEM image of an nc-OS.
Figure 26B:
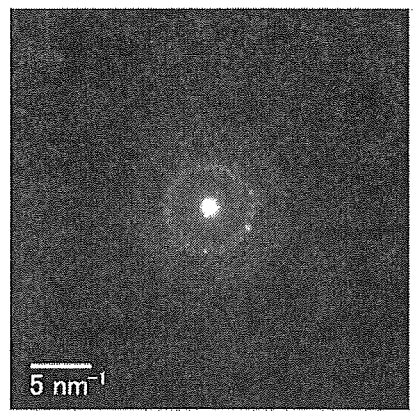

For example, when an electron beam with a probe diameter of 50 nm is incident on a 34-nm-thick region of thinned nc-OS including an $InGaZnO_4$ crystal in the direction parallel to the formation surface, a ring-shaped diffraction pattern (a nanobeam electron diffraction pattern) shown in FIG. 26A is observed. FIG. 26B shows a diffraction pattern obtained when an electron beam with a probe diameter of 1 nm is incident on the same sample. As shown in FIG. 26B, a plurality of spots are observed in a ring-like region. In other words, ordering in an nc-OS is not observed with an electron beam with a probe diameter of 50 nm but is observed with an electron beam with a probe diameter of 1 nm.

Figure 26C:
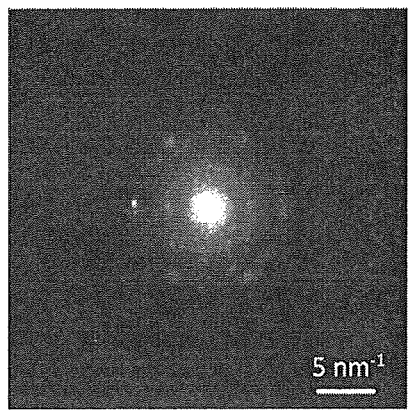

Furthermore, an electron diffraction pattern in which spots are arranged in an approximately hexagonal shape is observed in some cases as shown in FIG. 26C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 26D:
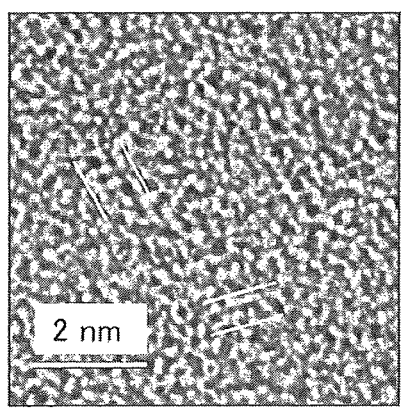

FIG. 26D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 26D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. An oxide semiconductor including a crystal part whose size is greater than 10 nm and less than or equal to 100 nm can be referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

FIGS. 27A and 27B are high-resolution cross-sectional TEM images of an a-like OS. FIG. 27A is the high-resolution cross-sectional TEM image of the a-like OS at the start of the electron irradiation. FIG. 27B is the high-resolution cross-sectional TEM image of the a-like OS after the electron (e$^-$) irradiation at 4.3×10$^8$ e$^-$/nm$^2$. FIGS. 27A and 27B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation will be described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 run from crystal structural analysis. Accordingly, a portion where the lattice spacing between lattice fringes is greater than or equal to 0.28 nm and less than or equal to 0.30 run is regarded as a crystal part of InGaZnO$_4$ in the following description. Each of lattice fringes corresponds to the a-b plane of the InGaZnO$_4$ crystal.

Figure 28:
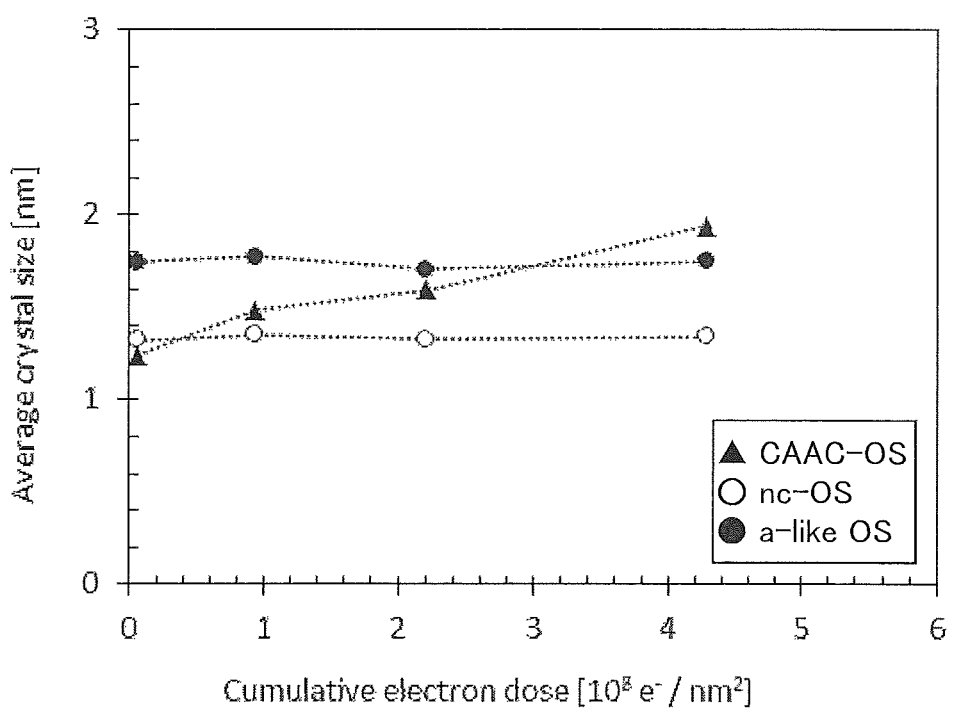
FIG. 28 shows a change in crystal part of an In—Ga—Zn oxide induced by electron irradiation.

FIG. 28 shows change in the average size of crystal parts (at 22 points to 30 points) in each sample. Note that the crystal part size corresponds to the length of a lattice fringe. FIG. 28 indicates that the crystal part size in the a-like OS increases with an increase in the cumulative electron dose in obtaining TEM images, for example. As shown in FIG. 28, a crystal part of approximately 1.2 nm (also referred to as an initial nucleus) at the start of TEM observation grows to a size of approximately 1.9 nm at a cumulative electron (e$^-$) dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. As shown in FIG. 28, the average size of crystal parts in an nc-OS and a CAAC-OS are approximately 1.3 nm and approximately 1.8 nm, respectively, regardless of the cumulative electron dose. For observation of electron beam irradiation and TEM, a Hitachi H-9000NAR transmission electron microscope was used. The conditions of electron beam irradiations are as follows: the accelerating voltage is 300 kV; the current density is 6.7×10$^5$ e$^-$/(nm$^2$·s); and the diameter of irradiation region is 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to estimate density equivalent to that of a single crystal oxide semiconductor with the desired composition. The density of a single crystal oxide semiconductor having the desired composition can be estimated using a weighted average according to the combination ratio of the single crystal oxide semiconductors with different compositions. Note that it is preferable to use as few kinds of single crystal oxide semiconductors as possible to estimate the density.

As described above, oxide semiconductors have various structures and various properties. Note that an oxide semiconductor may be a stack including two or more of an amorphous oxide semiconductor, an a-like OS, an nc-OS, and a CAAC-OS, for example.

The structures and the methods described in this embodiment can be combined as appropriate with any of the structures and the methods described in the other embodiments.

Embodiment 5

In this embodiment, examples of a semiconductor device which includes a plurality of circuits including OS transistors and described in the above embodiment are described with reference to FIGS. 29A to 29E, FIGS. 30A and 30B, FIGS. 31A and 31B, FIGS. 32A to 32C, FIGS. 33A and 33B, FIGS. 34A to 34C, and FIGS. 35A and 35B.

Figure 29A:
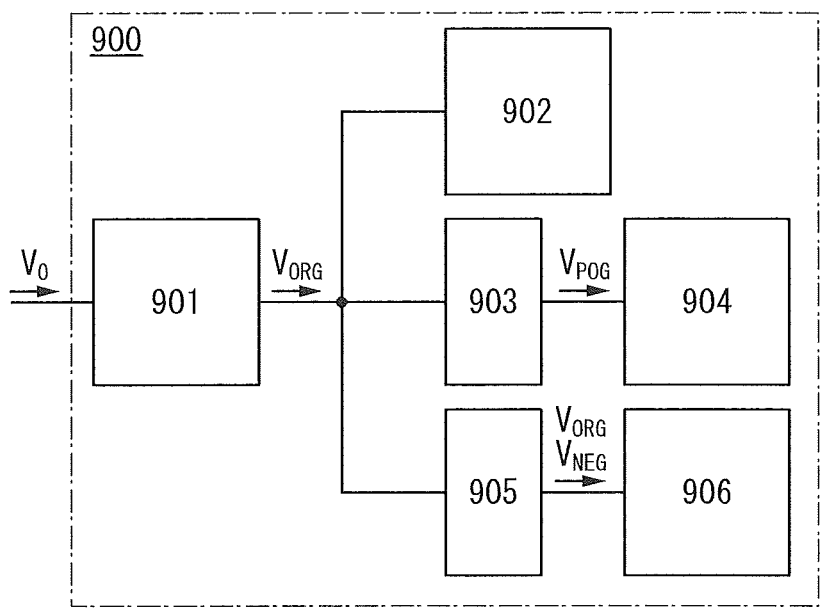
FIGS. 29A to 29E are a block diagram, circuit diagrams, and waveform diagrams for illustrating one embodiment of the present invention.

FIG. 29A is a block diagram of a semiconductor device 900. The semiconductor device 900 includes a power supply circuit 901, a circuit 902, a voltage generation circuit 903, a circuit 904, a voltage generation circuit 905, and a circuit 906.

The power supply circuit 901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 900. The semiconductor device 900 can generate the voltage $V_{ORG}$ on the basis of one power supply voltage supplied from the outside. Thus, the semiconductor device 900 can operate without supply of a plurality of power supply voltages from the outside.

The circuits 902, 904, and 906 operate with different power supply voltages. For example, the power supply voltage of the circuit 902 is a voltage based on the voltage $V_{ORG}$ and the voltage $V_{SS}$ ($V_{ORG}>V_{SS}$), the power supply voltage of the circuit 904 is a voltage based on a voltage $V_{POG}$ and the voltage $V_{SS}$ ($V_{POG}>V_{ORG}$), and the power supply voltages of the circuit 906 are voltages based on the voltage $V_{ORG}$, the voltage $V_{SS}$, and a voltage $V_{NEG}$ ($V_{ORG} > V_{SS} > V_{NEG}$). When the voltage $V_{SS}$ is set to a ground potential (GND), the kinds of voltages generated by the power supply circuit 901 can be reduced.

The voltage generation circuit 903 is a circuit that generates the voltage $V_{POG}$. The voltage generation circuit 903 can generate the voltage $V_{POG}$ on the basis of the voltage $V_{ORG}$ supplied from the power supply circuit 901. Thus, the semiconductor device 900 including the circuit 904 can operate on the basis of one power supply voltage supplied from the outside.

The voltage generation circuit 905 is a circuit that generates the voltage $V_{NEG}$. The voltage generation circuit 905 can generate the voltage $V_{NEG}$ on the basis of the voltage $V_{ORG}$ supplied from the power supply circuit 901. Thus, the semiconductor device 900 including the circuit 906 can operate on the basis of one power supply voltage supplied from the outside.

Figure 29B:
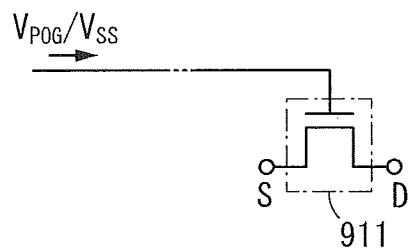
Figure 29C:
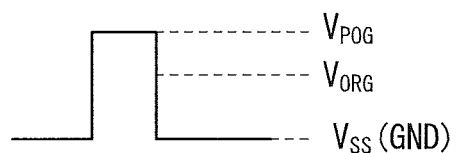

FIG. 29B illustrates an example of the circuit 904 that operates with the voltage $V_{POG}$ and FIG. 29C illustrates an example of a waveform of a signal for operating the circuit 904.

FIG. 29B illustrates a transistor 911. A signal supplied to a gate of the transistor 911 is generated on the basis of, for example, the voltage $V_{POG}$ and the voltage $V_{SS}$. The signal is generated on the basis of the voltage $V_{POG}$ to turn on the transistor 911 and on the basis of the voltage $V_{SS}$ to turn off the transistor 911. As illustrated in FIG. 29C, the voltage $V_{POG}$ is higher than the voltage $V_{ORG}$. Thus, a source (S) and a drain (D) of the transistor 911 can be electrically connected to each other without fail. As a result, the frequency of malfunction of the circuit 904 can be reduced.

Figure 29D:
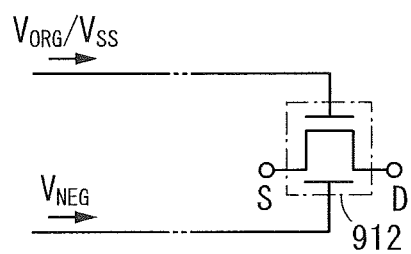
Figure 29E:
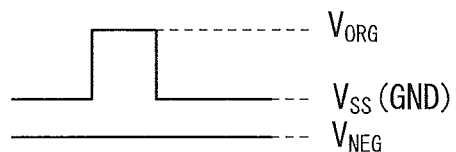

FIG. 29D illustrates an example of the circuit 906 that operates with the voltage $V_{NEG}$ and FIG. 29E illustrates an example of a waveform of a signal for operating the circuit 906.

FIG. 29D illustrates a transistor 912 having a back gate. A signal supplied to a gate of the transistor 912 is generated on the basis of, for example, the voltage $V_{ORG}$ and the voltage $V_{SS}$. The signal is generated on the basis of the voltage $V_{ORG}$ to turn on the transistor 912 and on the basis of the voltage $V_{SS}$ to turn off the transistor 912. A signal supplied to the back gate of the transistor 912 is generated on the basis of the voltage $V_{NEG}$. As illustrated in FIG. 29E, the voltage $V_{NEG}$ is lower than the voltage $V_{SS}$ (GND). Thus, the threshold voltage of the transistor 912 can be controlled to shift in the positive direction. Thus, the transistor 912 can be turned off without fail and a current flowing between a source (S) and a drain (D) can be reduced. As a result, the frequency of malfunction of the circuit 906 can be reduced and power consumption thereof can be reduced.

The voltage $V_{NEG}$ may be directly supplied to the back gate of the transistor 912. Alternatively, a signal supplied to the gate of the transistor 912 may be generated on the basis of the voltage $V_{ORG}$ and the voltage $V_{NEG}$ and the generated signal may also be supplied to the back gate of the transistor 912.

Figure 30A:
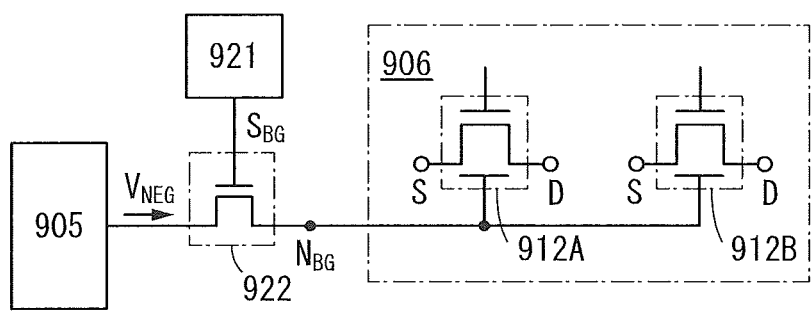
FIGS. 30A and 30B are a circuit diagram and a timing chart illustrating one embodiment of the present invention.
Figure 30B:
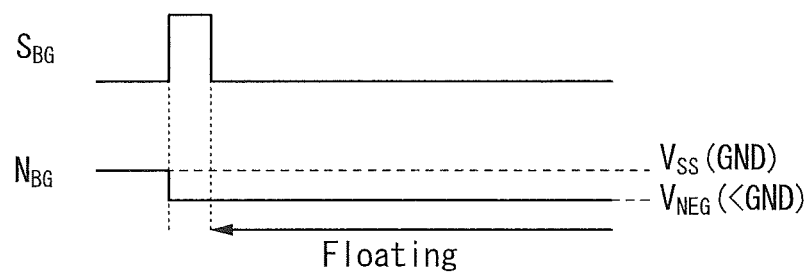

FIGS. 30A and 30B illustrate a modification example of FIGS. 29D and 29E.

In a circuit diagram illustrated in FIG. 30A, a transistor 922 whose on/off state can be controlled by a control circuit 921 is provided between the voltage generation circuit 905 and the circuit 906. The transistor 922 is an n-channel OS transistor. The control signal $S_{BG}$ output from the control circuit 921 is a signal for controlling the on/off state of the transistor 922. Transistors 912A and 912B included in the circuit 906 are OS transistors like the transistor 922.

A timing chart in FIG. 30B shows changes in a potential of the control signal $S_{BG}$ and a potential of a node $N_{BG}$. The potential of the node $N_{BG}$ indicates the states of potentials of back gates of the transistors 912A and 912B. When the control signal $S_{BG}$ is at a high level, the transistor 922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 922 is an OS transistor, its off-state current is small. Accordingly, even when the node $N_{BG}$ is in an electrically floating state, the voltage $V_{NEG}$ which has been supplied can be held.

Figure 31A:
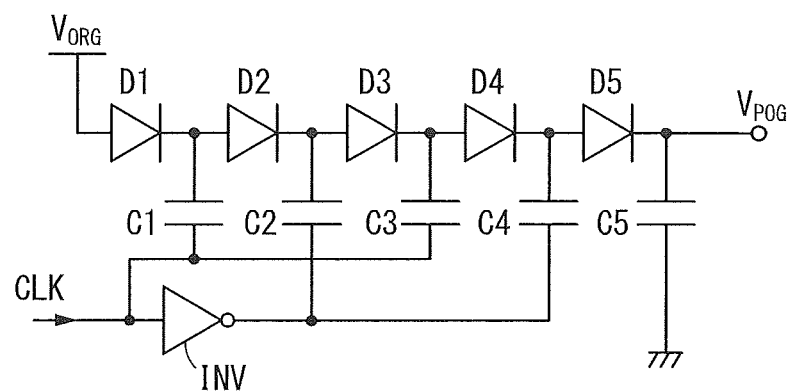
FIGS. 31A and 31B are circuit diagrams each illustrating one embodiment of the present invention.

FIG. 31A illustrates an example of a circuit configuration applicable to the above-described voltage generation circuit 903. The voltage generation circuit 903 illustrated in FIG. 31A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage based on the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{POG}$.

Figure 31B:
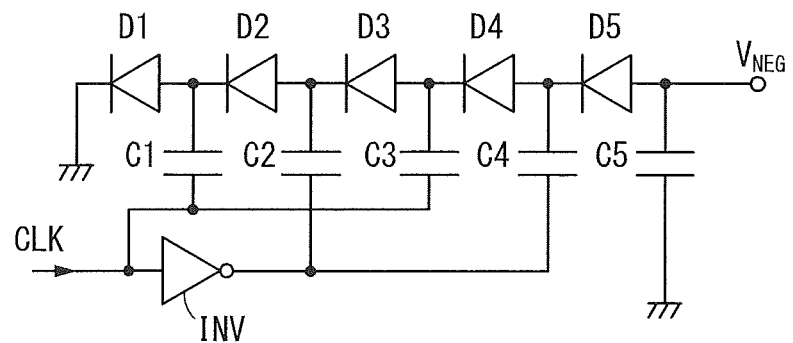

FIG. 31B illustrates an example of a circuit configuration applicable to the above-described voltage generation circuit 905. The voltage generation circuit 905 illustrated in FIG. 31B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage based on the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that the forward voltage of the diodes D1 to D5 is 0 V. The number of stages of the charge pump can be changed to obtain a desired voltage $V_{NEG}$.

The circuit configuration of the voltage generation circuit 903 is not limited to the configuration in the circuit diagram illustrated in FIG. 31A. Modification examples of the voltage generation circuit 903 are illustrated in FIGS. 32A to 32C and FIGS. 33A and 33B.

Figure 32A:
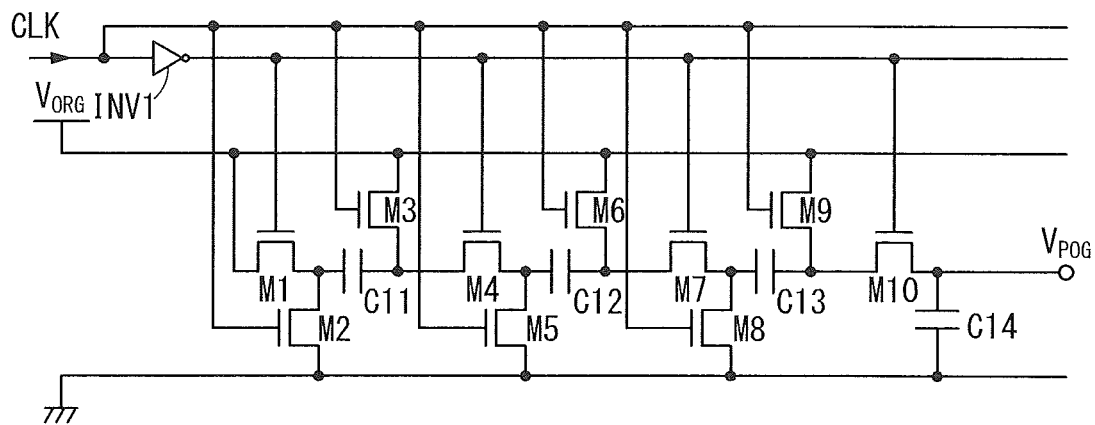
FIGS. 32A to 32C are circuit diagrams each illustrating one embodiment of the present invention.

The voltage generation circuit 903A illustrated in FIG. 32A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. The number of stages can be changed to obtain a desired voltage $V_{POG}$. In the voltage generation circuit 903A in FIG. 32A, off-state current of each of the transistors M1 to M10 can be small when the transistors M1 to M10 are OS transistors, and leakage of charge held in the capacitors C11 to C14 can be suppressed. Accordingly, the voltage $V_{Org}$ can be efficiently increased to the voltage $V_{POG}$.

Figure 32B:
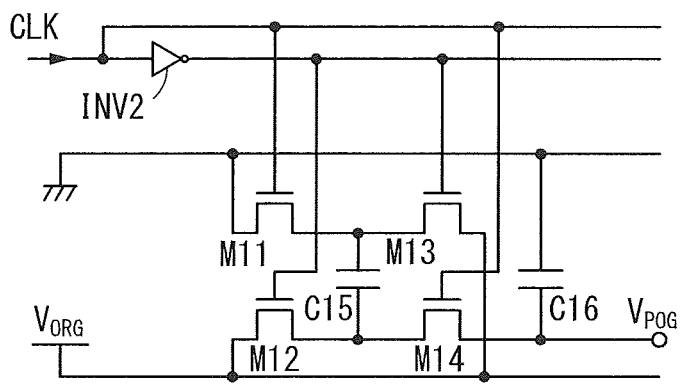

The voltage generation circuit 903B illustrated in FIG. 32B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 903B in FIG. 32B, off-state current of each of the transistors M11 to M14 can be small when the transistors M11 to M14 are OS transistors, and leakage of charge held in the capacitors C15 and C16 can be suppressed. Accordingly, the voltage $V_{ORG}$ can be efficiently increased to the voltage $V_{POG}$.

Figure 32C:
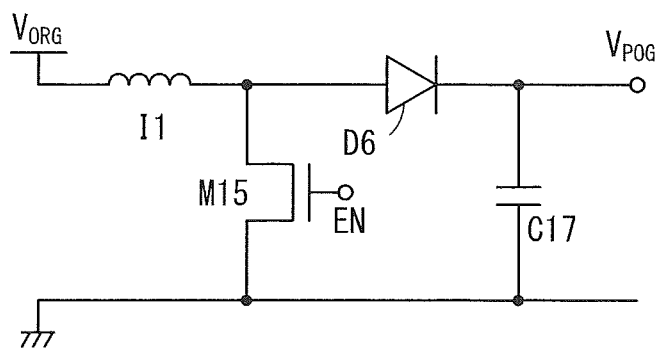

A voltage generation circuit 903C illustrated in FIG. 32C includes an inductor I1, a transistor M15, a diode D6, and a capacitor C17. The on/off state of the transistor M15 is controlled by a control signal EN. Owing to the control signal EN, the voltage $V_{POG}$ increased from the voltage $V_{ORG}$ can be obtained. Since the voltage generation circuit 903C in FIG. 32C increases the voltage using the inductor I1, the voltage can be efficiently increased.

Figure 33A:
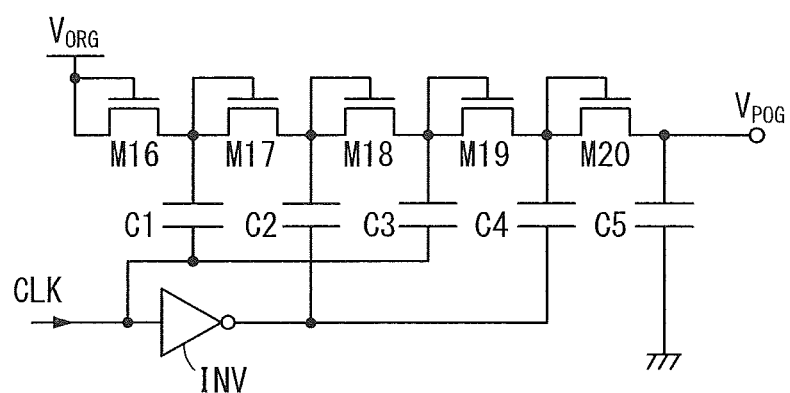
FIGS. 33A and 33B are circuit diagrams each illustrating one embodiment of the present invention.

A voltage generation circuit 903D illustrated in FIG. 33A has a configuration in which the diodes D1 to D5 of the voltage generation circuit 903 illustrated in FIG. 31A are replaced by diode-connected transistors M16 to M20. In the voltage generation circuit 903D in FIG. 33A, off-state current of each of the transistors M16 to M20 can be small when the transistors M16 to M20 are OS transistors, and leakage of charge held in the capacitors C1 to C5 can be suppressed. Accordingly, the voltage $V_{ORG}$ can be efficiently increased to the voltage $V_{POG}$.

Figure 33B:
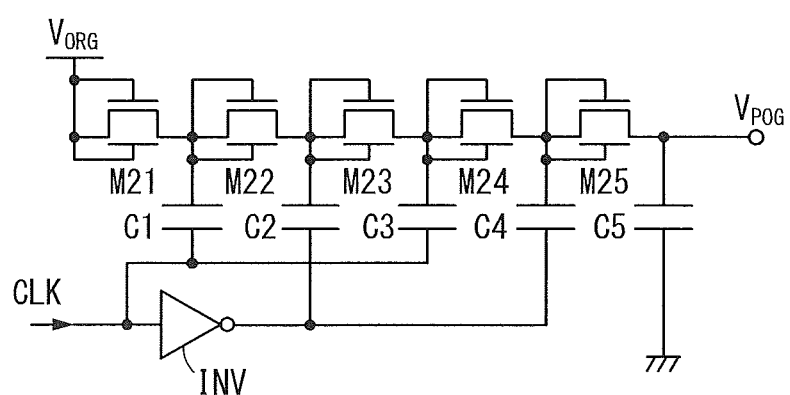
Figure 34A:
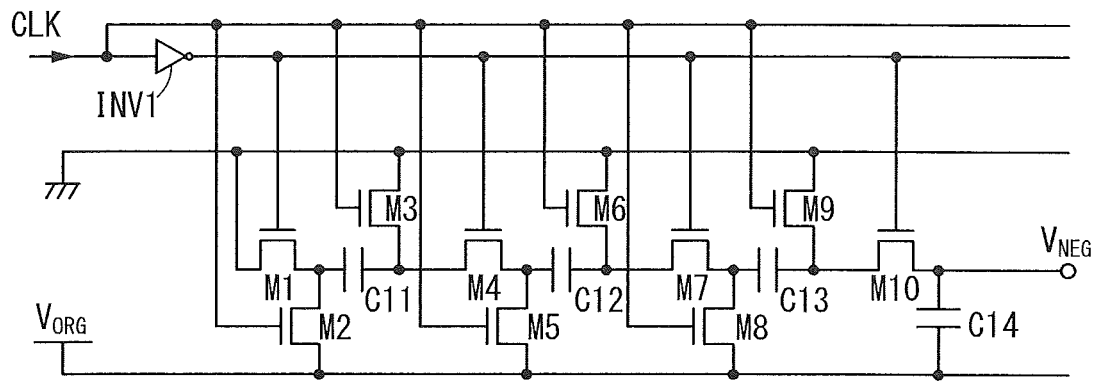
FIGS. 34A to 34C are circuit diagrams each illustrating one embodiment of the present invention.
Figure 34B:
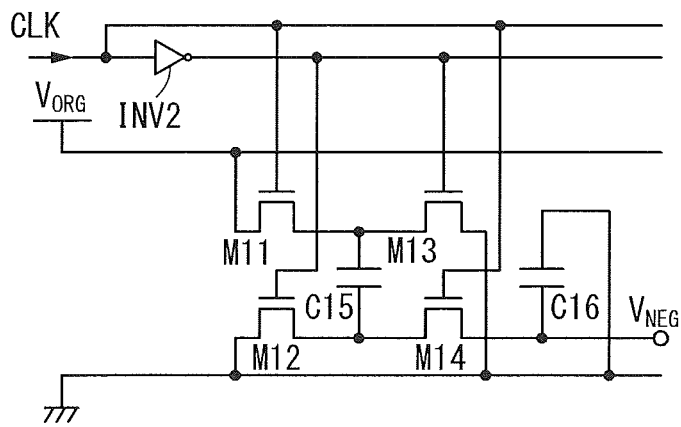
Figure 34C:
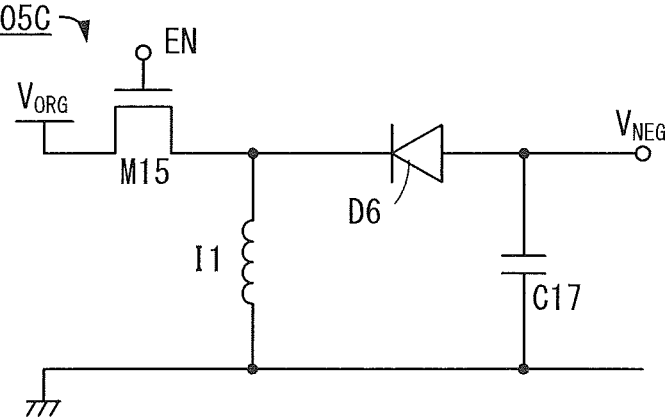
Figure 35A:
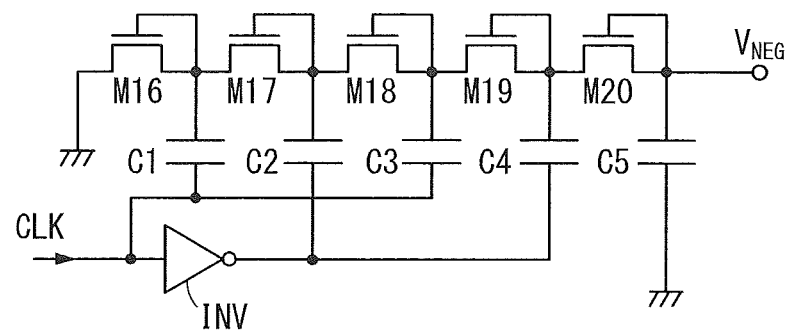
FIGS. 35A and 35B are circuit diagrams each illustrating one embodiment of the present invention.
Figure 35B:
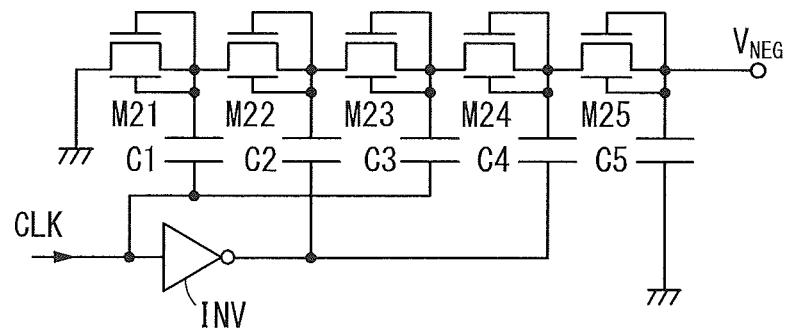

A voltage generation circuit 903E illustrated in FIG. 33B has a configuration in which the transistors M16 to M20 of the voltage generation circuit 903D illustrated in FIG. 33A are replaced by transistors M21 to M25 including back gates. In the voltage generation circuit 903E illustrated in FIG. 33B, the back gates can be supplied with the same voltages as the respective gates; thus, the amount of current flowing in the transistor can be increased. Accordingly, the voltage $V_{ORG}$ can be efficiently increased to the voltage $V_{POG}$.

Note that the modification examples of the voltage generation circuit 903 are also applicable to the voltage generation circuit 905 illustrated in FIG. 31B. FIGS. 34A to 34C and FIGS. 35A and 35B are circuit diagrams illustrating configuration examples of such a case. In a voltage generation circuit 905A illustrated in FIG. 34A, the voltage $V_{NEG}$, which has been reduced from the voltage $V_{SS}$ to a negative voltage having a negatively tripled value of the voltage $V_{ORG}$ by application of the clock signal CLK, can be obtained. In a voltage generation circuit 905B illustrated in FIG. 34B, the voltage $V_{NEG}$, which has been reduced from the voltage $V_{SS}$ to a negative voltage having a negatively doubled value of the voltage $V_{ORG}$ by application of the clock signal CLK, can be obtained.

Voltage generation circuits 905A to 905E illustrated in FIGS. 34A to 34C and FIGS. 35A and 35B have the same configurations as the voltage generation circuits 903A to 903E illustrated in FIGS. 32A to 32C and FIGS. 33A and 33B except for voltages applied to wirings or element arrangement. Similarly to the voltage generation circuits 903A to 903E, the voltage generation circuits 905A to 905E illustrated in FIGS. 34A to 34C and FIGS. 35A and 35B can perform efficient voltage reduction from the voltage $V_{SS}$ to the voltage $V_{NEG}$.

As described above, in any of the configurations of this embodiment, voltage required for circuits included in the semiconductor device can be internally generated. Thus, in the semiconductor device, the number of kinds of power supply voltages supplied from the outside can be reduced.

The structures and the methods described in this embodiment can be combined as appropriate with any of the structures and the methods described in the other embodiments.

Embodiment 6

In this embodiment, application examples of the semiconductor device or the memory circuit described in the foregoing embodiment to an electronic component and to an electronic device including the electronic component will be described with reference to FIGS. 36A and 36B and FIGS. 37A to 37F.

Figure 36A:
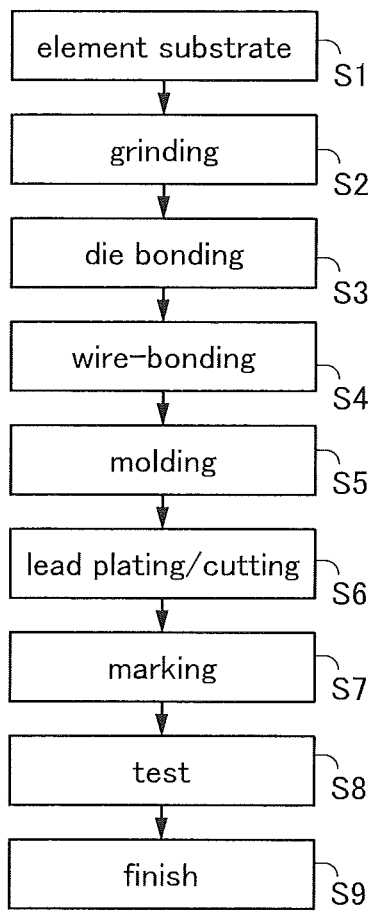
FIGS. 36A and 36B are a flow chart and a schematic perspective view showing a manufacturing process of an electronic component.

FIG. 36A shows an example where the semiconductor device or the memory circuit described in the foregoing embodiment is used to make an electronic component. Note that an electronic component is also referred to as semiconductor package or IC package. This electronic component has a plurality of standards and names depending on a terminal extraction direction and a terminal shape. Thus, examples of the electronic component are described in this embodiment.

A circuit portion including the transistors described in the foregoing embodiment is completed by integrating detachable components on a printed circuit board through an assembly process (post-process).

The post-process can be completed through steps shown in FIG. 36A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and dividing the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As the metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, thereby reducing damage to the circuit portion and the wire embedded in the component caused by external mechanical force as well as reducing deterioration of characteristics due to moisture or dust.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The aforementioned electronic component includes the semiconductor device or the memory circuit described in the above embodiments. Therefore, the electronic component has reduced power consumption.

Figure 36B:
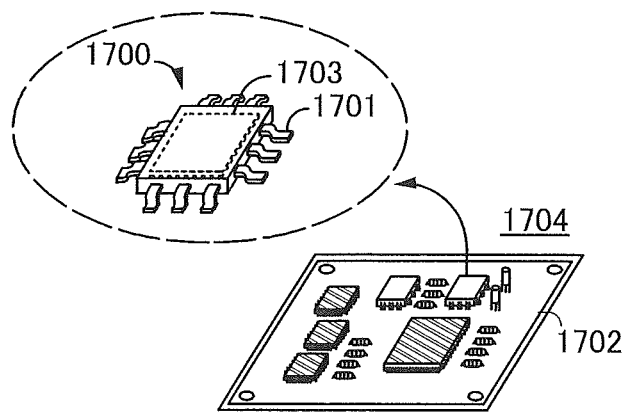

FIG. 36B is a perspective schematic diagram of a completed electronic component. FIG. 36B shows a perspective schematic diagram of a quad flat package (QFP) as an example of the electronic component. An electronic component 1700 shown in FIG. 36B includes a lead 1701 and a circuit portion 1703. The electronic component 1700 in FIG. 36B is, for example, mounted on a printed circuit board 1702. When a plurality of electronic components 1700 are used in combination and electrically connected to each other over the printed circuit board 1702, the electronic components 1700 can be mounted on an electronic device. The completed circuit board 1704 is provided in an electronic device or the like.

A semiconductor device, a memory circuit, or an electronic component of one embodiment of the present invention can be used for display devices, computers, or image reproducing devices provided with recording media (typically, devices that reproduce the content of recording media such as digital versatile discs (DVD) and have displays for displaying the reproduced images). Here, the computer refers to not only a tablet computer, a lap-top computer, and a desk-top computer, but also a large computer such as a server system. Furthermore, the semiconductor device in the above embodiment is used for a memory chip and the memory chip is packaged, whereby a module of a main memory (which can be replaced with a DRAM module, for example) can be obtained.

Figure 37A:
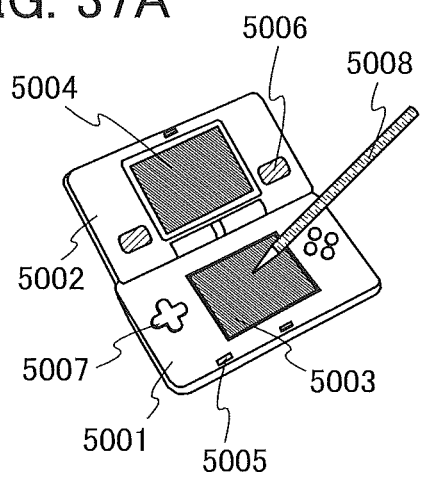
FIGS. 37A to 37F each illustrate an electronic device.

Further, as electronic devices that can include the semiconductor device of one embodiment of the present invention, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, medical devices, and the like can be given. FIGS. 37A to 37F illustrate specific examples of these electronic devices FIG. 37A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in the portable game machine. Although the portable game machine in FIG. 37A has the two display portions 5003 and 5004, the number of display portions in the portable game machine is not limited to two.

Figure 37B:
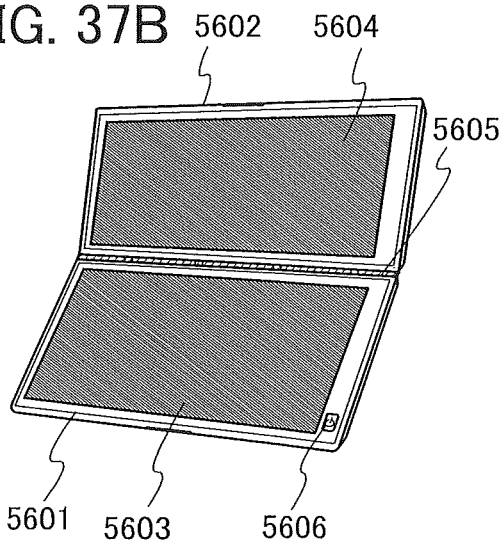

FIG. 37B illustrates a portable information terminal, which includes a first housing 5601, a second housing 5602, a first display portion 5603, a second display portion 5604, a joint 5605, an operation key 5606, and the like. The semiconductor device of one embodiment of the present invention can be used for a variety of integrated circuits included in the portable information terminal. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by providing a photoelectric conversion element called a photosensor in a pixel portion of a display device.

Figure 37C:
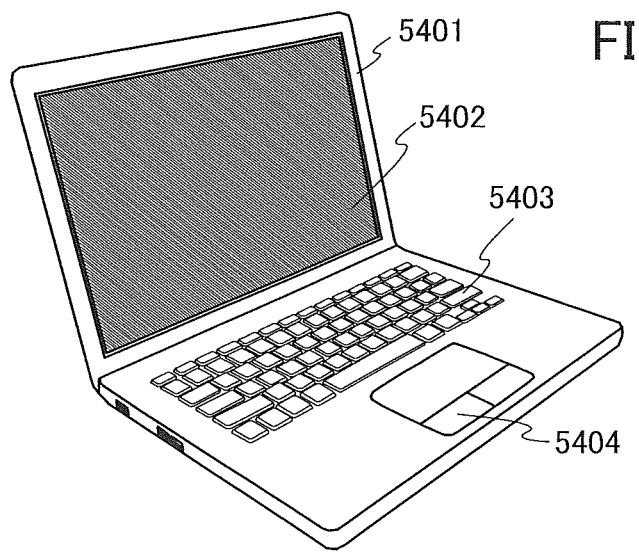

FIG. 37C illustrates a notebook personal computer, which includes a housing 5401, a display portion 5402, a keyboard 5403, a pointing device 5404, and the like. The semiconductor device of one embodiment of the present invention can be used for a variety of integrated circuits included in the notebook personal computer.

Figure 37D:
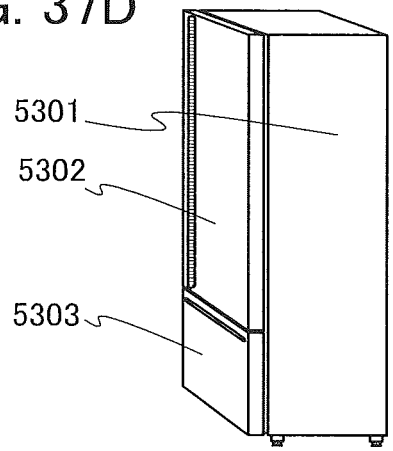

FIG. 37D illustrates an electric refrigerator-freezer, which includes a housing 5301, a door for a refrigerator 5302, a door for a freezer 5303, and the like. The semiconductor device of one embodiment of the present invention can be used for a variety of integrated circuits included in the electric refrigerator-freezer.

Figure 37E:
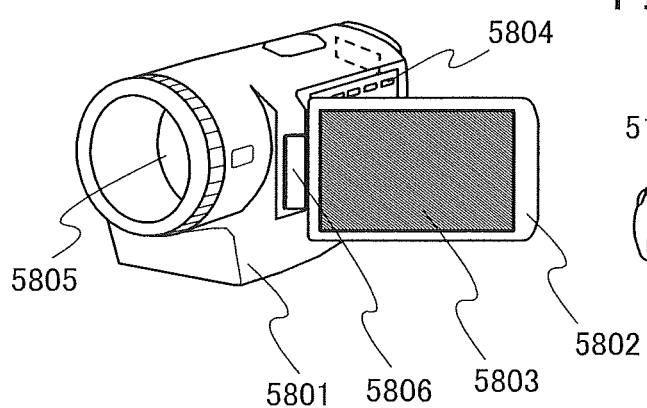

FIG. 37E illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in the video camera. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 37F:
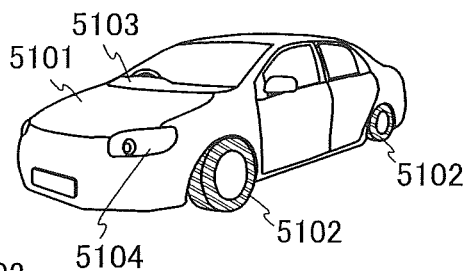

FIG. 37F illustrates a car which includes a car body 5101, wheels 5102, a dashboard 5103, lights 5104, and the like. The semiconductor device of one embodiment of the present invention can be used for a variety of integrated circuits included in cars.

The structure and method described in this embodiment can be combined as appropriate with any of the other structures and methods described in the other embodiments.

This application is based on Japanese Patent Application serial no. 2015-149966 filed with Japan Patent Office on Jul. 29, 2015, the entire contents of which are hereby incorporated by reference.

What is claimed is:
1. A semiconductor device comprising:
   a sense amplifier comprising:
      a first transistor comprising a gate electrode, a source electrode and a drain electrode;
   a memory cell over the sense amplifier, the memory cell comprising:
      a capacitor comprising a first electrode and a second electrode;
      a second transistor over the capacitor, the second transistor comprising:
         a first oxide insulator over the capacitor;
         an oxide semiconductor over the first oxide insulator; and
         a second oxide insulator over the oxide semiconductor;
         a gate electrode;
         a source electrode and a drain electrode positioned over the oxide semiconductor to face each other;
         a first insulator over the source electrode and the drain electrode of the second transistor;
         a second insulator;

a conductor; and
a groove portion;
a first wiring electrically connected to the first electrode of the capacitor;
a second wiring electrically connected to the gate electrode of the second transistor; and
a third wiring over the memory cell, the third wiring electrically connected to one of the source electrode and the drain electrode of the first transistor,
wherein the first insulator, the source electrode of the second transistor, and the drain electrode of the second transistor have an opening reaching the oxide semiconductor,
wherein the second oxide insulator is in contact with part of a top surface of the oxide semiconductor in the opening,
wherein the second insulator is in contact with part of a top surface of the second oxide insulator in the opening,
wherein the gate electrode of the second transistor is in contact with part of a top surface of the second insulator in the opening,
wherein the first electrode is provided along the groove portion,
wherein the second electrode has a region facing the first electrode in the groove portion,
wherein one of the source electrode and the drain electrode of the second transistor is connected to the second electrode through the conductor, and
wherein the other of the source electrode and the drain electrode of the second transistor is electrically connected to the third wiring.

2. The semiconductor device according to claim 1, wherein the conductor is in contact with an end portion of a side surface of one of the source electrode and the drain electrode of the second transistor.

3. The semiconductor device according to claim 1, further comprising a semiconductor substrate,
wherein the first transistor is provided to the semiconductor substrate.

4. The semiconductor device according to claim 3, wherein the semiconductor substrate comprises silicon.

5. The semiconductor device according to claim 1,
wherein the oxide semiconductor comprises In, an element M, Zn and O, and
wherein the element M is one of Ti, Ga, Y, Zr, La, Ce, Nd, Sn and Hf.

6. The semiconductor device according to claim 1,
wherein each of the first oxide insulator and the second oxide insulator comprises at least one of In, an element M and Zn, and
wherein the element M is one of Ti, Ga, Y, Zr, La, Ce, Nd, Sn and Hf.

7. A circuit board comprising:
an electronic component comprising the semiconductor device according to claim 1; and
a printed circuit board.

8. An electronic device comprising:
the semiconductor device according to claim 1; and
at least any one of a display portion, a microphone, a speaker and an operation key.

9. A semiconductor device comprising:
a sense amplifier comprising:
a first transistor comprising a gate electrode, a source electrode and a drain electrode;
a memory cell over the sense amplifier, the memory cell comprising:
a capacitor comprising a first electrode and a second electrode;
a second transistor over the capacitor, the second transistor comprising:
a first oxide insulator over the capacitor;
an oxide semiconductor over the first oxide insulator; and
a second oxide insulator over the oxide semiconductor;
a gate electrode;
a source electrode and a drain electrode positioned over the oxide semiconductor to face each other;
a first insulator over the source electrode and the drain electrode of the second transistor;
a second insulator;
a conductor; and
a groove portion;
a first wiring electrically connected to the first electrode of the capacitor;
a second wiring electrically connected to the gate electrode of the second transistor; and
a third wiring electrically connected to one of the source electrode and the drain electrode of the first transistor,
wherein the first insulator, the source electrode of the second transistor, and the drain electrode of the second transistor have an opening reaching the oxide semiconductor,
wherein the second oxide insulator is in contact with part of a top surface of the oxide semiconductor in the opening,
wherein the second insulator is in contact with part of a top surface of the second oxide insulator in the opening,
wherein the gate electrode of the second transistor is in contact with part of a top surface of the second insulator in the opening,
wherein the memory cell and the third wiring overlap with each other,
wherein the first electrode is provided along the groove portion,
wherein the second electrode has a region facing the first electrode in the groove portion,
wherein one of the source electrode and the drain electrode of the second transistor is connected to the second electrode through the conductor, and
wherein the other of the source electrode and the drain electrode of the second transistor is electrically connected to the third wiring.

10. The semiconductor device according to claim 9, wherein the conductor is in contact with an end portion of a side surface of one of the source electrode and the drain electrode of the second transistor.

11. The semiconductor device according to claim 9, further comprising a semiconductor substrate,
wherein the first transistor is provided to the semiconductor substrate.

12. The semiconductor device according to claim 11, wherein the semiconductor substrate comprises silicon.

13. The semiconductor device according to claim 9,
wherein the oxide semiconductor comprises In, an element M, Zn and O, and
wherein the element M is one of Ti, Ga, Y, Zr, La, Ce, Nd, Sn and Hf.

14. The semiconductor device according to claim 9,
wherein each of the first oxide insulator and the second oxide insulator comprises at least one of In, an element M and Zn, and wherein the element M is one of Ti, Ga, Y, Zr, La, Ce, Nd, Sn and Hf.

15. A circuit board comprising:
an electronic component comprising the semiconductor device according to claim 9; and
a printed circuit board.

16. An electronic device comprising:
the semiconductor device according to claim 9; and
at least any one of a display portion, a microphone, a speaker and an operation key.

17. The semiconductor device according to claim 9,
wherein the third wiring is positioned under the memory cell.

* * * * *